(12) United States Patent
Naganuma et al.

(10) Patent No.: US 8,404,978 B2
(45) Date of Patent: Mar. 26, 2013

(54) FLEX-RIGID WIRING BOARD AND METHOD FOR MANUFACTURING THE SAME

(75) Inventors: Nobuyuki Naganuma, Ogaki (JP);
Michimasa Takahashi, Ogaki (JP);
Masakazu Aoyama, Ogaki (JP)

(73) Assignee: Ibiden Co., Ltd., Ogaki-shi (JP)

( * ) Notice: Subject to any disclaimer, the term of this patent is extended or adjusted under 35 U.S.C. 154(b) by 232 days.

(21) Appl. No.: 12/873,944

(22) Filed: Sep. 1, 2010

(65) Prior Publication Data
US 2011/0199739 A1   Aug. 18, 2011

Related U.S. Application Data

(60) Provisional application No. 61/304,212, filed on Feb. 12, 2010.

(51) Int. Cl.
*H05K 1/03* (2006.01)

(52) U.S. Cl. ........................................ 174/254; 174/255

(58) Field of Classification Search .................. 174/254, 174/255, 261; 361/749–751
See application file for complete search history.

(56) References Cited

U.S. PATENT DOCUMENTS
7,982,135 B2 *   7/2011   Takahashi et al. ............ 174/254

FOREIGN PATENT DOCUMENTS

| JP | 2004-214393 | 7/2004 |
|---|---|---|
| JP | 2006-073819 | 3/2006 |
| JP | 2006-216785 | 8/2006 |
| JP | 2006-269979 | 10/2006 |
| JP | 4021472 | 12/2007 |
| JP | 2009-267081 | 11/2009 |

* cited by examiner

*Primary Examiner* — Jeremy Norris
(74) *Attorney, Agent, or Firm* — Oblon, Spivak, McClelland, Maier & Neustadt, L.L.P.

(57) ABSTRACT

A flex-rigid wiring board including an insulative substrate having a wiring layer which is formed on the insulative substrate and includes a conductor, a flexible wiring board positioned beside the insulative substrate and having a wiring layer, the wiring layer of the flexible wiring board including a conductor and being contained inside the flexible wiring board, and a first insulation layer positioned on the insulative substrate and the flexible wiring board such that a portion of the flexible wiring board is left exposed from the first insulation layer. The first insulation layer has a wiring layer which is formed on the first insulation layer and includes a conductor. The wiring layer of the first insulation layer has a thickness which is formed thicker than a thickness of the wiring layer of the flexible wiring board and a thickness of the wiring layer of the insulative substrate.

28 Claims, 55 Drawing Sheets

FLEX-RIGID WIRING BOARD AND METHOD FOR MANUFACTURING THE SAME

CROSS-REFERENCE TO RELATED APPLICATIONS

The present application claims the benefits of priority to U.S. Application No. 61/304,212, filed Feb. 12, 2010. The contents of that application are incorporated herein by reference in their entirety.

BACKGROUND OF THE INVENTION

1. Field of the Invention

The present invention relates to a bendable wiring board part of which is structured with a flexible substrate and to a method for manufacturing such a wiring board.

2. Discussion of the Background

In Japanese Laid-Open Patent Publication No. 2009-267081, a flex-rigid wiring board is described where a shield layer of a flexible wiring board is formed with copper foil and part of the shield layer is made thicker with plating. In Japanese Laid-Open Patent Publication No. 2006-73819, a flex-rigid wiring board is described where a conductive layer positioned as an upper layer of a flexible wiring board is made thicker by performing copper plating and a surface treatment on the conductive layer. In Japanese Laid-Open Patent Publication No. 2006-216785, a flex-rigid wiring board having a through hole that penetrates through a rigid substrate is described. The through hole land is thicker than a conductor contained in a flexible wiring board. In Japanese Laid-Open Patent Publication No. 2006-269979, a flex-rigid wiring board is described where the thickness of a conductor on a flexible wiring board is different in the flexible section from that in a rigid section. In Japanese Laid-Open Patent Publication No. 2004-214393, a flex-rigid wiring board is described where a conductor on a flexible wiring board is thicker than a conductor on the upper-layer side of the flexible wiring board in a rigid section. In Japanese Patent Publication No. 4021472, a flex-rigid wiring board is described where a conductor on an insulation layer covering a flexible wiring board is positioned near the boundary between a flexible section and a rigid section.

The contents of Japanese Laid-Open Patent Publication Nos. 2009-267081, 2006-73819, 2006-216785, 2006-269979 and 2004-214393, and Japanese Patent Publication No. 4021472 are incorporated herein by reference in their entirety.

SUMMARY OF THE INVENTION

According to one aspect of the present invention, a flex-rigid wiring board includes an insulative substrate having a wiring layer which is formed on the insulative substrate and includes a conductor, a flexible wiring board positioned beside the insulative substrate and having a wiring layer, the wiring layer of the flexible wiring board including a conductor and being contained inside the flexible wiring board, and a first insulation layer positioned on the insulative substrate and the flexible wiring board such that a portion of the flexible wiring board is left exposed from the first insulation layer. The first insulation layer has a wiring layer which is formed on the first insulation layer and includes a conductor. The wiring layer of the first insulation layer has a thickness which is formed thicker than a thickness of the wiring layer of the flexible wiring board and a thickness of the wiring layer of the insulative substrate.

According to another aspect of the present invention, a method for manufacturing a flex-rigid wiring board includes providing an insulative substrate having a wiring layer which is formed on the insulative substrate and includes a conductor, providing a flexible wiring board having a wiring layer which is contained inside the flexible wiring board and includes a conductor, positioning an insulation layer on the insulative substrate and the flexible wiring board such that that a portion of the flexible wiring board is left exposed from the insulation layer, positioning a spacer on the portion of the flexible wiring board left exposed from the insulation layer, positioning a metal foil on the insulation layer and the spacer, pressing the insulative substrate, the flexible wiring board, the insulation layer, the spacer and the metal foil, and forming a wiring layer including a conductor on the insulation layer such that the wiring layer of the insulation layer has a thickness which is made thicker than a thickness of the wiring layer of the flexible wiring board and a thickness of the wiring layer of the insulative substrate.

BRIEF DESCRIPTION OF THE DRAWINGS

A more complete appreciation of the invention and many of the attendant advantages thereof will be readily obtained as the same becomes better understood by reference to the following detailed description when considered in connection with the accompanying drawings, wherein:

FIG. 42A a view showing a first alternative example of a horizontal cross-sectional shape of a connection conductor or the like;

FIG. 42B is a view showing a second alternative example of a horizontal cross-sectional shape of a connection conductor or the like;

FIG. 42C is a view showing a third alternative example of a horizontal cross-sectional shape of a connection conductor or the like;

DETAILED DESCRIPTION OF THE EMBODIMENTS

Figure 1:
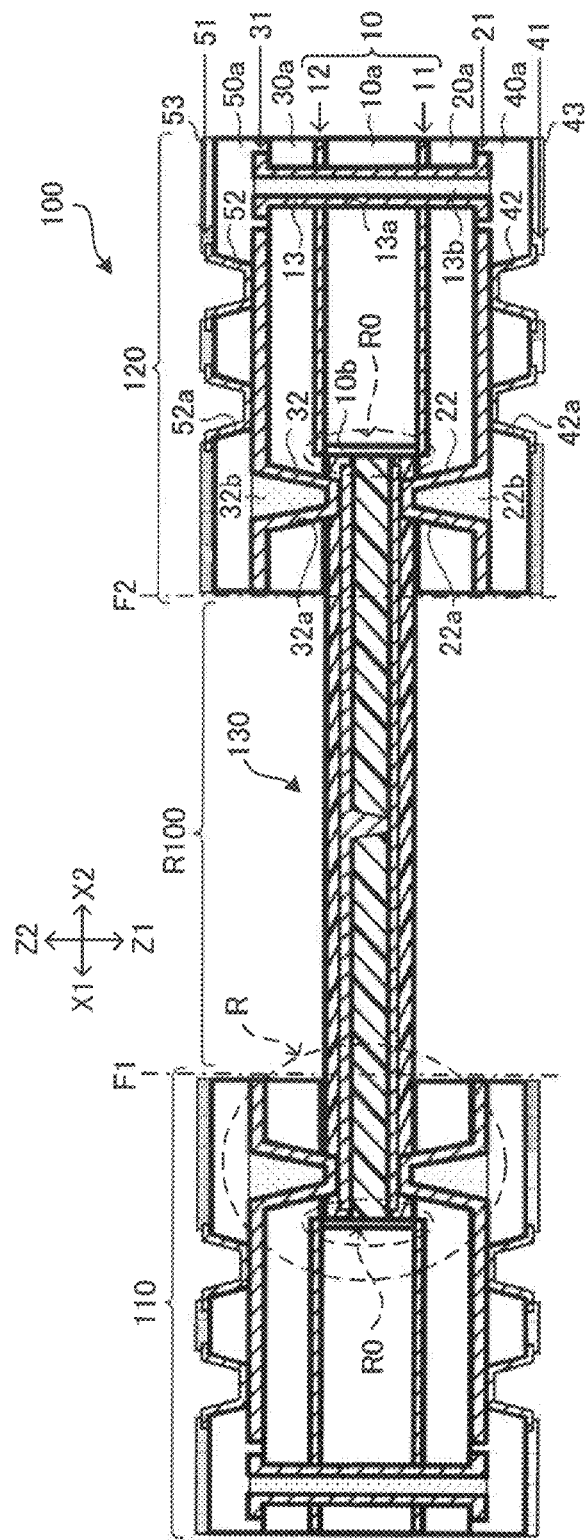
FIG. 1 is a cross-sectional view of a flex-rigid wiring board according to the first embodiment of the present invention.

The embodiments will now be described with reference to the accompanying drawings, wherein like reference numerals designate corresponding or identical elements throughout the various drawings.

In the following, embodiments of the present invention are described in detail with reference to the drawings. In the drawings, arrows (Z1, Z2) each indicate a lamination direction in a wiring board, corresponding to a direction along a normal line (or a direction of the thickness of a core substrate) to the main surfaces (upper and lower surfaces) of the wiring board. On the other hand, arrows (X1, X2) and (Y1, Y2) each indicate a direction perpendicular to a lamination direction (directions parallel to the main surfaces of the wiring board). The main surfaces of a wiring board are on the X-Y plane. Also, side surfaces of a wiring board are on the X-Z plane or the Y-Z plane.

Regarding connection conductors and their holes, a cross section perpendicular to directions Z (X-Y plane) is referred to as a horizontal cross section. Also, a cross section parallel to directions Z (X-Z plane or Y-Z plane) is referred to as a vertical cross section.

In the following embodiments, two main surfaces facing opposite directions of a normal line are referred to as a first surface (the Z1-side surface) and a second surface (the Z2-side surface). Namely, a main surface opposite the first surface is the second surface, and a main surface opposite the second surface is the first surface. In lamination directions, the side closer to the core is referred to as a lower layer (or the inner-layer side), and the side farther away from the core is referred to as an upper layer (or the outer-layer side).

Aside from a layer including a conductive pattern that functions as wiring such as a circuit (including ground), a layer with only a plain pattern is also referred to as a wiring layer. Among the conductors formed inside holes, the conductive film formed on wall surfaces (side and bottom surfaces) of a hole is referred to as a conformal conductor, and the conductor filled in a hole is referred to as a filled conductor. Wiring layers may include lands or the like of connection conductors along with the above conductive patterns.

Plating indicates depositing conductors (such as metal) to form layers on the surfaces of metal, resin or the like, as well as such deposited conductive layers (such as metal layers). Other than wet plating such as electrolytic plating and electroless plating, plating also includes dry plating such as PVD (Physical Vapor Deposition) and CVD (Chemical Vapor Deposition).

Unless specifically indicated, the "width" of a hole or a cylinder (protruding portion) indicates the diameter if it is a circle, and $2\sqrt{(\text{cross sectional area}/\pi)}$ if it is other than a circle. If a hole or a cylinder (protruding portion) tapers, whether "widths" in two or more holes or protruding portions are the same or not the same may be determined by comparing the values, average values, or maximum values and the like of corresponding portions. Regarding a line pattern formed on a surface, among the directions perpendicular to the line, the measurement in a direction parallel to the surface on which the line is formed is referred to as "width," and the measurement in a direction perpendicular to the surface on which the line is formed is referred to as "height" or "thickness." In addition, the measurement from one end of the line to the other end is referred to as "length." However, measurements are not limited to the above definitions if they are clearly indicated otherwise.

First Embodiment

Figure 2:
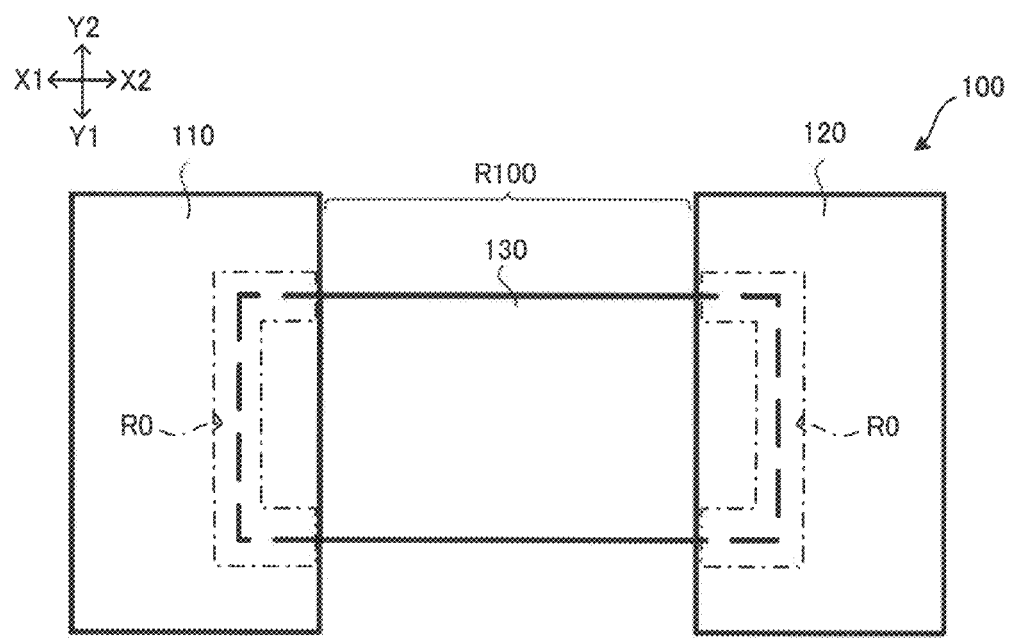
FIG. 2 is a plan view of the flex-rigid wiring board according to the first embodiment of the present invention.

Flex-rigid wiring board 100 of the present embodiment is a printed wiring board. As shown in FIG. 1 (cross-sectional view) and FIG. 2 (plan view), flex-rigid wiring board 100 has rigid sections (110, 120) and flexible wiring board 130. Rigid section 110 and rigid section 120 are connected to each other by flexible wiring board 130. Namely, rigid section 110 and rigid section 120 face each other by sandwiching flexible wiring board 130. Specifically, both ends of flexible wiring board 130 are inserted in rigid sections (110, 120). Then, rigid sections (110, 120) and flexible wiring board 130 are connected to each other in the inserted portions. In the drawing, F-R boundary surface (F1) is the surface corresponding to the boundary between rigid section 110 and flexible section (R100), and F-R boundary surface (F2) is the surface corresponding to the boundary between rigid section 120 and flexible section (R100). Also, flexible section (R100) is a flexible section sandwiched between rigid section 100 and rigid section 120, namely, part of flexible wiring board 130 exposed between F-R boundary surface (F1) and F-R boundary surface (F2).

Rigid sections (110, 120) have substrate 10, insulation layers (20a, 30a, 40a, 50a), wiring layers (21, 31, 41, 51), connection conductors (13, 22, 32, 42, 52), and solder-resist layers (43, 53). Substrate 10 is positioned beside flexible wiring board 130 (in direction X). Space may or may not exist between substrate 10 and flexible wiring board 130. Substrate 10 and insulation layers (20a, 30a, etc.) on both of its sides correspond to the core section. Insulation layers and others positioned as upper layers to the core section correspond to built-up sections.

Substrate 10 (the core substrate of flex-rigid wiring board 100) has insulation layer (10a) and wiring layers (11, 12).

Insulation layer (10a) is an insulative substrate. The thickness of insulation layer (10a) is 100 μm, for example. The insulative substrate is an insulative material to be used when manufacturing a printed wiring board. Insulation layer (10a) may be formed by impregnating glass cloth, paper or the like with insulative phenol resin, epoxy resin, polyimide, BT resin or the like. Alternatively, insulation layer (10a) may be formed by combining inorganic filler with phenol resin, epoxy resin, polyimide, BT resin or the like. In the present embodiment, insulation layer (10a) is made of epoxy resin. Epoxy resin is preferred to contain inorganic material such as glass fiber (glass cloth or glass non-woven fabric, for example) or aramid fiber (aramid non-woven fabric, for example) impregnated with resin. By insulation layer (10a) containing inorganic material, it is thought that flexible wiring board 130 may be suppressed from expansion/contraction during a thermal cycle or the like. As a result, the strength to secure flexible wiring board 130, the durability of such securing or the like improve.

Figure 3:
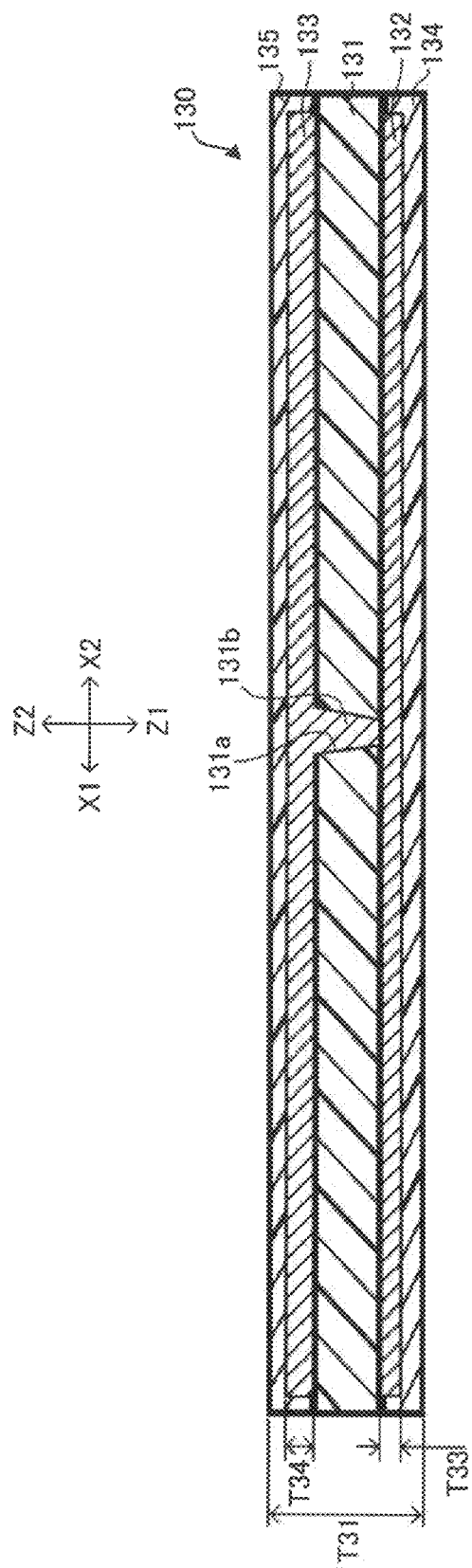
FIG. 3 is a cross-sectional view of a flexible wiring board according to the first embodiment.

As shown in FIG. 3, for example, flexible wiring board 130 has flexible substrate 131 (the core substrate of flexible wiring board 130), wiring layers (132, 133) and inner coverlays (134, 135). Thickness (T31) at an end portion of flexible wiring board 130 is 100 μm, for example. Thickness (T32) at the central portion of flexible wiring board 130 is approximately 150 μm, for example.

Flexible substrate 131 is made of insulative polyimide or liquid-crystal polymer, for example. The thickness of flexible substrate 131 is 20-50 μm, for example, preferably approximately 25 μm.

Wiring layer 132 is formed on the first surface of flexible substrate 131, and wiring layer 133 is formed on the second surface of flexible substrate 131. Wiring layers (132, 133) contain striped wiring, for example, which connects wiring in rigid section 110 and wiring in rigid section 120 to each other. Wiring layers (132, 133) are made of copper, for example. Thicknesses (T33, T34) of wiring layers (132, 133) are 20-25 μm, for example. In the present embodiment, wiring layer 133 is made thicker than wiring layer 132. However, the present invention is not limited to such; for example, the thickness of wiring layer 132 and the thickness of wiring layer 133 may be set the same (see later-described FIG. 57).

Inner coverlays (134, 135) are formed on flexible substrate 131. Inner coverlays (134, 135) coat wiring layers (132, 133) respectively, and insulate them from the outside. Inner coverlays (134,135) are made of polyimide, for example. The thickness of inner coverlays (134, 135) is approximately 5-30 μm, for example.

Flexible substrate 131 has connection conductor (131b). Specifically, hole (131a) is formed in flexible substrate 131. Connection conductor (131b) is formed by filling copper plating in hole (131a), for example. Wiring layer 132 and wiring layer 133 are electrically connected by connection conductor (131b).

As shown in FIG. 1, insulation layers (20a, 30a) are each positioned on boundary portion (RO) between insulation layer (10a) and flexible wiring board 130, and expose flexible section (R100). Among them, insulation layer (20a) is laminated on the first-surface side of an end portion in flexible wiring board 130 and of insulation layer (10a). Specifically, insulation layer (20a) in rigid section 110 is laminated on the first-surface side of the X1-side end portion of flexible wiring board 130, and insulation layer (20a) in rigid section 120 is laminated on the first-surface side of the X2-side end portion of flexible wiring board 130. By contrast, insulation layer (30a) is laminated on the second-surface side of an end portion in flexible wiring board 130 and of insulation layer (10a). Specifically, insulation layer (30a) in rigid section 110 is laminated on the second-surface side of the X1-side end portion of flexible wiring board 130, and insulation layer (30a) in rigid section 120 is laminated on the second-surface side of the X2-side end portion of flexible wiring board 130.

Hole (22a) is formed in insulation layer (20a), and hole (32a) is formed in insulation layer (30a). Connection conductors (22, 32) made of copper plating, for example, are formed on the wall surfaces of holes (22a, 32a) respectively, and insulative bodies (22b, 32b) are filled inside. Connection conductors (22, 32) are conformal conductors. However, connection conductors (22, 32) are not limited to such, and they may be filled conductors, for example (see later-described FIG. 36).

Through hole (13a) is formed in insulation layers (10a, 20a, 30a). Connection conductor 13 made of copper plating, for example, is formed on the wall surface of through hole (13a), and insulative body (13b) is filled inside. Connection conductor 13 is a conformal conductor. However, connection conductor 13 is not limited to being such, and it may be a filled conductor, for example. Wiring layer 21 and wiring layer 31 are electrically connected to each other by connection conductor 13.

Figure 4:
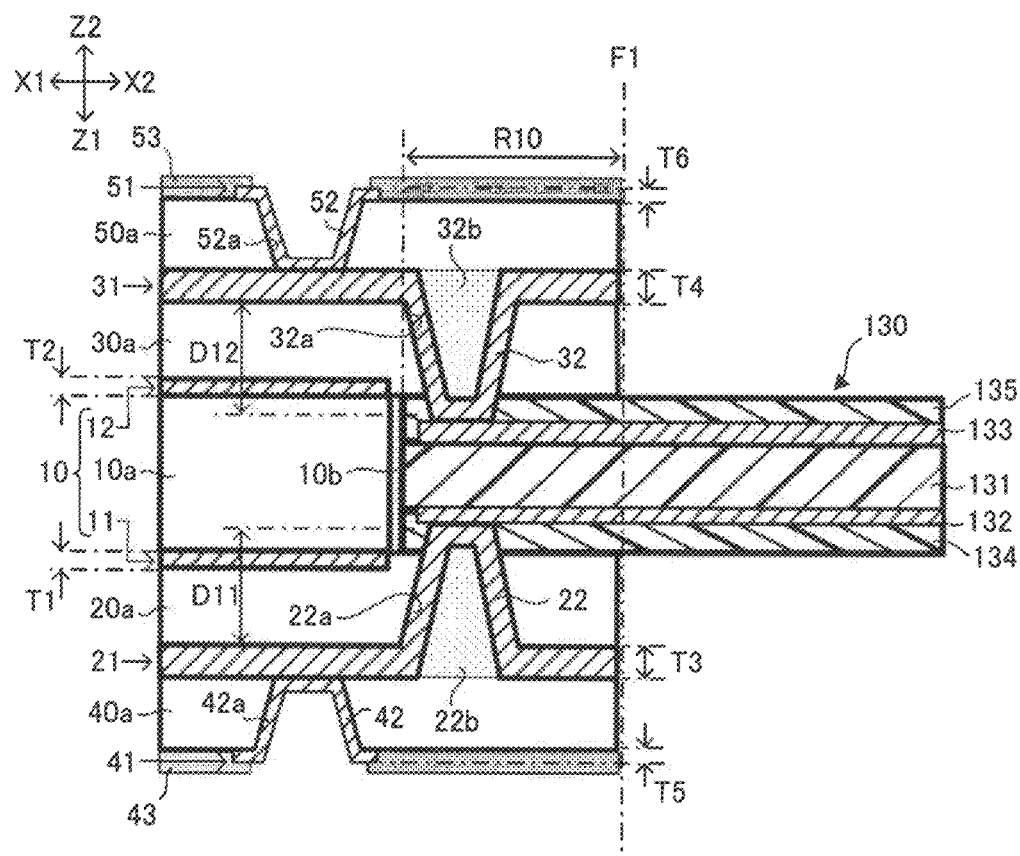
FIG. 4 is a magnified cross-sectional view showing part of a region shown in FIG. 1.

FIG. 4 shows a magnified view of region (R) (the connection section of rigid section 110 and flexible wiring board 130) in FIG. 1. The structure of the connection section of rigid section 120 and flexible wiring board 130 is the same as the structure of the connection section of rigid section 110 and flexible wiring board 130. In the following, the connection sections of flexible wiring board 130 and rigid sections (110, 120) are referred to as F-R connection sections.

As shown in FIG. 4, flexible wiring board 130 is positioned beside insulation layer (10a) (in direction X). The thickness of insulation layer (10*a*) and the thickness of flexible wiring board 130 are set substantially the same.

The positions (Z coordinates) of the conductors (wiring layers 11, 12) on insulation layer (10*a*) and the conductors (wiring layers 132, 133) contained in flexible wiring board 130 are shifted from each other in thickness directions (directions Z). Specifically, wiring layers (132, 133) are positioned on the lower-layer side of wiring layers (11, 12). Accordingly, the following effects are achieved.

Wiring layers (11, 12) are positioned beside connection conductors (22, 32) (in direction X). Accordingly, the F-R connection section becomes stronger against stress coming from beside connection conductors (22, 32), and connection reliability in the F-R connection section will further improve.

In addition, the distances from wiring layers (21, 31) to wiring layers (132, 133), namely, the measurements in thickness directions (directions Z) of connection conductors (22, 32) become longer. The measurements (D11, D12) in thickness directions of connection conductors (22, 32) are 90 µm, for example. Accordingly, due to substantially the same effect as a pinning effect, connection conductors (22, 32) made of hard metal or the like will be inserted deeply, enlarging the connection areas between connection conductors (22, 32) and wall surfaces of holes (22*a*, 32*a*). As a result, the strength to secure flexible wiring board 130, the durability of such securing and the like improve.

Resin (10*b*) is filled in the space partitioned by flexible wiring board 130 and insulation layers (10*a*, 20*a*, 30*a*) (clearance among such members). Resin (10*b*) is flowed from the surrounding insulation layers (such as insulation layers 20*a*, 30*a*) by pressing, for example, and is cured to be integrated with the surrounding insulation layers. Inorganic material is contained in resin (10*b*). Insulation layers (20*a*) and (30*a*) sandwich an end portion of flexible wiring board 130, and are laminated and connected with inner coverlays (134, 135) at region (R10).

As described previously, connection conductor 22 is formed in insulation layer (20*a*), and connection conductor 32 is formed in insulation layer (30*a*). Connection conductor 22 is connected to both wiring layer 132 and wiring layer 21. Connection conductor 32 is connected to both wiring layer 133 and wiring layer 31. Accordingly, wiring layer 21 is electrically connected to wiring layer 132 contained in flexible wiring board 130 by connection conductor 22 in insulation layer (20*a*). Also, wiring layer 31 is electrically connected to wiring layer 133 contained in flexible wiring board 130 by connection conductor 32 in insulation layer (30*a*).

In flex-rigid wiring board 100 of the present embodiment, rigid sections (110, 120) and flexible wiring board 130 are electrically connected without using connectors. Thus, even if the board receives impact from being dropped or the like, connection failure do not occur due to detached connectors.

Since end portions of flexible wiring board 130 are inserted (embedded) in rigid wiring boards (110, 120) respectively, rigid section 110 and rigid section 120 are electrically connected to each other at the inserted portions (embedded portions). Accordingly, their connection becomes stronger.

The conductors (wiring layers 21, 31) on insulation layers (20*a*, 30*a*) are made thicker than any of the following: the conductors (wiring layers 41, 51) on the upper-layer side of wiring layers (21, 31); conductors (wiring layers 11, 12) on the lower-layer side of wiring layers (21, 31); or conductors (wiring layers 132, 133) contained in flexible wiring board 130. Specifically, the conductors (wiring layers 21, 31) on insulation layers (20*a*, 30*a*) are thicker than the conductors (wiring layers 11, 12) on insulation layer (10*a*); the conductors (wiring layers 21, 31) on insulation layers (20*a*, 30*a*) are thicker than the outermost conductors (wiring layers 41, 51) of rigid sections (110, 120); and the conductors (wiring layers 21, 31) on insulation layers (20*a*, 30*a*) are thicker than the conductors (wiring layers 132, 133) contained in flexible wiring board 130.

Flex-rigid wiring board 100 of the present embodiment has thicker conductors (wiring layers 21, 31) on insulation layers (20*a*, 30*a*), and thinner conductors on the upper-layer side and the lower-layer side of wiring layers (21, 31) and in flexible wiring board 130. Thus, the following effects may be achieved.

Wiring layers (21, 31) are contiguous to connection conductors (22, 32), and connection conductors (22, 32) are connected to flexible wiring board 130 (especially to wiring layers 132, 133). Connection conductors (22, 32) are secured in a way that is substantially the same as a pinning effect. In the present embodiment, since the pinning effect of connection conductors (22, 32) is enhanced due to thick wiring layers (21, 31), the strength to secure flexible wiring board 130, the durability of such securing and the like improve. As a result, connection reliability in the F-R connection sections is enhanced.

Also, the core section of flex-rigid wiring board 100 may be easily manufactured by sandwiching end portions of flexible wiring board 130 with insulation layers (20*a*, 30*a*) and then by pressing them (see later-described FIGS. 13-15B). During that time, a difference in levels may tend to occur between insulation layers (20*a*, 30*a*) and flexible wiring board 130 prior to pressing. Therefore, if the conductors (wiring layers 21, 31) on insulation layers (20*a*, 30*a*) are thin, there is a concern that such conductors may break during pressing. For that matter, in flex-rigid wiring board 100 of the present embodiment, the conductors (wiring layers 21, 31) on insulation layers (20*a*, 30*a*) are thick. Especially, in the first embodiment, since copper foils to be arranged on insulation layers (20*a*, 30*a*) during pressing are thick, it is thought that the conductors will seldom break even if pressing is carried out when a difference in levels has been formed (for details, see description of manufacturing steps provided later). On the other hand, since other conductors (such as wiring layers 41, 51) are thin, it is thought that wiring on the upper-layer side or the lower-layer side of wiring layers (21, 31), or in flexible wiring board 130 may be easily set as fine pitched.

The conductors (wiring layers 21, 31) on insulation layers (20*a*, 30*a*) are preferred to be thicker than any conductor including conductors of flexible wiring board 130 (wiring layers 132, 133). However, the present invention is not limited to such; when flex-rigid wiring board 100 has multiple conductors with different thicknesses from each other, if the conductors on insulation layers (20*a*, 30*a*) are thicker than at least one of the conductors in flex-rigid wiring board 100, substantially the same effect may be achieved.

The conductors (wiring layers 21, 31) on insulation layers (20*a*, 30*a*) are preferred to be thicker than any conductor on insulation layer (10*a*). However, the present invention is not limited to such; when multiple conductors with different thicknesses from each other are formed on insulation layer (10*a*), if the conductors on insulation layers (20*a*, 30*a*) are thicker than at least one of the conductors on insulation layer (10*a*), substantially the same effect may be achieved.

In addition, the conductors (wiring layers 11, 12) on insulation layer (10*a*) is set thicker than the conductors in flexible wiring board 130 (wiring layers 132, 133).

Also, the conductors (wiring layers 11, 12) on insulation layer (10*a*) are set to have substantially the same thickness as the conductors on the upper-layer side of wiring layers (21, 31) (wiring layers 41, 51).

Here, examples of preferred measurements are listed: thicknesses (T1, T2) of wiring layers (11, 12) are 18 μm, for example; thicknesses (T3, T4) of wiring layers (21, 31) are 25 μm, for example; thicknesses (T5, T6) of wiring layers (41, 51) are 20 μm, for example; and thicknesses (T33, T34) (FIG. 3) of wiring layers (132, 133) are 25 μm, for example.

Figure 5A:
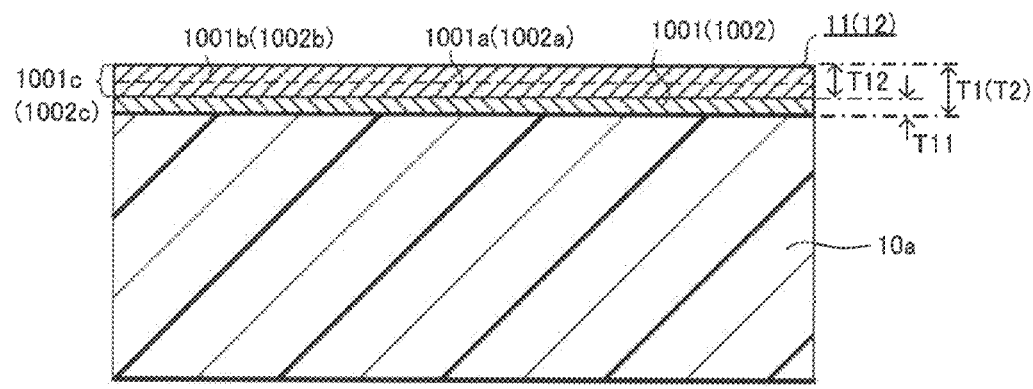
FIG. 5A is a cross-sectional view showing a structure of a first wiring layer.
Figure 5B:
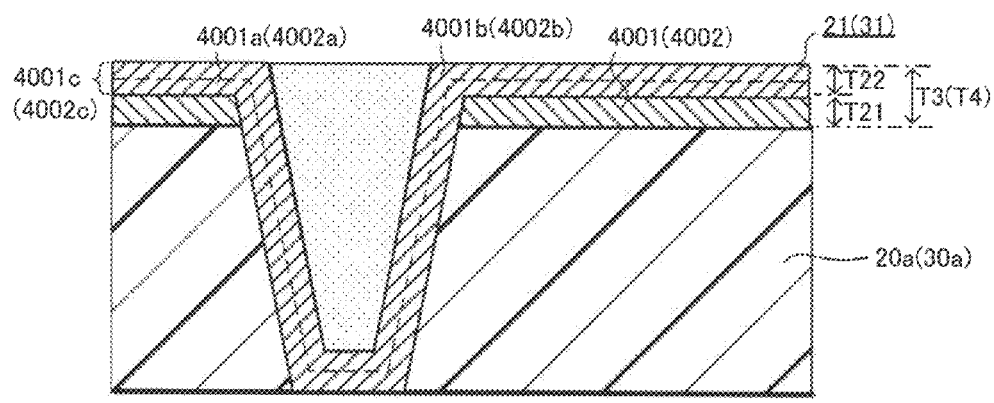
FIG. 5B is a cross-sectional view showing a structure of a second wiring layer.
Figure 5C:
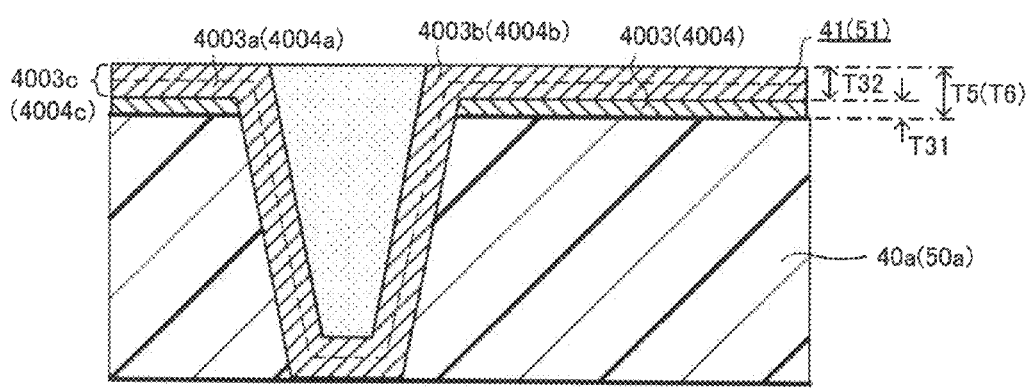
FIG. 5C is a cross-sectional view showing a structure of a third wiring layer.

As shown in FIG. 5A, wiring layer 11 is formed with copper foil 1001 and plating (1001c) (electroless plating (1001a) and electrolytic plating (1001b)); wiring layer 12 is formed with copper foil 1002 and plating (1002c) (electroless plating (1002a) and electrolytic plating (1002b)). As shown in FIG. 5B, wiring layer 21 is formed with copper foil 4001 and plating (4001c) (electroless plating (4001a) and electrolytic plating (4001b)); wiring layer 31 is formed with copper foil 4002 and plating (4002c) (electroless plating (4002a) and electrolytic plating (4002b)). As shown in FIG. 5C, wiring layer 41 is formed with copper foil 4003 and plating (4003c) (electroless plating (4003a) and electrolytic plating (4003b)); wiring layer 51 is formed with copper foil 4004 and plating (4004c) (electroless plating (4004a) and electrolytic plating (4004b)).

Copper foils (4001, 4002) contained in wiring layers (21, 31) are preferred to be thicker than copper foils (1001, 1002) contained in wiring layers (11, 12), and thicker than copper foils (4003, 4004) contained in wiring layers (41, 51).

Here, examples of preferred measurements are listed: thickness (T11) of copper foils (1001, 1002) is 5 μm, for example; thickness (T21) of copper foils (4001, 4002) is 9 μm, for example; thickness (T31) of copper foils (4003, 4004) is 6.5 μm, for example; thickness (T12) of plating (1001c, 1002c) is 13 μm, for example; thickness (T22) of plating (4001c, 4002c) is 16 μm, for example; and thickness (T32) of plating (4003c, 4004c) is 13.5 μm, for example. Conductive layers having such measurements may be formed by using thin copper foils, or they may also be formed by using thicker copper foils and by adjusting the etching amount (for details, see descriptions of manufacturing steps provided later).

Also, the present invention is not limited to the above. Thickness (T22) of plating (4001c, 4002c) contained in wiring layers (21, 31) may be set substantially the same as thickness (T12) of plating (1001c, 1002c) contained in wiring layers (11, 12), and thickness (T32) of plating (4003c, 4004c) contained in wiring layers (41, 51). As seen above, when conductors (such as wiring layer 11) have a triple-layer structure with copper foil, electroless plating and electrolytic plating, by modifying only the thickness of copper foil, it is thought to be easy to adjust the relative thickness of each conductor between the above conductors. In addition, if the thickness of plating in the above conductors (such as wiring layer 11) is substantially the same, it is thought that remarkable modifications in plating conditions will not be required when forming each conductor. As a result, a reduction in manufacturing costs may be achieved. The structure of conductors is not limited to the above triple layer, and any other structure may be employed (see later-described FIGS. 31A-32C).

Figure 6A:
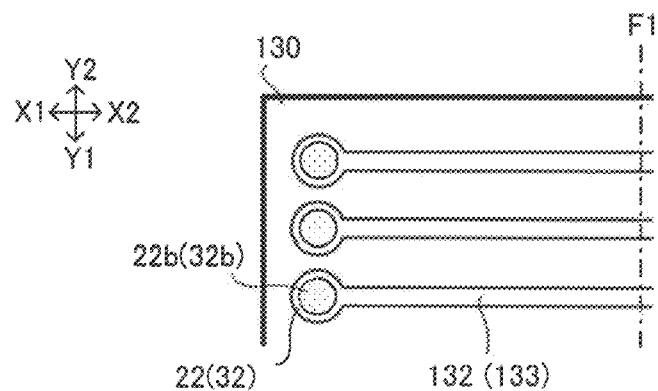
FIG. 6A is a view showing an example where a wiring layer near an F-R connection section is formed to be straight.
Figure 6B:
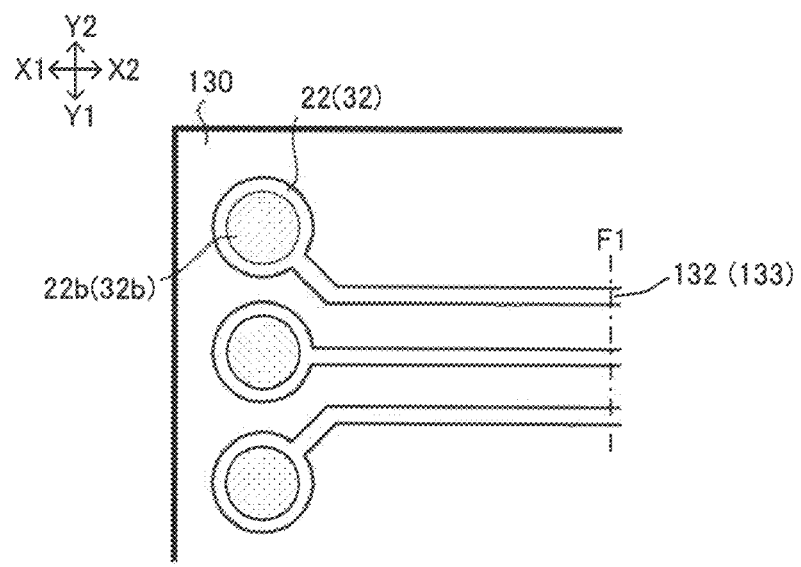
FIG. 6B is a view showing an example where a wiring layer near an F-R connection section is formed to fan out.

As shown in FIGS. 4, 6A and 6B, connection conductor 22 (or hole 22a) is formed to be a tapered cylinder, widening from the second-surface side toward the first-surface side. Connection conductor 32 (or hole 32a) is formed to be a tapered cylinder, widening from the first-surface side toward the second-surface side. However, connection conductor 22 or the like is not limited to being formed as such, and any other shape may be employed (see later-described FIGS. 42A-43B).

In flex-rigid wiring board 100 of the present embodiment, the position of connection conductor 22 and the position of connection conductor 32 correspond to each other when seen on the X-Y plane. Accordingly, connection conductor 22 and connection conductor 32 face each other. By being so set, both end portions of flexible wiring board 130 are thought to be firmly sandwiched and held. Even if the position of connection conductor 22 and the position of connection conductor 32 do not completely correspond to each other, if either connection conductor 22 or 32 faces at least part of the other, it is thought that substantially the same effect is achieved.

In addition, wiring layer 21 and connection conductor 22 are made to be contiguous. Accordingly, compared with situations where wiring layer 21 and connection conductor 22 are formed intermittently (see later-described FIG. 37), it is thought that both end portions of flexible wiring board 130 will be more firmly sandwiched and held. The same applies to wiring layer 31 and connection conductor 32.

Moreover, connection conductors 22 and 32 are made of plating. Accordingly, compared with situations where connection conductors 22 and 32 are made of conductive paste (see later-described FIG. 37), it is thought that both end portions of flexible wiring board 130 will be more firmly sandwiched and held.

Connection conductors (22, 32) are conductors in holes (22a, 32a) which penetrate through only their respective insulation layers (20a, 30a), so-called via holes. Such a structure is advantageous to enhance connection reliability between flexible wiring board 130 and rigid section 110 or 120. However, the present invention is not limited to such, and conductors in flexible wiring board 130 and conductive patterns on insulation layers (20a, 30a) may be electrically connected by conductors in holes which penetrate through multiple layers (see later-described FIGS. 38A, 38B).

Conductive patterns on both surfaces of flexible wiring board 130 are electrically connected to conductive patterns (wiring layers 21, 31) in rigid sections (110, 120) by connection conductors (22, 32). However, the present invention is not limited to such, and a conductive pattern only on one surface of flexible wiring board 130 may be electrically connected to a conductive pattern (wiring layer 21 or 31) in rigid sections (110, 120) by connection conductor 22 or 32 (see later-described FIG. 41).

Basically, conductive patterns (wiring layers 132, 133) of flexible wiring board 130 may be formed freely. Therefore, wiring layers (132, 133) near the F-R connection sections may be formed straight as shown in FIG. 6A, for example. However, to enhance connection reliability near the F-R connection sections, as shown in FIG. 6B, for example, it is preferred that wiring layers (132, 133) be formed to fan out near the F-R connection sections, namely, that terminal pitches be widened like a fan. By setting so, the distance between adjacent wiring lines is ensured and interference between wiring lines will be suppressed. Accordingly, the width of connection conductors (22, 32) may be enlarged. If the width of connection conductors (22, 32) is enlarged, the connection area between flexible wiring board 130 and rigid section 110 or 120 will increase. As a result, connection reliability will be enhanced at the F-R connection sections.

As shown in FIG. 1, insulation layer (40a) is laminated on the first-surface side of insulation layer (20a), and insulation layer (50a) is laminated on the second-surface side of insulation layer (30a). Wiring layer 41 is formed on the first surface of insulation layer (40a), and wiring layer 51 is formed on the second surface of insulation layer (50a). Moreover, solder-resist layer 43 is formed on the first surface of insulation layer (40a), and solder-resist layer 53 is formed on the second surface of insulation layer (50a).

Insulation layers (40a, 50a) correspond to interlayer insulation layers. Hole (42a) is formed in insulation layer (40a), and hole (52a) is formed in insulation layer (50a). On wall surfaces of holes (42a, 52a), connection conductors (42, 52) made of copper plating, for example, are formed respectively. Connection conductors (42, 52) are conformal conductors. However, connection conductors (42, 52) are not limited to being such, and they may be filled conductors, for example.

Wiring layers (11, 12, 21, 31, 41, 51) are made of copper foil and copper plating, for example. However, they are not limited to such, and may be conductors using material other than copper.

In the present embodiment, insulation layers (20a, 30a, 40a, 50a) are made of substantially the same material as that of insulation layer (10a). By using such a material, the F-R connection sections become even stronger. Also, even if those materials are not substantially the same, substantially the same effect will be achieved if insulation layer (10a) contains at least one material that forms either insulation layer (20a) or (30a). Here, insulation layers (20a, 30a) that form the core section are preferred to contain inorganic material. By using insulation layers (20a, 30a) containing inorganic material, it is thought that flexible wiring board 130 will be suppressed from expansion/contraction during a thermal cycle or the like. The strength to secure flexible wiring board 130, the durability of such securing and the like increase. However, insulation layers (20a, 30a, 40a, 50a) are not limited to such, and they may be formed by using a different material from that of insulation layer (10a). As the material for insulation layers (20a, 30a, 40a, 50a), the following may be used: those made by impregnating inorganic material such as glass fiber or aramid fiber with resins such as epoxy resin, polyester resin, bismaleimide triazine resin (BT resin), imide resin (polyimide), phenol resin and allyl polyphenylene ether resin (A-PPE resin).

Connection conductors (13, 42, 52) are made of copper plating, for example. Holes (42a, 52a) in which connection conductors (42, 52) are formed are formed to be tapered cylinders, for example. Through hole (13a) in which connection conductor 13 is formed is formed to be a cylinder, for example.

Figure 7:
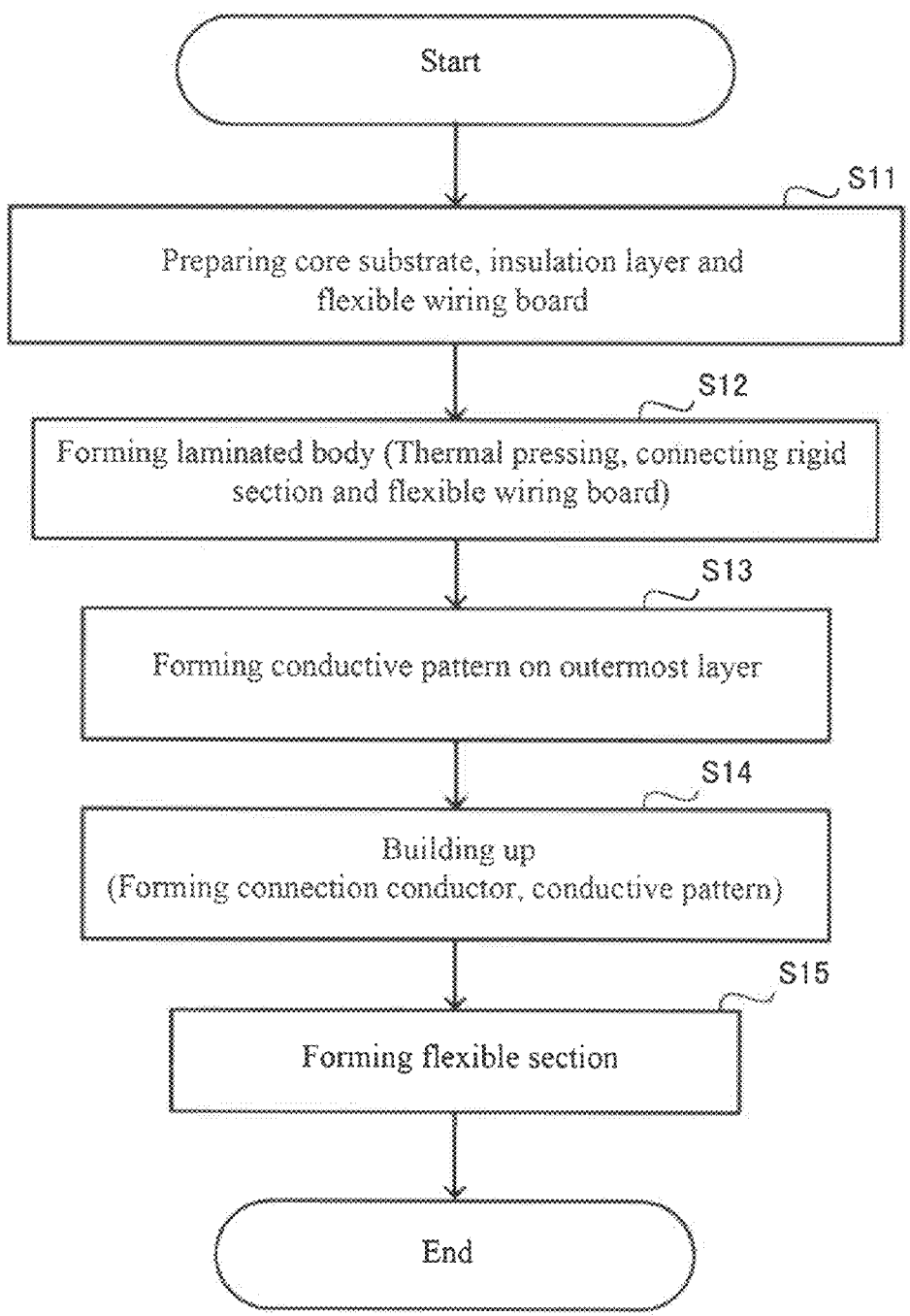
FIG. 7 is a flowchart showing a method for manufacturing a flex-rigid wiring board according to the first embodiment of the present invention.

The above flex-rigid wiring board 100 is manufactured in the procedure shown in FIG. 7, for example.

In step (S11), substrate 10 (core substrate), insulation layers (20a, 30a) and flexible wiring board 130 are prepared.

A method for manufacturing substrate 10 is shown in FIGS. 8A-8D.

Figure 8A:
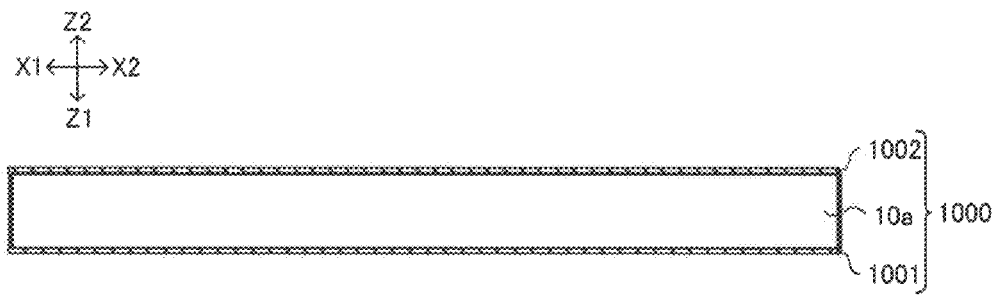
FIG. 8A is a view to illustrate a first step of a method for manufacturing a core substrate.

First, as shown in FIG. 8A, double-sided copper-clad laminate 1000 (starting material) is prepared. Double-sided copper-clad laminate 1000 has insulation layer (10a) and copper foils (1001, 1002) (metal foils). Copper foil 1001 is formed on the first surface of insulation layer (10a) and copper foil 1002 is formed on the second surface of insulation layer (10a). The material for insulation layer (10a) is epoxy resin containing reinforcing material, for example, as described earlier.

It is difficult to laminate a thin copper foil on an insulation layer by lamination or the like. Thus, when copper foils (1001, 1002) to be formed are thin, copper foils (1001, 1002) having a predetermined thickness may also be obtained by laminating relatively thick copper foils on insulation layer (10a) and then by etching such copper foils. For example, after laminating 12 µm-thick copper foils on an insulation layer, and then etching the copper foils, 5 µm-thick copper foils (1001, 1002) may also be formed. Using such a method, copper foils with excellent quality may be obtained easily.

Figure 8B:
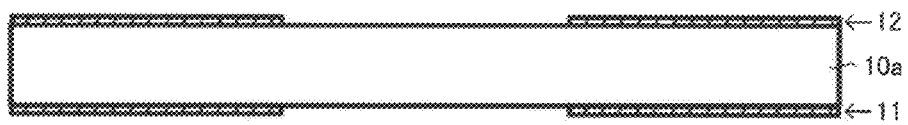
FIG. 8B is a view to illustrate a second step subsequent to the step shown in FIG. 8A.

Next, as shown in FIG. 8B, wiring layers (11, 12) are formed. Specifically, conductive layers on both surfaces of insulation layer (10a) are patterned by a lithographic technique after copper panel plating (full plain plating). By doing so, wiring layer 11 is formed on the first surface of insulation layer (10a), and wiring layer 12 is formed on the second surface of insulation layer (10a).

Figure 8C:
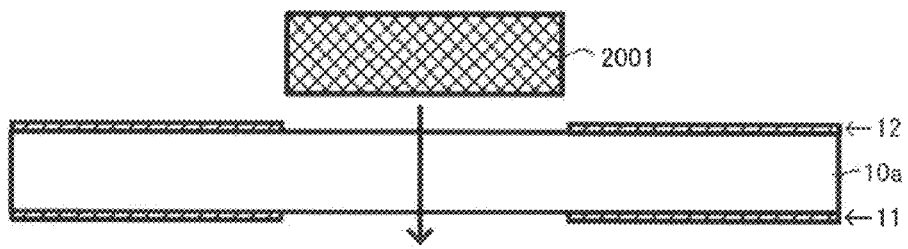
FIG. 8C is a view to illustrate a third step subsequent to the step shown in FIG. 8B.
Figure 8D:
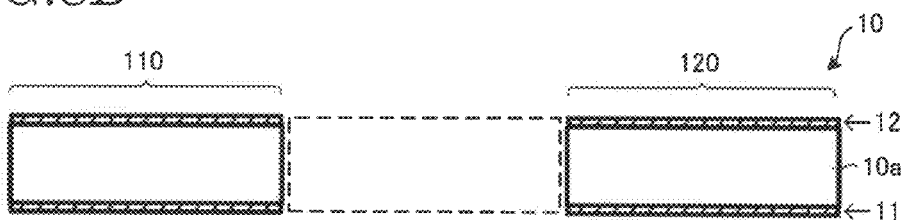
FIG. 8D is a view to illustrate a fourth step subsequent to the step shown in FIG. 8C.

Next, as shown in FIG. 8C, blanking is performed on insulation layer (10a) using die 2001. Accordingly, as shown in FIG. 8D, insulation layer (10a) is separated into rigid section 110 and rigid section 120. As a result, substrate 10 is completed.

Figure 9A:
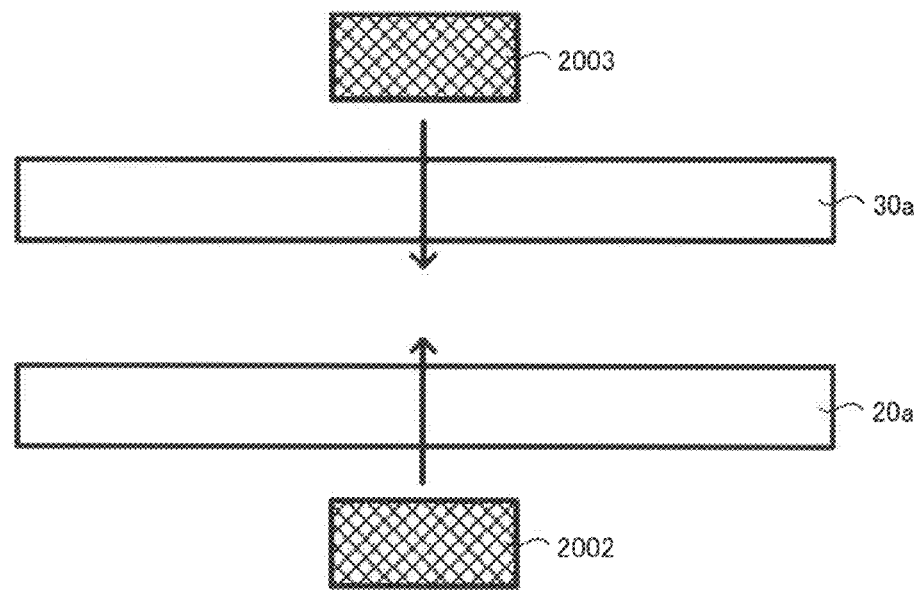
FIG. 9A is a view to illustrate a first step of a method for processing insulation layers.
Figure 9B:
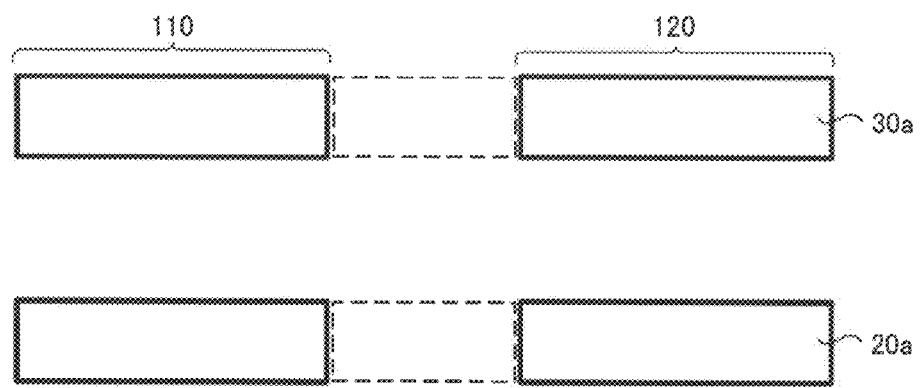
FIG. 9B is a view to illustrate a second step subsequent to the step shown in FIG. 9A.

A method for processing insulation layers (20a, 30a) is shown in FIGS. 9A and 9B.

First, as shown in FIG. 9A, insulation layers (20a, 30a) prior to processing are prepared. As described previously, as the material for insulation layers (20a, 30a), the following are listed: those made by impregnating inorganic material such as glass fiber or aramid fiber with resins such as epoxy resin, polyester resin, bismaleimide triazine resin (BT resin), imide resin (polyimide), phenol resin, or allyl polyphenylene ether resin (A-PPE resin). At this stage, insulation layers (20a, 30a) are prepregs (semi-cured adhesive sheets). Especially, such prepregs are preferred to be low-flow prepregs. However, instead of prepreg, RCF (resin-coated copper foil) or the like may also be used.

Next, blanking is performed on insulation layer (20a) using die 2002, and blanking is performed on insulation layer (30a) using die 2003. Accordingly, as shown in FIG. 9B, insulation layers (20a, 30a) are each separated into rigid section 110 and rigid section 120.

A method for manufacturing flexible wiring board 130 is shown in FIGS. 10A-12. In the present embodiment, multiple flexible wiring boards 130 are simultaneously manufactured in a single manufacturing panel, and one of them is separated in a step in FIG. 12. However, the present invention is not limited to such, and one flexible wiring board 130 may be formed using a single manufacturing panel.

Figure 10A:
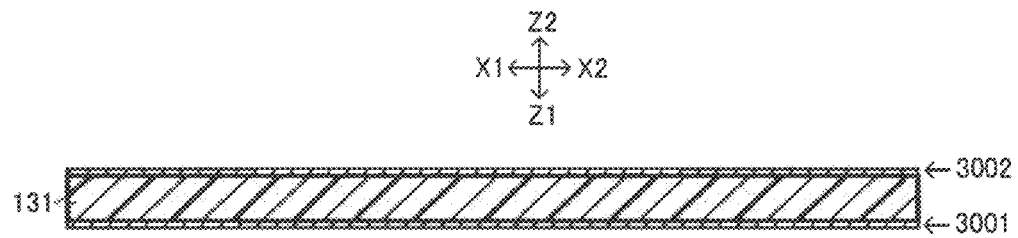
FIG. 10A is a view to illustrate a first step of a method for manufacturing a flexible wiring board.

First, as shown in FIG. 10A, a double-sided copper-clad laminate (starting material) is prepared. Such a double-sided copper-clad laminate has flexible substrate 131 and copper foils (3001, 3002). Copper foil 3001 is formed on the first surface of flexible substrate 131, and copper foil 3002 is formed on the second surface of flexible substrate 131. As described previously, the material for flexible substrate 131 is, for example, insulative polyimide or liquid-crystal polymer. The thickness of copper foils (3001, 3002) is 18 µm, for example.

Figure 10B:
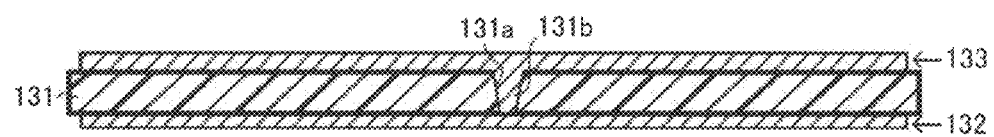
FIG. 10B is a view to illustrate a second step subsequent to the step shown in FIG. 10A.

Next, as shown in FIG. 10B, wiring layers (132, 133) and connection conductor (131b) are formed.

Specifically, first, hole (131a) is formed in flexible substrate 131 using a laser, for example. Hole (131a) penetrates through flexible substrate 131 and reaches copper foil 3001. After that, desmearing and soft etching are conducted if required.

Next, copper panel plating (plating in hole (131a) and on the entire surface) is performed on the second surface. In doing so, copper plating (such as electroless plating and electrolytic plating), for example, is filled in hole (131a). As a result, connection conductor (131b) is formed. In the present embodiment, plating is formed only on one surface (second surface). However, the present invention is not limited to such and plating may also be formed on both surfaces (first and second surfaces). By plating on both surfaces, the thickness of wiring layer 132 and the thickness of wiring layer 133 may be set to be the same.

Next, conductive layers on both surfaces of flexible substrate 131 are patterned using a lithographic technique. Accordingly, wiring layer 132 is formed on the first surface of flexible substrate 131, and wiring layer 133 is formed on the second surface of flexible substrate 131. Furthermore, if required, a horizontal roughening process is carried out.

Figure 10C:
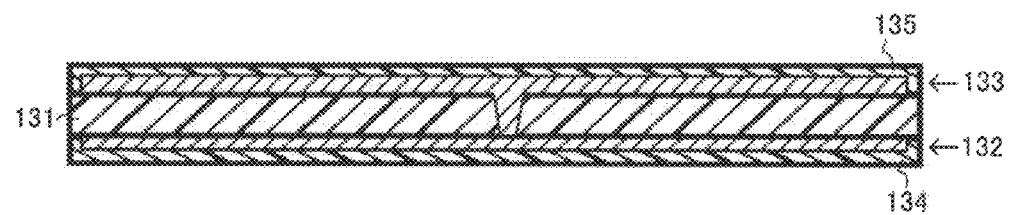
FIG. 10C is a view to illustrate a third step subsequent to the step shown in FIG. 10B.

Next, as shown in FIG. 10C, by pressing, for example, inner coverlay 134 is attached to the first-surface side of flexible substrate 131 and inner coverlay 135 is attached on the second-surface side of flexible substrate 131. Accordingly, wiring layers (132, 133) are coated with inner coverlays (134, 135) respectively. As a result, multiple flexible wiring boards 130 are manufactured. After that, jig holes and electrolytic gold plating are formed if required.

Figure 11:
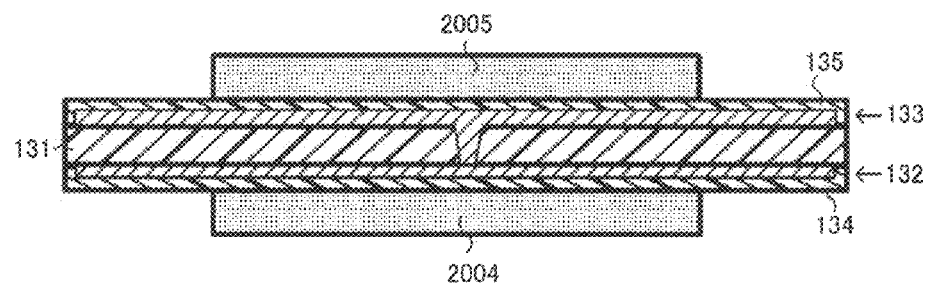
FIG. 11 is a view to illustrate a fourth step subsequent to the step shown in FIG. 10C.

Next, as shown in FIG. 11, by printing, for example, strip mask 2004 is formed on the first-surface side of inner coverlay 134, and strip mask 2005 is formed on the second-surface side of inner coverlay 135.

Figure 12:
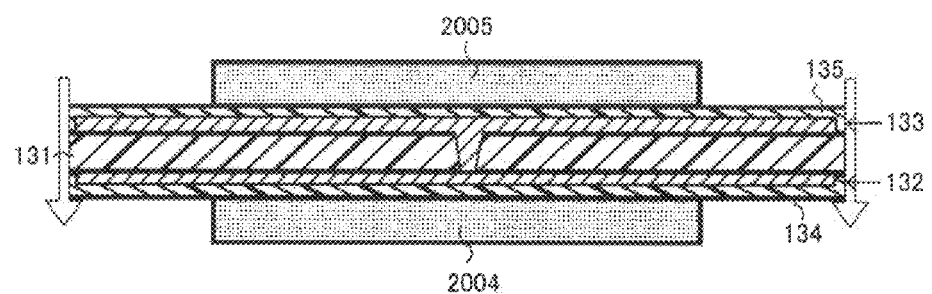
FIG. 12 is a view to illustrate a fifth step subsequent to the step shown in FIG. 11.

Next, as shown in FIG. 12, one flexible wiring board 130 is extracted using a die, for example. Accordingly, flexible wiring board 130 as previously shown in FIG. 3 is obtained. A method for detaching flexible wiring board 130 is not limited to using a die, and any other method may be employed. For example, a laser or a drill may be used for such detaching.

Next, in step (S12) of FIG. 7, a laminated body is formed with substrate 10 (core substrate), insulation layers (20a, 30a) and flexible wiring board 130.

Figure 13:
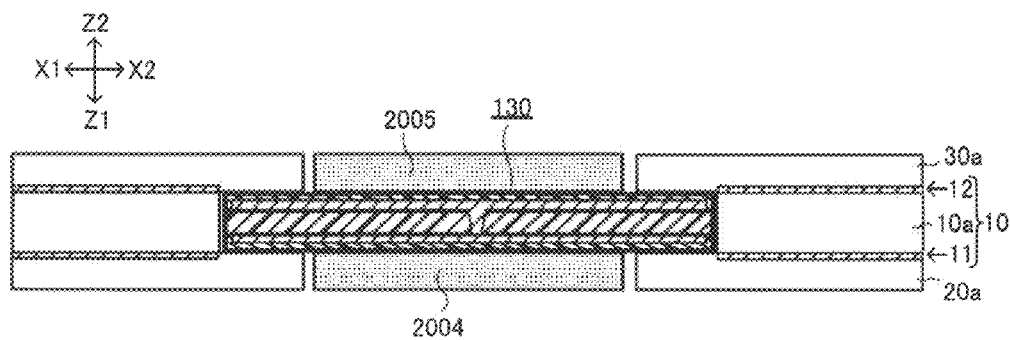
FIG. 13 is a view to illustrate a first step for forming a laminated body.

Specifically, first, substrate 10 (FIG. 8D), insulation layers (20a, 30a) (FIG. 9B) and flexible wiring board 130 (FIG. 12) are aligned and positioned as shown in FIG. 13, for example. Then, insulation layers (20a, 30a) are melted and preliminarily adhered to substrate 10.

Substrate 10 is positioned beside flexible wiring board 130 (in direction X). Insulation layer (20a) is positioned beside strip mask 2004 (in direction X), and insulation layer (30a) is positioned beside strip mask 2005 (in direction X). Both end portions of flexible wiring board 130 are sandwiched by insulation layers (20a, 30a). At that time, because of strip masks (2004, 2005) (spacers), the difference in levels on the first and second surfaces is reduced. However, it is difficult to completely remove such a difference in levels.

Figure 14:
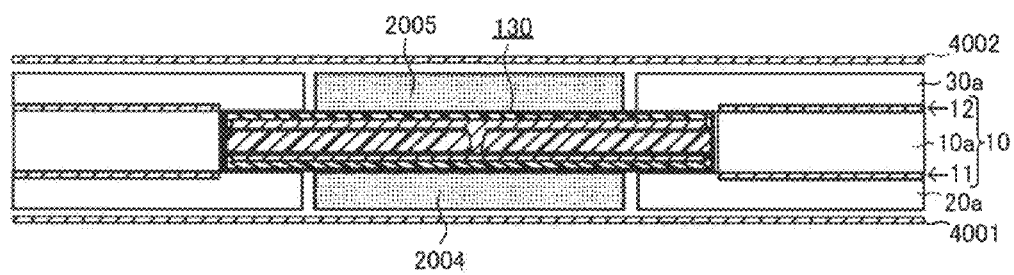
FIG. 14 is a view to illustrate a second step subsequent to the step shown in FIG. 13.

Next, as shown in FIG. 14, for example, copper foils (4001, 4002) (metal foils) are positioned outside the above members (first-surface side, second-surface side). Copper foils (4001, 4002) are set to be thicker than the copper foils in other wiring layers.

Figure 15A:
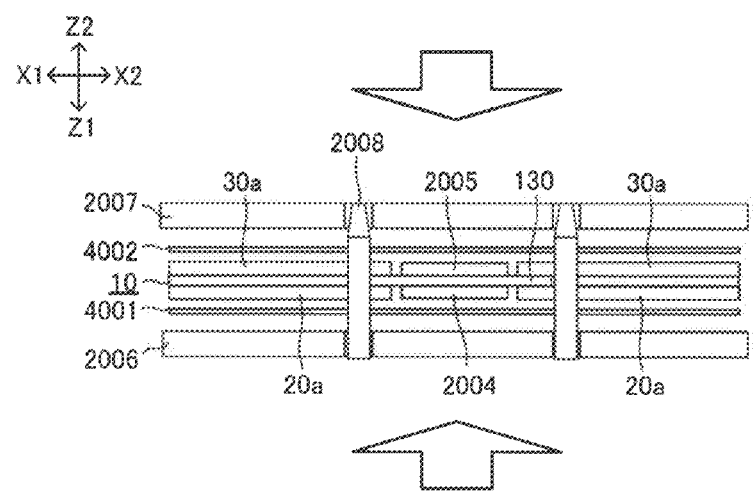
FIG. 15A is a view to illustrate a third step subsequent to the step shown in FIG. 14.
Figure 15B:
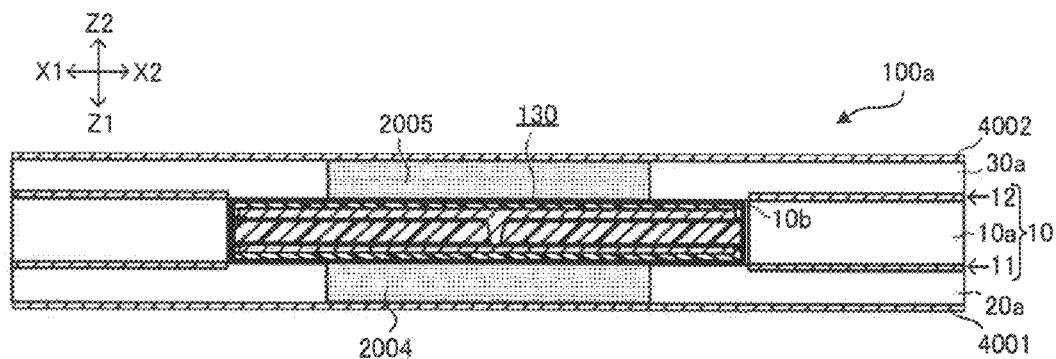
FIG. 15B is a view showing the results of the step shown in FIG. 15A.

Next, as shown in FIG. 15A, those members are sandwiched by pressing jigs (2006, 2007) and thermal pressed all at once. Namely, pressing and heating are conducted simultaneously. During that time, jigs (2006, 2007) are aligned by using pins 2008. Accordingly, pressure will be exerted substantially perpendicular to the main surfaces.

In the present embodiment, thicker copper foils (4001, 4002) are used. In such a case, even if pressing is conducted where a difference in levels has occurred as above, since conductors on insulation layers (20a, 30a) are thick, it is thought that copper foils (4001, 4002) will seldom break.

In addition, resin (10b) containing inorganic material is squeezed from the surrounding insulation layers (insulation layers 10a, 20a, 30a), and resin (10b) is filled in the clearance between insulation layer (10a) and flexible wiring board 130.

Moreover, prepregs (insulation layers 20a, 30a) are cured by the above heating, thus adhering insulation layer (10a) and insulation layers (20a, 30a). Insulation layers (20a, 30a) and flexible wiring board 130 are also bonded. The above pressing and heating may be divided into multiple procedures. Also, heating and pressing may be conducted separately, but it is more efficient if they are conducted simultaneously. After the thermal pressing, another heating may be conducted separately to integrate the above members.

Also, when copper foils (4001, 4002) are to be formed thin, relatively thick copper foils are laminated on insulation layers (20a, 30a) and then etched to obtain copper foils (4001, 4002) with a predetermined thickness. For example, after laminating 12 μm-thick copper foils on the insulation layers and then etching those copper foils, 9 μm-thick copper foils (4001, 4002) may be formed. Copper foils with excellent quality may be easily obtained by such a method.

Figure 16:
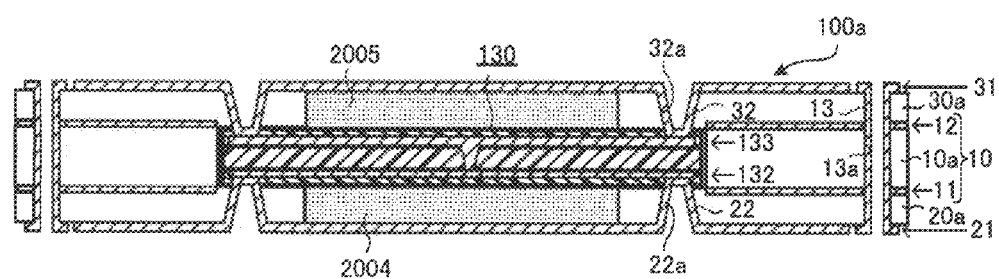
FIG. 16 is a view to illustrate a fourth step subsequent to the step shown in FIG. 15A.

Then, as shown in FIG. 16, wiring layers (21, 31) and connection conductors (13, 22, 32) are formed.

Specifically, using a laser, for example, hole (22a) is formed in insulation layer (20a), and hole (32a) is formed in insulation layer (30a). Also, through hole (13a) is formed in insulation layers (10a, 20a, 30a). Hole (22a) reaches wiring layer 132 in flexible wiring board 130, and hole (32a) reaches wiring layer 133 in flexible wiring board 130. Through hole (13a) penetrates through insulation layers (10a, 20a, 30a) entirely. After that, desmearing and soft etching are conducted if required.

Next, for example, by copper panel plating (plating in holes (22a, 32a) and through hole (13a) as well as on the entire surface), copper plating, for example, is formed on the wall surfaces of holes (22a, 32a), and copper plating, for example, is formed on the wall surface of through hole (13a). Such plating is made of electroless plating and electrolytic plating, for example. However, the present invention is not limited to such, and plating may be made of only either electroless plating or electrolytic plating. Moreover, dry plating such as PVD (Physical Vapor Deposition) and CVD (Chemical Vapor Deposition) may also be performed. In the present embodiment, flexible wiring board 130 is covered with copper foils (4001, 4002) during plating. Therefore, it is thought that flexible wiring board 130 will seldom suffer damage from the plating solution.

Accordingly, connection conductors (13, 22, 32) are formed. Connection conductor 22 is bonded to wiring layer 132, and connection conductor 32 is bonded to wiring layer 133. Connection conductor 13 electrically connects conductive layers (wiring layers 21, 31 prior to being patterned) with each other on both surfaces.

Through the above steps, laminated body (100a) is formed with substrate 10, insulation layers (20a, 30a) and flexible wiring board 130. Insulation layer (10a) is sandwiched between insulation layer (20a) and insulation layer (30a).

Next, in step (S13) of FIG. 7, conductive layers on both surfaces (outermost layers) are patterned by a lithographic technique, for example. Accordingly, wiring layer 21 is formed on insulation layer (20a), and wiring layer 31 is formed on insulation layer (30a). By the above panel plating, wiring layer 21 and connection conductor 22 as well as wiring layer 31 and connection conductor 32 are each formed to be contiguous. In addition, since copper foils (4001, 4002) are thick, wiring layers (21, 31) will become thicker than other wiring layers.

Next, in step (S14) of FIG. 7, building up is conducted on laminated body (100a).

Figure 17:
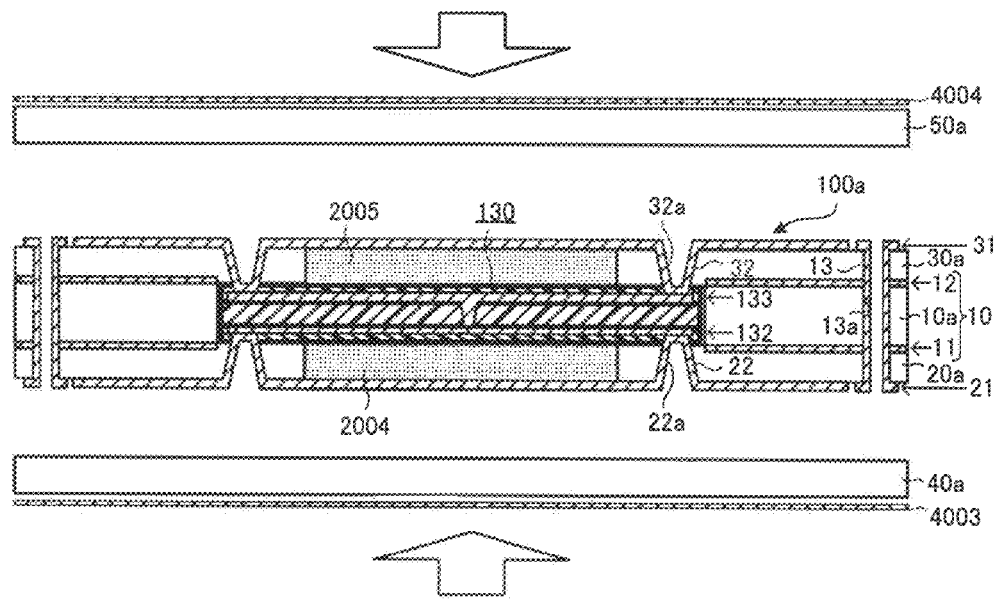
FIG. 17 is a view to illustrate a first step for building up on a laminated body (core section)

Specifically, first, as shown in FIG. 17, copper foil 4003 (metal foil), insulation layer (40a), laminated body (100a), insulation layer (50a) and copper foil 4004 (metal foil) are positioned to be laminated in that order. Accordingly, laminated body (100a) is sandwiched by insulation layer (40a) and insulation layer (50a). At this stage, insulation layers (40a, 50a) are prepregs (semi-cured adhesive sheets). However, instead of prepreg, RCF (resin-coated copper foil) or the like may also be used.

Figure 18:
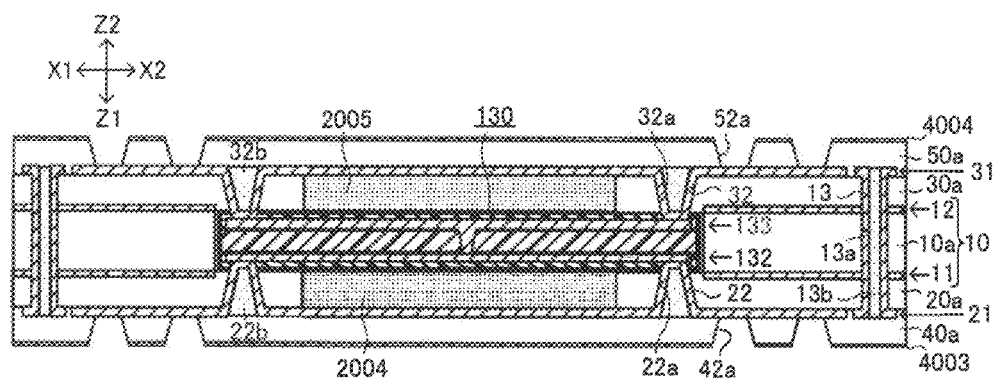
FIG. 18 is a view to illustrate a second step subsequent to the step shown in FIG. 17.

Next, thermal pressing is performed. Accordingly, prepregs (insulation layers 40a, 50a) are cured, and copper foil 4003, insulation layer (40a), laminated body (100a), insulation layer (50a) and copper foil 4004 become integrated. Also, as shown in FIG. 18, resin flowed from insulation layers (40a, 50a) is filled in through hole (13a) and holes (22a, 32a), and becomes insulative bodies (13b, 22b, 32b). Insulative bodies (13b, 22b, 32b) may be filled in advance prior to pressing.

When copper foils (4003, 4004) are to be formed thin, relatively thick copper foils are laminated on insulation layers (40a, 50a) and then etched to obtain copper foils (4003, 4004) with a predetermined thickness. For example, after laminating 12 μm-thick copper foils on the insulation layers and then etching those copper foils, 6.5 μm-thick copper foils (4003, 4004) may be formed. Copper foils with excellent quality may be easily obtained by such a method.

Next, as shown in FIG. 18, hole (42a) is formed in insulation layer (40a) and hole (52a) is formed in insulation layer (50a) by a laser, for example. After that, desmearing and soft etching are conducted if required.

Figure 19:
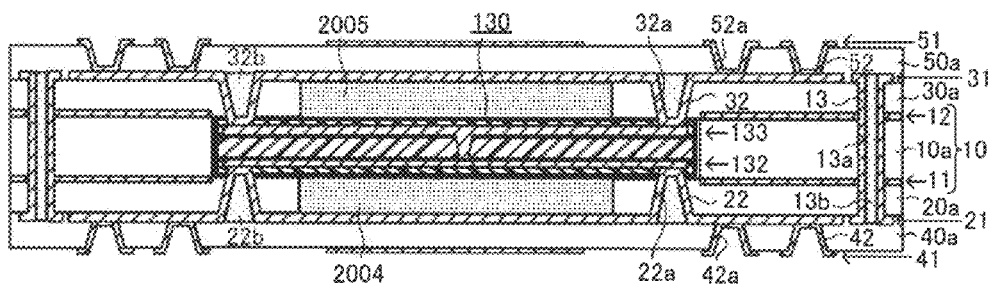
FIG. 19 is a view to illustrate a third step subsequent to the step shown in FIG. 18.

Next, as shown in FIG. 19, for example, by copper panel plating (such as electroless plating or electrolytic plating, or both), copper plating, for example, is formed in hole (42a) and copper plating, for example, is formed in hole (52a). Accordingly, connection conductors (42, 52) are formed.

Furthermore, conductive layers on both surfaces are patterned using a lithographic technique, for example. Accordingly, wiring layer 41 is formed on insulation layer (40a), and wiring layer 51 is formed on insulation layer (50a). Conductive patterns of wiring layers (41, 51) remain on strip masks (2004, 2005) respectively.

Figure 20:
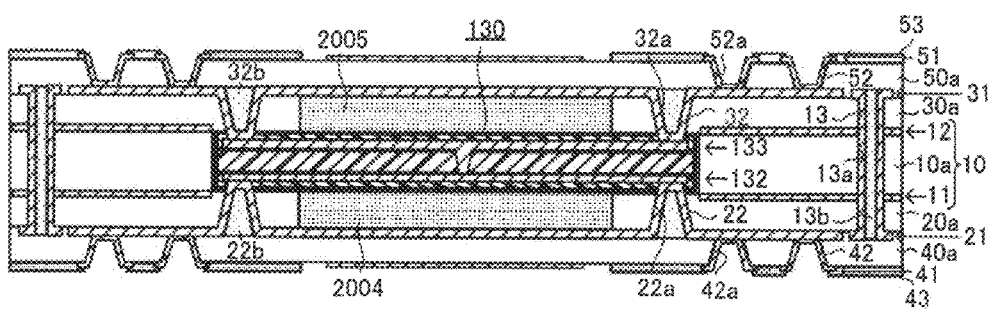
FIG. 20 is a view to illustrate a fourth step subsequent to the step shown in FIG. 19.

Next, as shown in FIG. 20, solder-resist layers (43, 53) are formed on both surfaces by screen printing or lamination, for example. Then, solder-resist layers (43, 53) are cured by heating, for example. Patterning, drilling and external processing are conducted if required.

Figure 21:
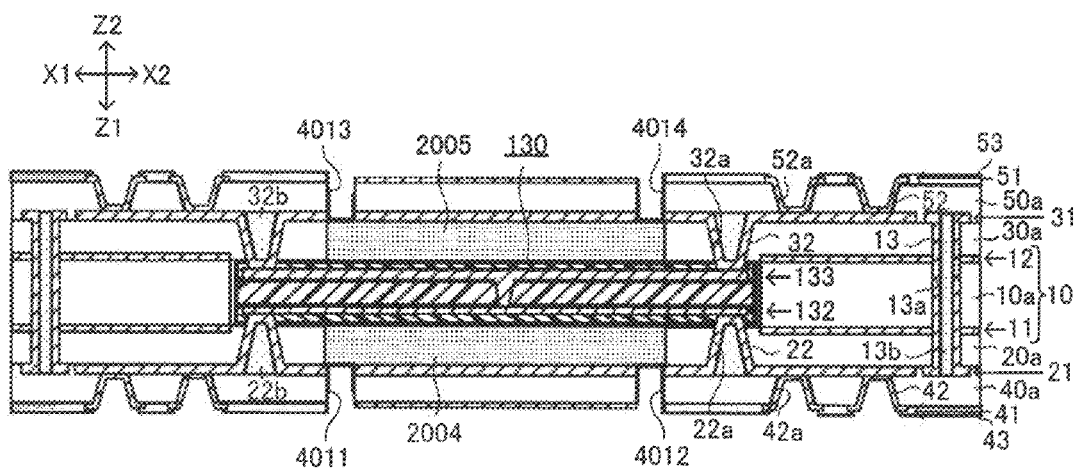
FIG. 21 is a view to illustrate a fifth step subsequent to the step shown in FIG. 20.

Next, by etching while coating the first surface and second surface with a mask having predetermined openings, for example, or by partially beaming a laser, cut lines (4011-4014) are formed as shown in FIG. 21. Cut lines (4011, 4012) are formed in insulation layer (40a), and cut lines (4013, 4014) are formed in insulation layer (50a). Cut lines (4011-4014) each reach a conductive pattern (wiring layer 41 or 51) on strip mask 2004 or 2005. Then, desmearing and soft etching are conducted if required.

Next, in step (S15) of FIG. 7, space is formed on both sides (first-surface side and second-surface side) of the central portion in flexible wiring board 130. Accordingly, flexible section (R100) (FIG. 1) is formed.

Figure 22:
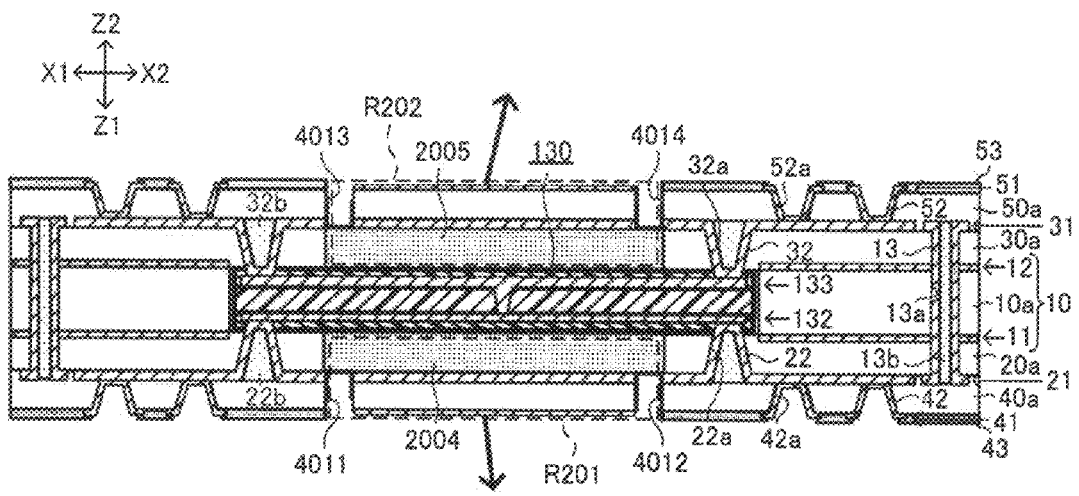
FIG. 22 is a view to illustrate a step for forming a flexible section.

Specifically, as shown in FIG. 22, portions corresponding to regions (R201, R202) partitioned by cut lines (4011-4014) are removed by peeling them from both surfaces of flexible wiring board 130. During that time, detaching is easy since strip masks (2004, 2005) are arranged. Accordingly, the central section of flexible wiring board 130 is exposed and the space that allows flexible wiring board 130 to curve (bend) is formed on the upper and lower surfaces (in lamination directions of insulation layers). As a result, flex-rigid wiring board 100 (FIG. 1) is completed.

Then, if required, remaining conductors are removed by mask etching, for example. Also, external connection terminals (solder bumps) are formed in opening portions in solder-resist layers (43, 53) by printing solder paste, reflowing and the like. Accordingly, connecting flex-rigid wiring board 100 with other wiring boards or mounting electronic components on flex-rigid wiring board 100 will be achieved through such external connection terminals. Also, external processing, warping correction, conductivity inspection, exterior inspection, final inspection and the like are conducted according to requirements.

The manufacturing method according to the present embodiment is suitable for manufacturing the above flex-rigid wiring board 100. Using such a manufacturing method, excellent flex-rigid wiring boards 100 may be obtained at a lower cost.

Second Embodiment

The second embodiment of the present invention is described by focusing on the differences from the above first embodiment. Here, the same reference number is used for an element which is the same as that shown in the above FIG. 1 and others. Common portions already described above, namely, portions whose description would be redundant, will be omitted from being described here for convenience sake.

Figure 23:
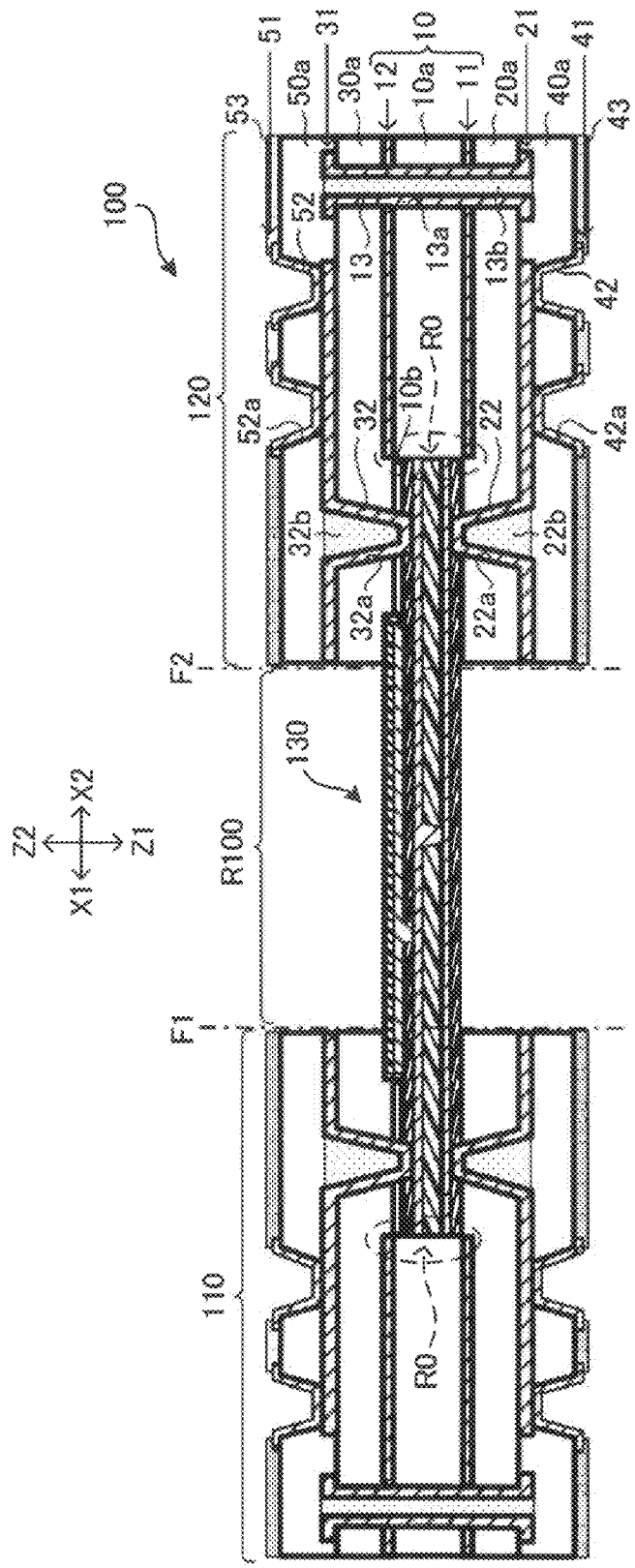
FIG. 23 is a cross-sectional view of a flex-rigid wiring board according to the second embodiment of the present invention.
Figure 24:
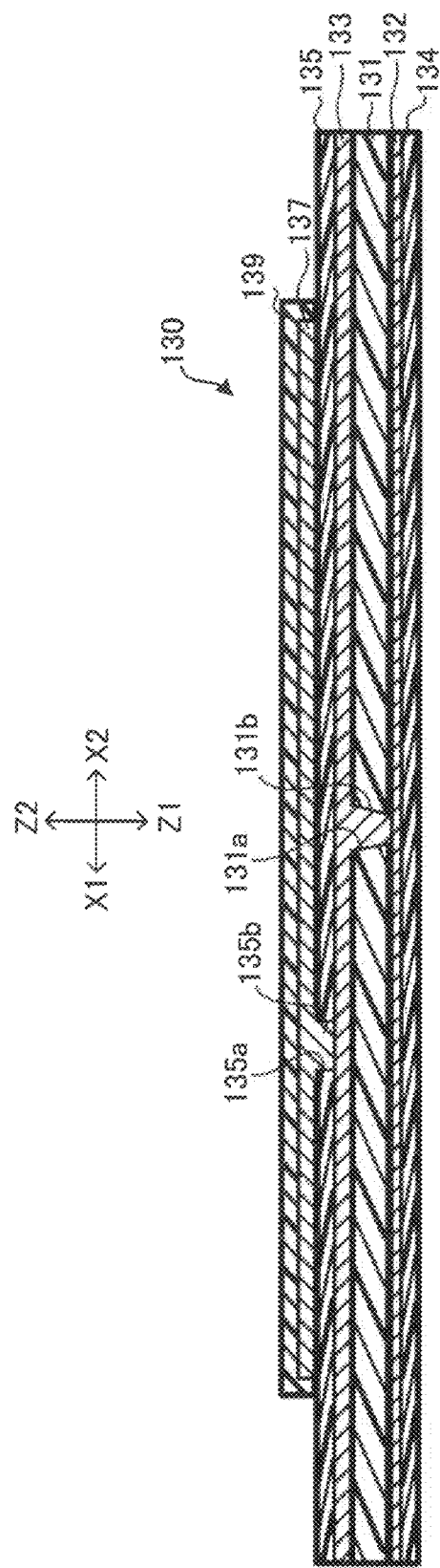
FIG. 24 is a cross-sectional view of a flexible wiring board according to the second embodiment.
Figure 25:
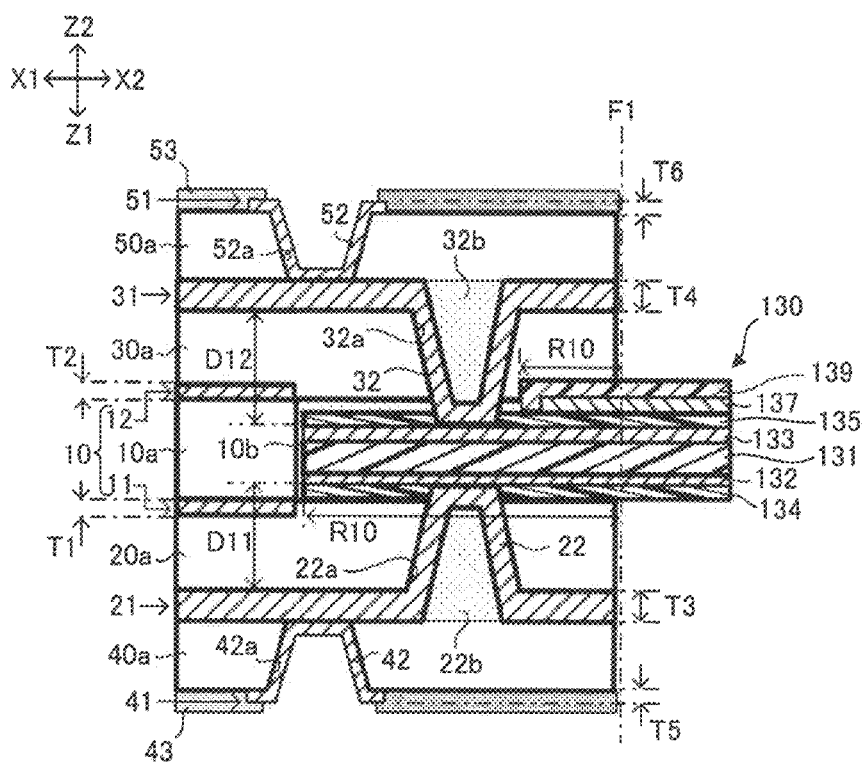
FIG. 25 is a magnified cross-sectional view showing part of a region shown in FIG. 23.

As shown in FIGS. 23-25, flexible wiring board 130 of flex-rigid wiring board 100 according to the present embodiment has shield layer 137 and outer coverlay 139 on one surface (second surface, for example).

Shield layer 137 is formed on inner coverlay 135. Shield layer 137 shields electromagnetic noise from the outside (especially from the second-surface side) to wiring layers (132, 133), as well as shields electromagnetic noise from wiring layers (132, 133) to the outside (especially to the second-surface side). Shield layer 137 is made of conductive paste, for example. The thickness of shield layer 137 is approximately 10-30 μm, for example.

The conductive paste forming shield layer 137 contains fine silver particles, for example. Conductive paste is preferred to contain at least one kind from among silver, gold, copper and carbon. Especially, since silver has high electrical conductivity, it is effective to reduce noise. However, the material for shield layer 137 is not limited to the above, and any other type may also be used.

In addition, inner coverlay 135 has connection conductor (135b). Specifically, hole (135a) is formed in inner coverlay 135. Hole (135a) may be formed by a laser, for example. Connection conductor (135b) is formed by filling conductive paste in hole (135a). Conductive paste may be filled by screen printing, for example. Shield layer 137 and wiring layer 133 are electrically connected by connection conductor (135b).

Outer coverlay 139 is formed over inner coverlay 135. Outer coverlay 139 coats shield layer 137. Outer coverlay 139 insulates as well as protects flexible wiring board 130 from the outside. Outer coverlay 139 is made of polyimide, for example. The thickness of outer coverlay 139 is approximately 5-30 μm, for example.

As shown in FIG. 25, resin (10b) is filled in the space partitioned by flexible wiring board 130 and insulation layers (10a, 20a, 30a) (clearance among those members). Resin (10b) flows from the surrounding insulation layers (such as insulation layers 20a, 30a) during pressing (see FIG. 15A), for example, and is integrated with the surrounding insulation layers.

In flex-rigid wiring board 100 of the present embodiment, since wiring layers (132, 133) are protected by shield layer 137, it is thought that flexible wiring board 130 will be tolerant to noise. Also, since flexible wiring board 130 is protected by outer coverlay 139, the strength or the like of flexible wiring board 130 is enhanced.

Other than the above, regarding the same structure as in the first embodiment, it is thought that substantially the same effects as described above in the first embodiment may be achieved.

Third Embodiment

The third embodiment of the present invention is described by focusing on differences from the above second embodiment. Here, the same reference number is used for an element which is the same as that shown in the above FIG. 1 and others. Common portions already described above, namely, portions whose description would be redundant, will be omitted from being described here for convenience sake.

Figure 26:
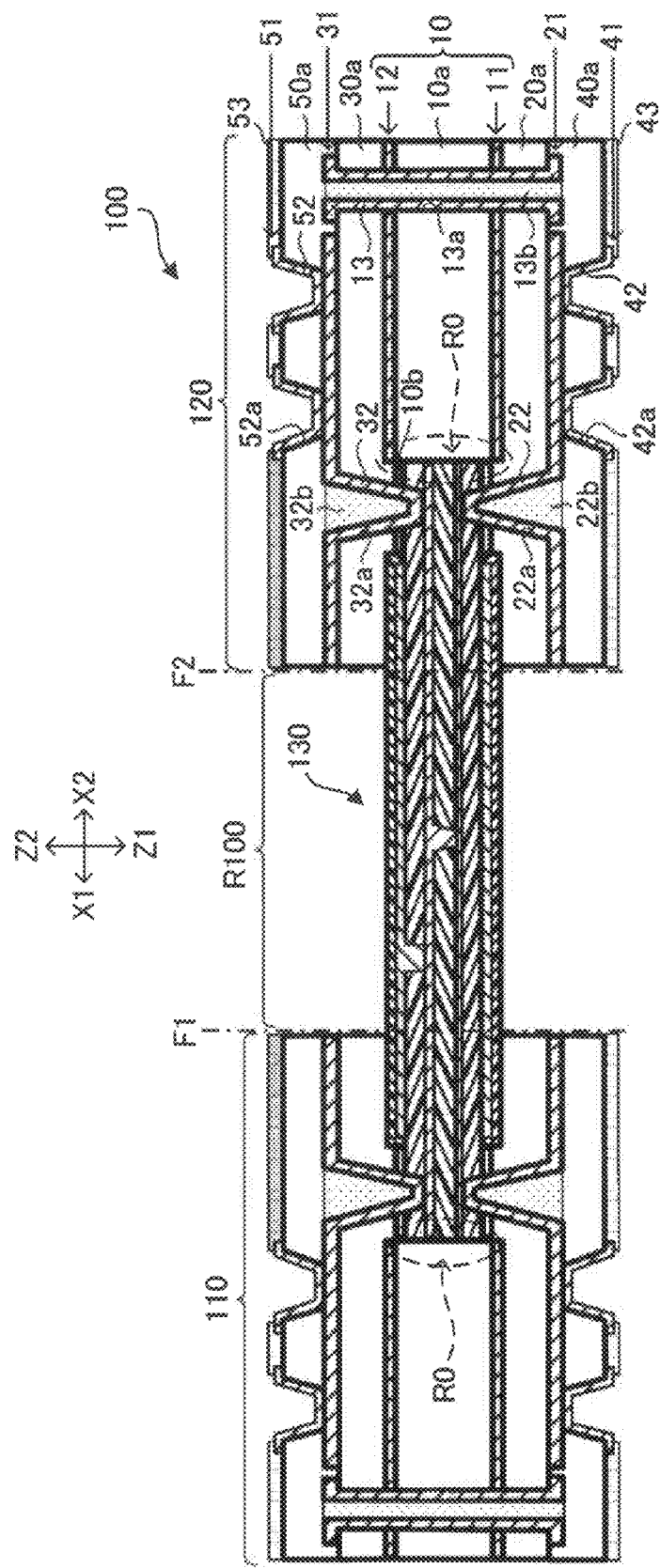
FIG. 26 is a cross-sectional view of a flex-rigid wiring board according to the third embodiment of the present invention.
Figure 27:
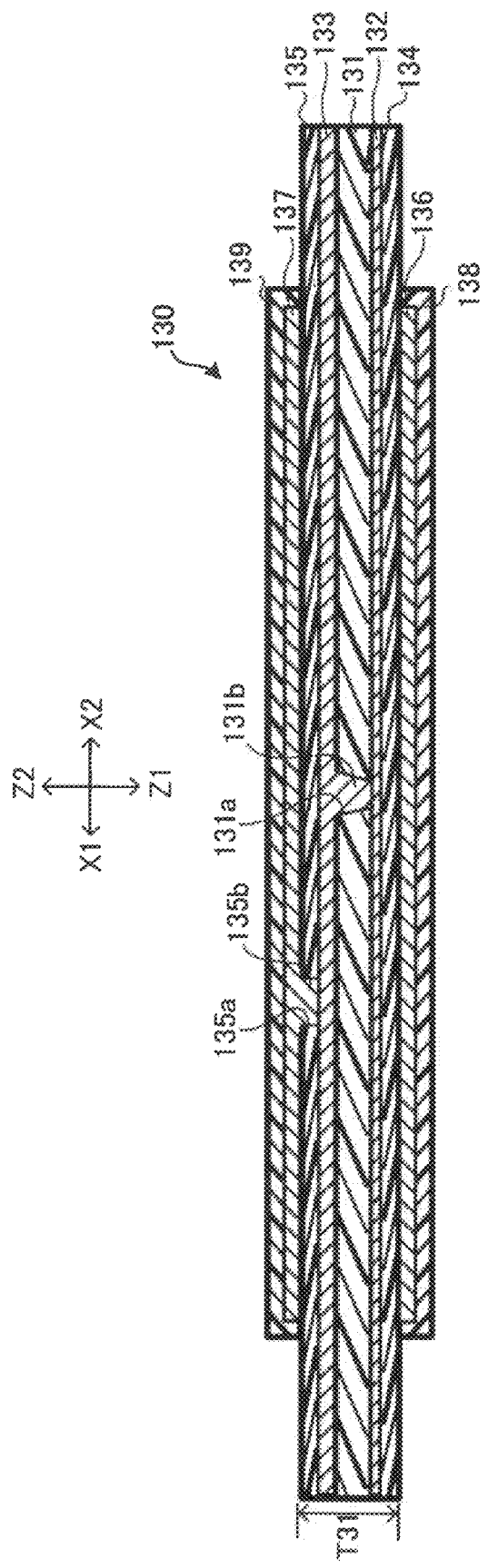
FIG. 27 is a cross-sectional view of a flexible wiring board according to the third embodiment.
Figure 28:
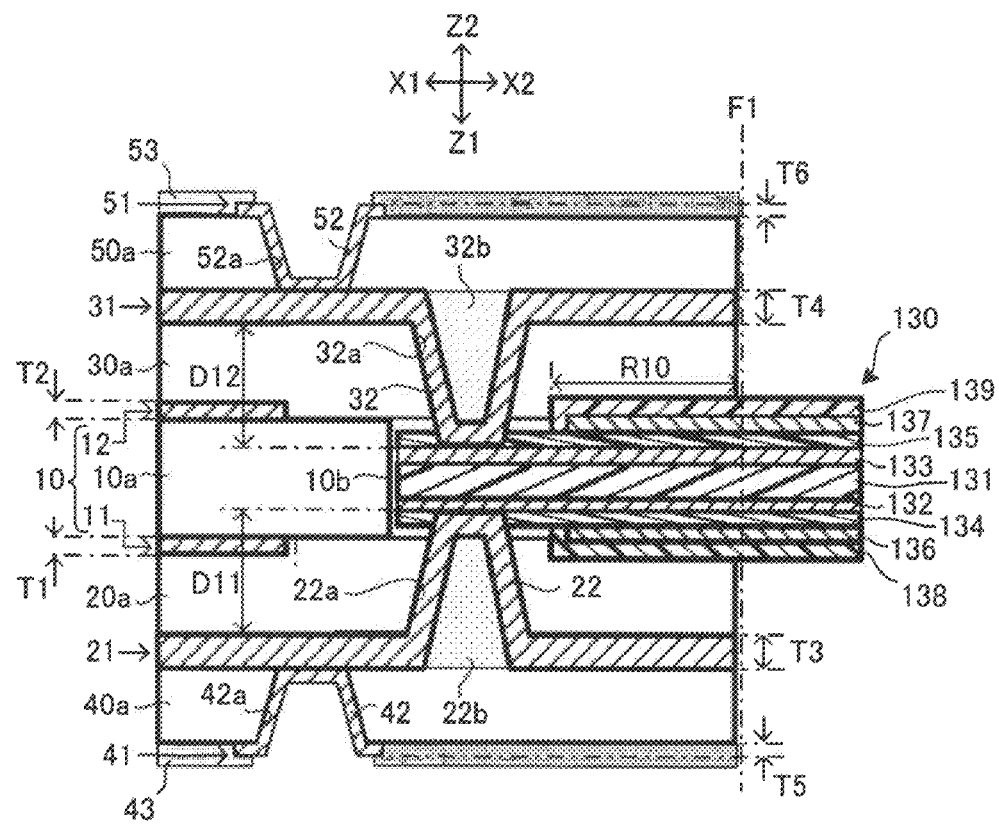
FIG. 28 is a magnified cross-sectional view showing part of a region shown in FIG. 26.
Figure 29:
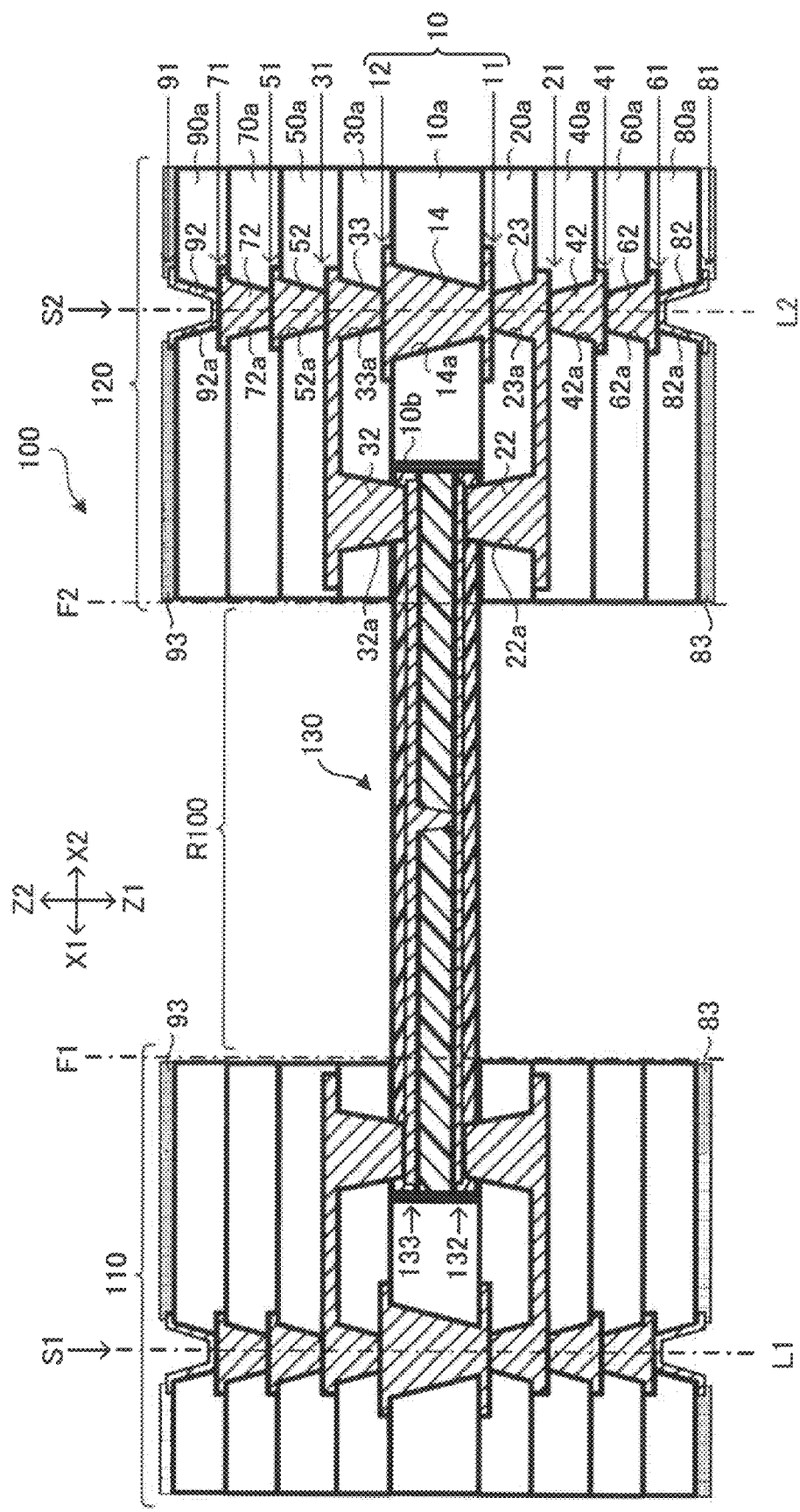
FIG. 29 is a cross-sectional view of a flex-rigid wiring board according to the fourth embodiment of the present invention.

As shown in FIGS. 26-28, flexible wiring board 130 in flex-rigid wiring board 100 according to the present embodiment has shield layers (136, 137) and outer coverlays (138, 139) on both surfaces (such as the first and second surfaces).

If such a structure is employed, since wiring layers (132, 133) are protected by shield layers (136, 137) from both surfaces, it is thought that flexible wiring board 130 will become further tolerant to noise. In addition, by protecting flexible wiring board 130 with outer coverlays (138, 139) from both surfaces, the strength or the like of flexible wiring board 130 further increase.

Fourth Embodiment

The fourth embodiment of the present invention is described by focusing on differences from the above first embodiment. Here, the same reference number is used for an element which is the same as that shown in the above FIG. 1 and others. Common portions already described above, namely, portions whose description would be redundant, will be omitted from being described here for convenience sake.

Flex-rigid wiring board 100 of the present invention has more layers than an example in the first embodiment. Rigid sections (110, 120) have the following: substrate 10, insulation layers (20a, 30a, 40a, 50a, 60a, 70a, 80a, 90a), wiring layers (21, 31, 41, 51, 61, 71, 81, 91), connection conductors (22, 23, 32, 33, 42, 52, 62, 72, 82, 92) and solder-resist layers (83, 93).

Substrate 10 has insulation layer (10a), wiring layers (11, 12) and connection conductor 14. Connection conductor 14 is formed by filling a conductor in hole (14a) that penetrates through insulation layer (10a). Wiring layer 11 and wiring layer 12 are electrically connected to each other by connection conductor 14.

Insulation layers (20a, 30a, 40a, 50a, 60a, 70a, 80a, 90a) correspond to interlayer insulation layers. In such insulation layers (20a-90a), holes (22a, 23a, 32a, 33a, 42a, 52a, 62a, 72a, 82a, 92a) which penetrate their respective insulation layers are formed. Insulation layers (20a-90a) have connection conductors (22, 23, 32, 33, 42, 52, 62, 72, 82, 92). Connection conductors (22-72, 23, 33) are formed by filling plating in their respective holes (22a-72a, 23a, 33a). Connection conductors (82, 92) are formed by forming plating on wall surfaces of their respective holes (82a, 92a).

Connection conductors (82, 62, 42, 23, 14, 33, 52, 72, 92) are laminated in that order from the first-surface side toward the second-surface side along axis (L1) and axis (L2). Adjacent connection conductors are adhered to (in contact with) each other, and are electrically continuous. Filled-stack structure (S1) is formed along axis (L1), and filled-stack structure (S2) is formed along axis (L2). Filled-stack structures (S1, S2) are each structured where interlayer connections throughout the layers (filled conductors or conformal conductors) are positioned along the same axis, a so-called full-stack structure.

Connection conductor 22 is connected to both wiring layer 132 and wiring layer 21, and connection conductor 32 is connected to both wiring layer 133 and wiring layer 31. Accordingly, wiring layer 21 is electrically connected to wiring layer 132 contained in flexible wiring board 130 by connection conductor 22 in insulation layer (20a). Also, wiring layer 31 is electrically connected to wiring layer 133 contained in flexible wiring board 130 by connection conductor 32 in insulation layer (30a).

In the drawings, thicknesses (T1-T10) (FIG. 30), and T33 and T34 (FIG. 3) satisfy the following formulas:

$$T3, T4 \geq T33, T34$$

$$T3, T4 \geq T1, T2 = T5, T6, T7, T8$$

$$T3, T4 \geq T9, T10 > T5, T6, T7, T8$$

$$T1, T2 \geq T33, T34$$

Figure 30:
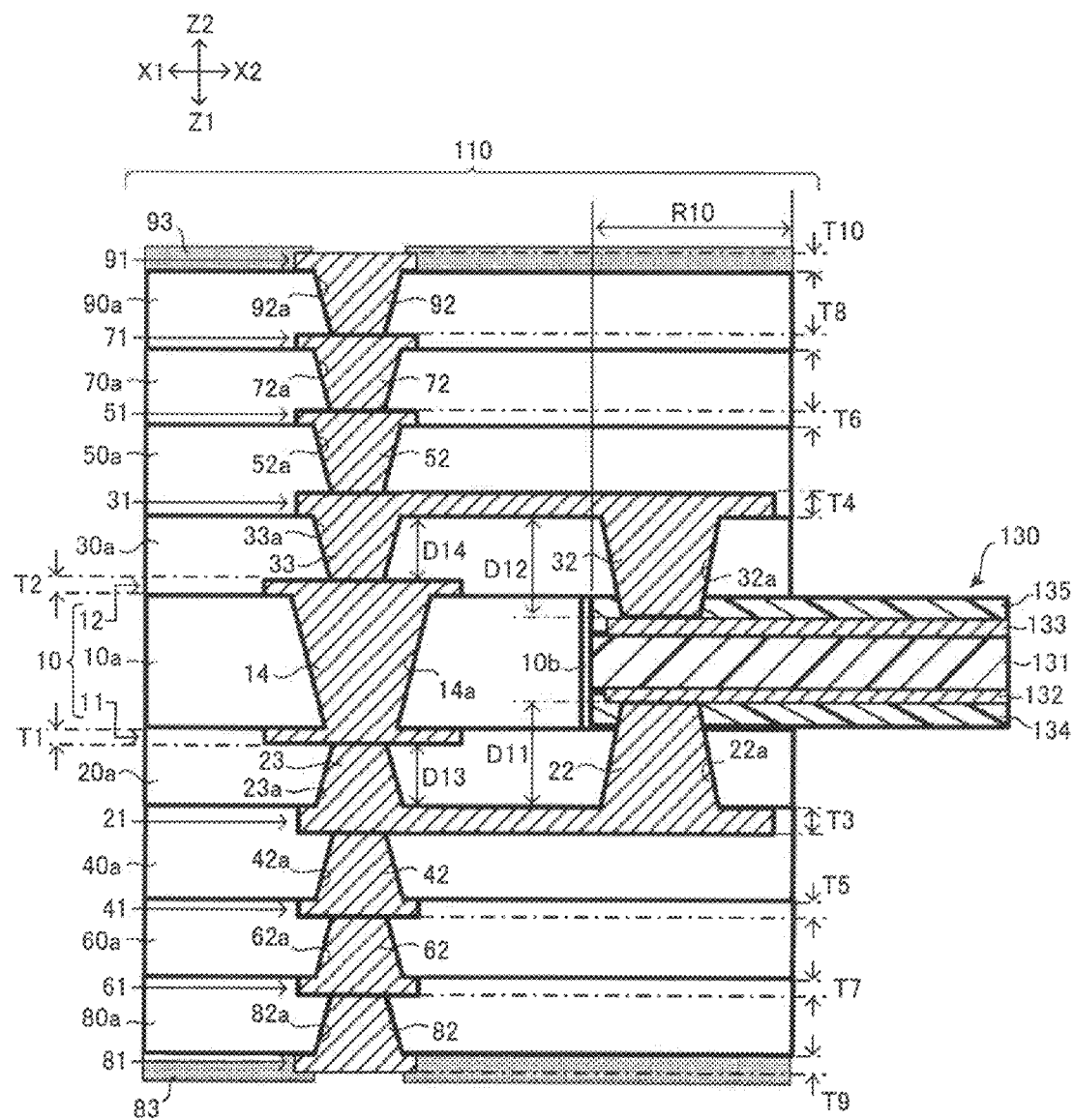
FIG. 30 is a magnified cross-sectional view showing part of a region shown in FIG. 29.

The following are formed in insulation layers (20a, 30a) as shown in FIG. 30: connection conductors (22, 32) (first connection conductors) which electrically connect conductors (wiring layers 21, 31) on insulation layers (20a, 30a) and conductors (wiring layers 132, 133) in flexible wiring board 130; and connection conductors (23, 33) (second connection conductors) which make interlayer electrical connections. In addition, measurements (D11, D12) in thickness directions (directions Z) of connection conductors (22, 32) are longer than measurements (D13, D14) in thickness directions of connection conductors (23, 33). Accordingly, compared with connection conductors (23, 33), connection conductors (22, 32) have greater contact areas with the wall surfaces of holes (22a, 32a). As a result, the strength to secure flexible wiring board 130, the durability of such securing and the like increase.

The conductors (wiring layers 21, 31) on insulation layers (20a, 30a) are thicker than the conductors (wiring layers 81, 91) on the outermost layers of rigid sections (110, 120). In addition, wiring layers (81, 91) are thicker than the conductors (wiring layers 41, 51, 61, 71) which are positioned on the lower-layer side of wiring layers (81, 91) as well as on the upper-layer side of wiring layers (21, 31).

Other than the above, regarding the same structures as in the first embodiment, substantially the same effects will be achieved as described previously in the first embodiment.

Flex-rigid wiring board 100 of the present embodiment may be manufactured by the procedure previously shown in FIG. 7, for example, by employing the steps that correspond to the above-described steps shown in FIGS. 8A-22.

Other Embodiments

So far, flex-rigid wiring boards and their manufacturing methods according to the embodiments of the present invention have been described. However, the present invention is not limited to the above embodiments.

Basically, the material for wiring layers (11, 12, 21, 31, 41, 51) is not limited to any specific type.

Figure 31A:
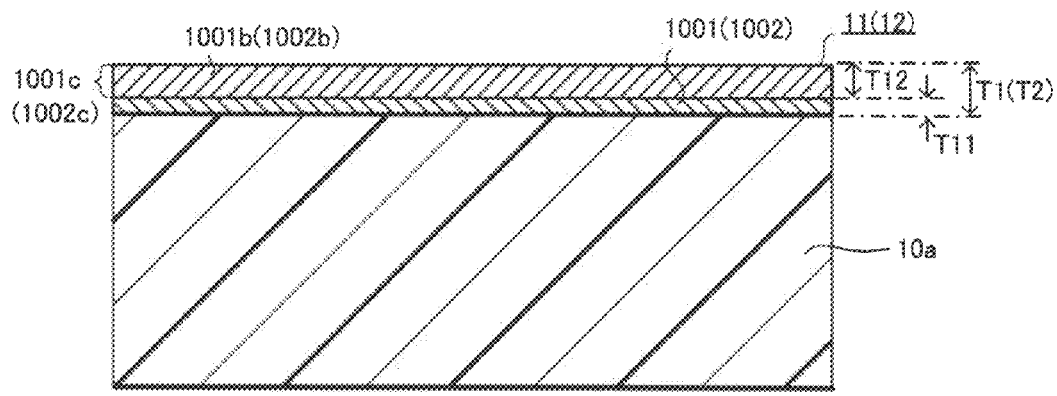
FIG. 31A is a cross-sectional view showing a first alternative example of the structure of a first wiring layer.
Figure 31B:
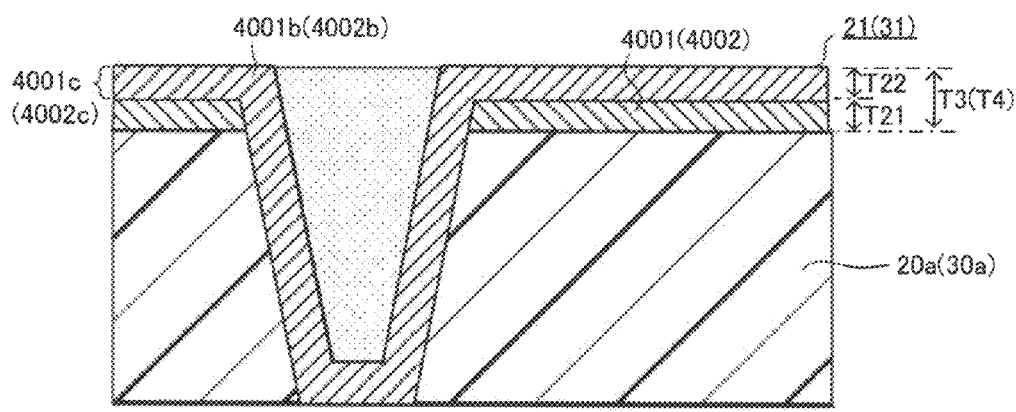
FIG. 31B is a cross-sectional view showing a first alternative example of the structure of a second wiring layer.
Figure 31C:
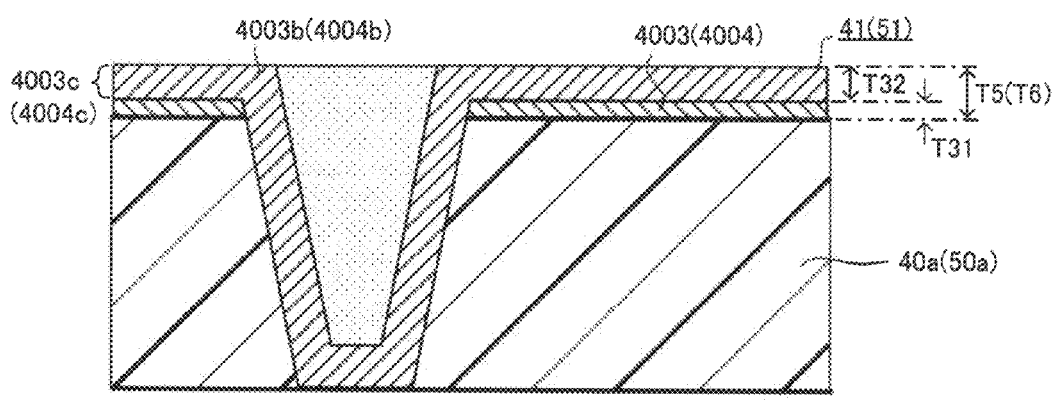
FIG. 31C is a cross-sectional view showing a first alternative example of the structure of a third wiring layer.

For example, as shown in FIGS. 31A-31C, wiring layers (11, 12, 21, 31, 41, 51) are not always required to have electroless plating. In such a case, as long as the above-defined relationships in their thicknesses are satisfied, substantially the same effects as described previously in each embodiment may be achieved.

Figure 32A:
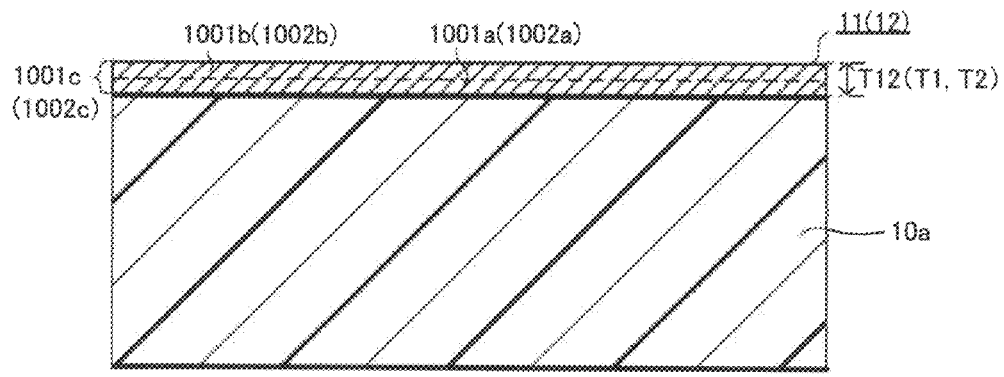
FIG. 32A is a cross-sectional view showing a second alternative example of the structure of a first wiring layer.
Figure 32B:
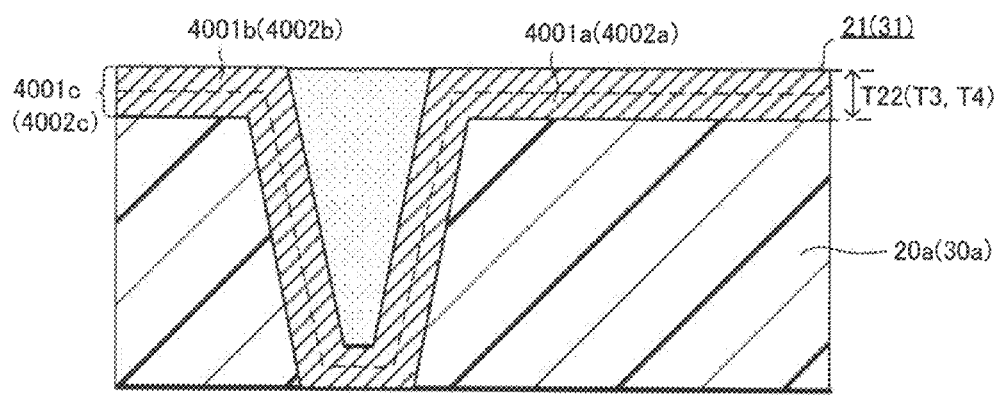
FIG. 32B is a cross-sectional view showing a second alternative example of the structure of a second wiring layer.
Figure 32C:
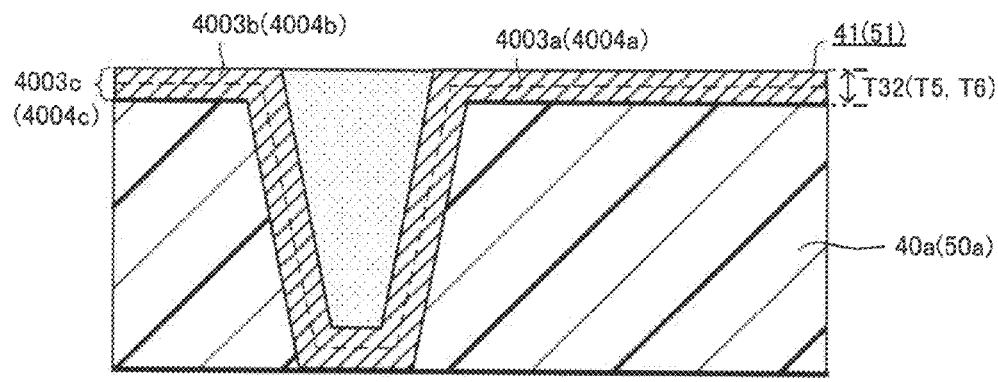
FIG. 32C is a cross-sectional view showing a second alternative example of the structure of a third wiring layer.

Also, as shown in FIGS. 32A-32C, wiring layers (11, 12, 21, 31, 41, 51) are not always required to have copper foils. In such a case, as long as the above-defined relationships in their thicknesses are satisfied, substantially the same effects as described previously in each embodiment may be achieved.

Other than the above, as long as required resistance values, adhesiveness with insulation layers and the like are achieved, wiring layers (11, 12, 21, 31, 41, 51) may be formed only with copper foils or with electrolytic plating. Moreover, instead of copper foils, metal foils other than copper may also be used.

Figure 33:
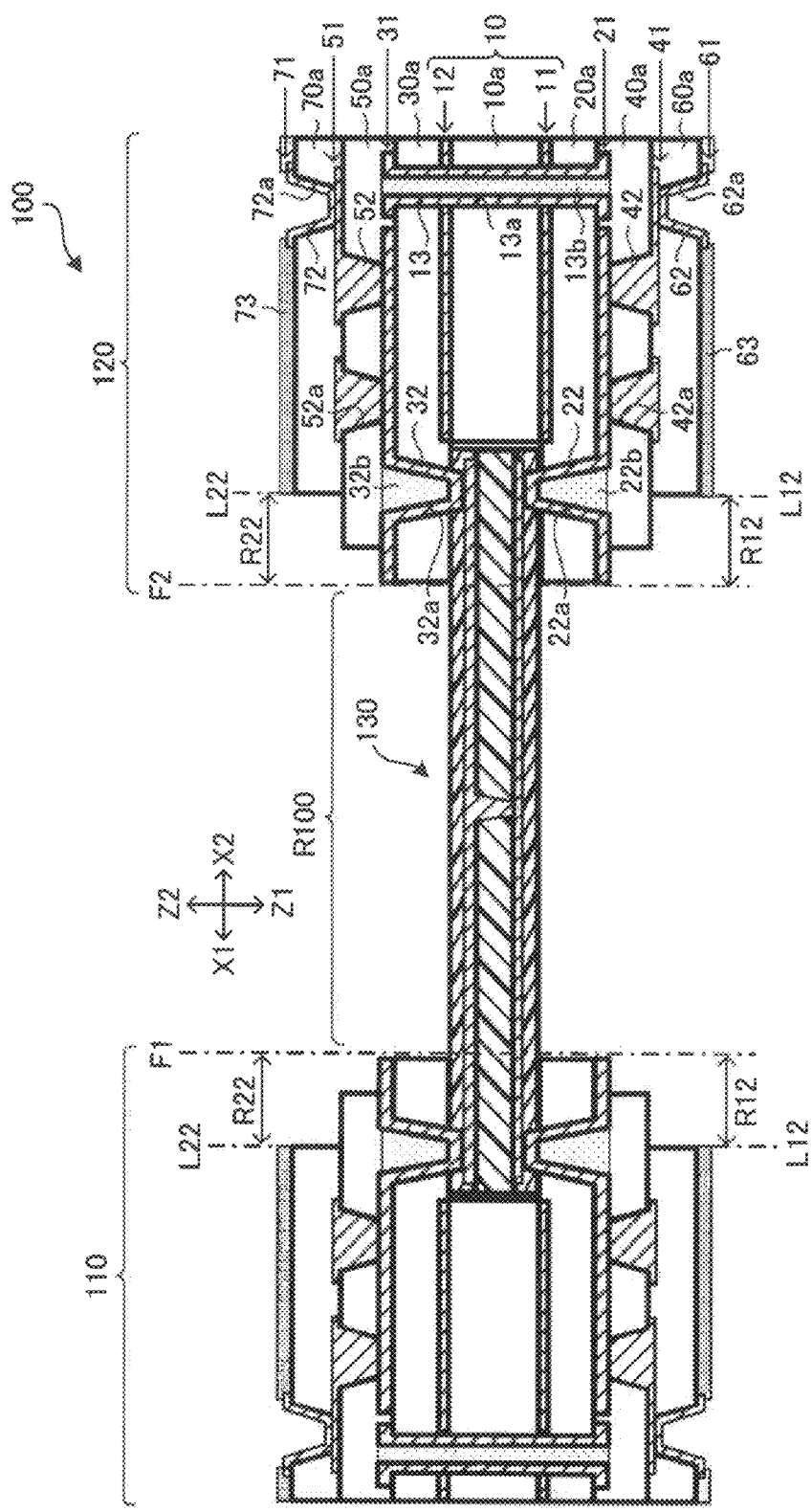
FIG. 33 is a view showing a structure of insulation layers which become thinner in steps as they come closer to the flexible section.
Figure 34:
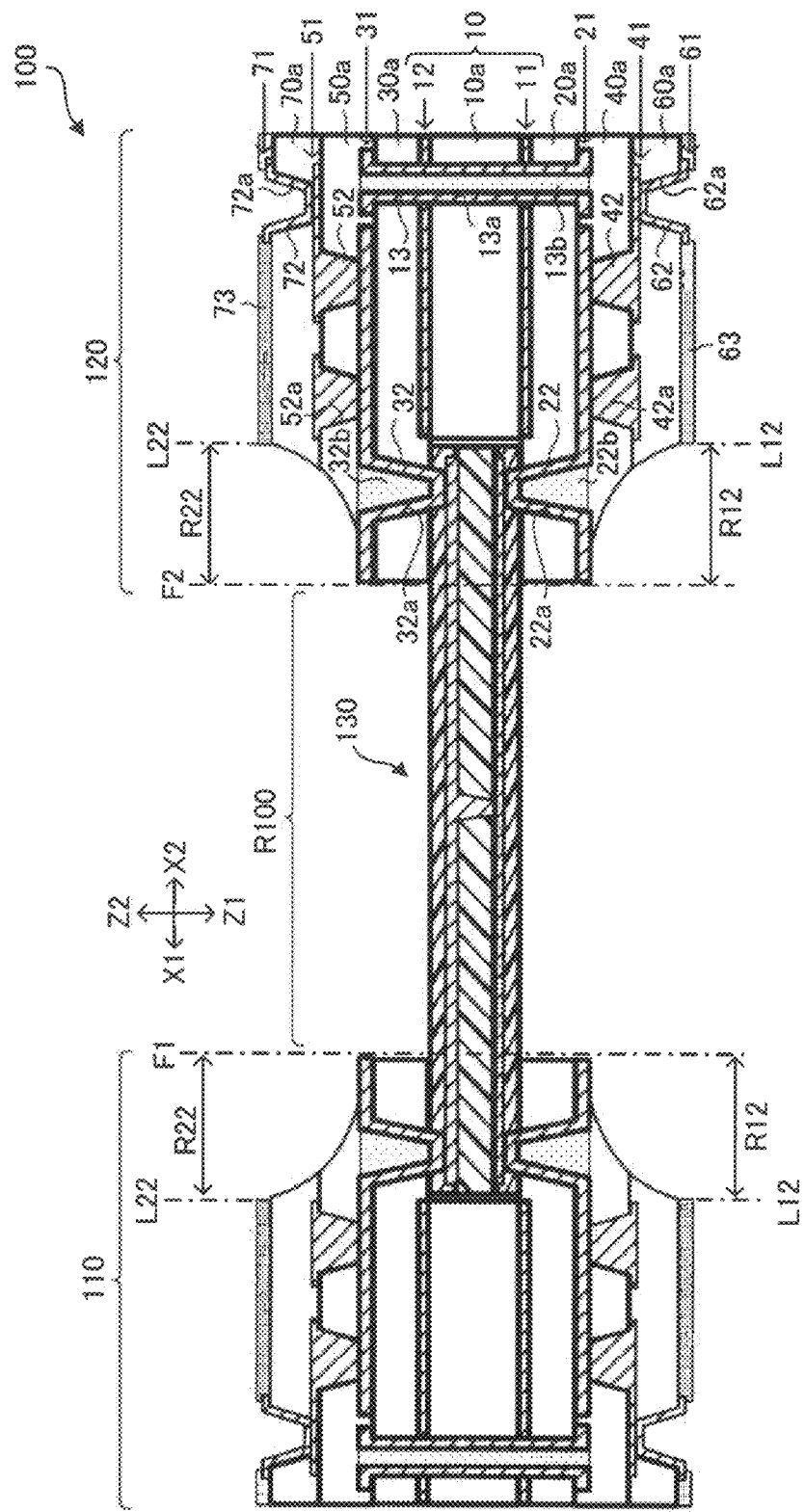
FIG. 34 is a view showing a first structure of insulation layers which become thinner continuously as they come closer to the flexible section.
Figure 35:
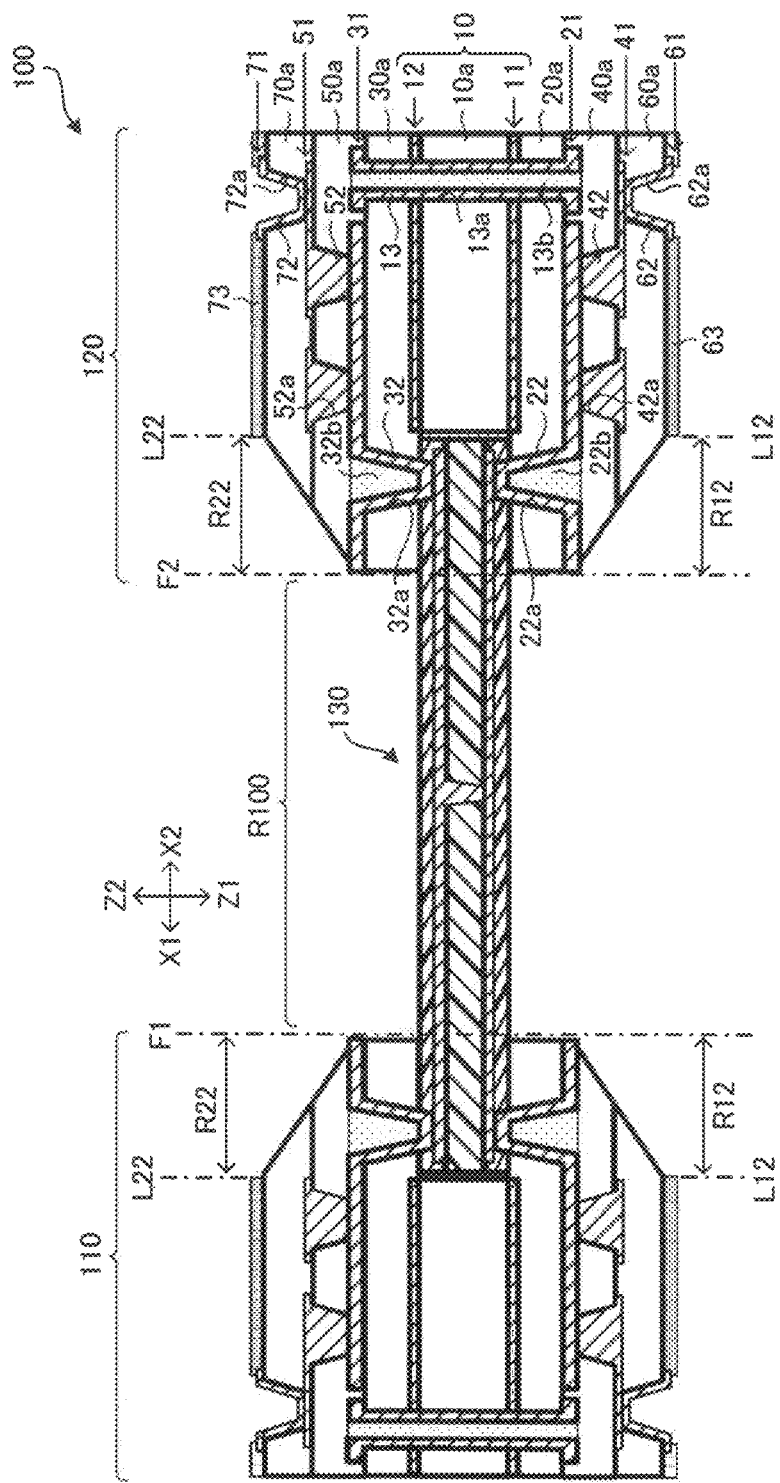
FIG. 35 is a view showing a second structure of insulation layers which become thinner continuously as they come closer to the flexible section.

As shown in FIGS. 33-35, insulation layers (20a, 40a, 60a) on the first-surface side and insulation layers (30a, 50a, 70a) on the second-surface side may have a portion which becomes thinner as they come closer to flexible section (R100). By employing such a structure, it is thought that both end portions of flexible wiring board 130 will be sandwiched and held more firmly.

In examples shown in FIGS. 33-35, the number of layers is increased from that in flex-rigid wiring board 100 according to each embodiment described above. Namely, insulation layer (60a) is laminated on the first-surface side of insulation layer (40a), and insulation layer (70a) is formed on the second-surface side of insulation layer (50a). Wiring layer 61 is formed on insulation layer (60a), and wiring layer 71 is formed on insulation layer (70a). Moreover, solder-resist layer 63 is formed on insulation layer (60a), and solder-resist layer 73 is formed on insulation layer (70a). In addition, hole (62a) is formed in insulation layer (60a), and hole (72a) is formed in insulation layer (70a). On wall surfaces of holes (62a, 72a), connection conductors (62, 72) made of copper plating, for example, are formed respectively.

In an example shown in FIG. 33, on the flexible section (R100) side, in range (R12) located between position (L12) at an end of the first-surface-side outermost insulation layer (insulation layer 60a) in rigid section 110 or 120 and F-R boundary surface (F1) or (F2), first-surface-side insulation layers (20a, 40a, 60a) become thinner in steps as they come closer to flexible section (R100). Here, an end of insulation layer (60a) on the flexible section (R100) side is located at position (L12); an end of insulation layer (40a) on the flexible section (R100) side is located in the middle between position (L12) and F-R boundary surface (F1) or (F2); and an end of insulation layer (20a) on the flexible section (R100) side corresponds to F-R boundary surface (F1) or (F2). Such a structure also applies to insulation layers (30a, 50a, 70a) on the second-surface side. However, in that situation, position (L22) replaces position (L12), and range (R22) replaces range (R12) as shown in FIG. 33.

By contrast, in examples shown in FIGS. 34 and 35, on the flexible section (R100) side, in range (R12) located between position (L12) at an end of the first-surface-side outermost insulation layer (insulation layer 60a) in rigid section 110 or 120 and F-R boundary surface (F1) or (F2), first-surface-side insulation layers (20a, 40a, 60a) become continuously thinner as they come closer to flexible section (R100).

In an example shown in FIG. 34, on the flexible section (R100) side, end surfaces of first-surface-side insulation layers (20a, 40a, 60a) are curved surfaces that continue through such insulation layers (20a, 40a, 60a). Also, the same applies to insulation layers (30a, 50a, 70a) on the second-surface side.

In an example shown in FIG. 35, on the flexible section (R100) side, end surfaces of first-surface-side insulation layers (20a, 40a, 60a) are inclined surfaces that continue through such insulation layers (20a, 40a, 60a). Also, the same applies to insulation layers (30a, 50a, 70a) on the second-surface side.

Structures shown in FIGS. 33-35 may be formed, for example, by shifting insulation layers when arranging them from a lower layer toward an upper layer, by etching or by shaving insulation layers using a laser or the like when forming cut lines (4011-4014) (FIG. 21), and so forth.

Figure 36:
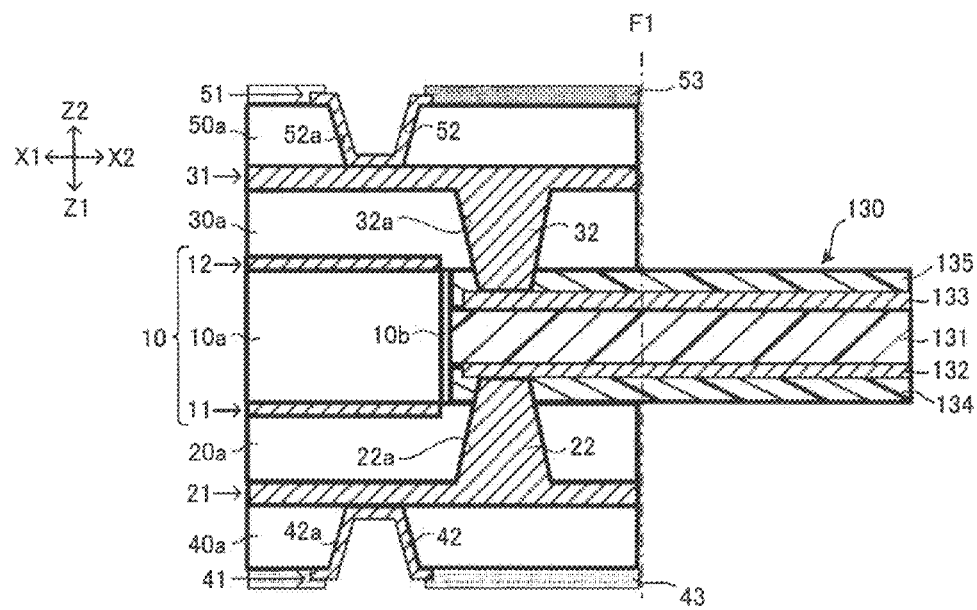
FIG. 36 is a view showing an example where connection conductors in a core section are made to be filled conductors.

Connection conductors (22, 32) to electrically connect conductive patterns in flexible wiring board 130 (wiring layers 132, 133) and conductive patterns in rigid section 110 or 120 (wiring layers 21, 31) are not limited to conformal conductors, and they may be filled conductors as shown in FIG. 36. When connection conductors (22, 32) are filled conductors, it is thought that conductive patterns in flexible wiring board 130 (wiring layers 132, 133) and conductive patterns in rigid section 110 or 120 (wiring layers 21, 31) will be connected more firmly.

Figure 37:
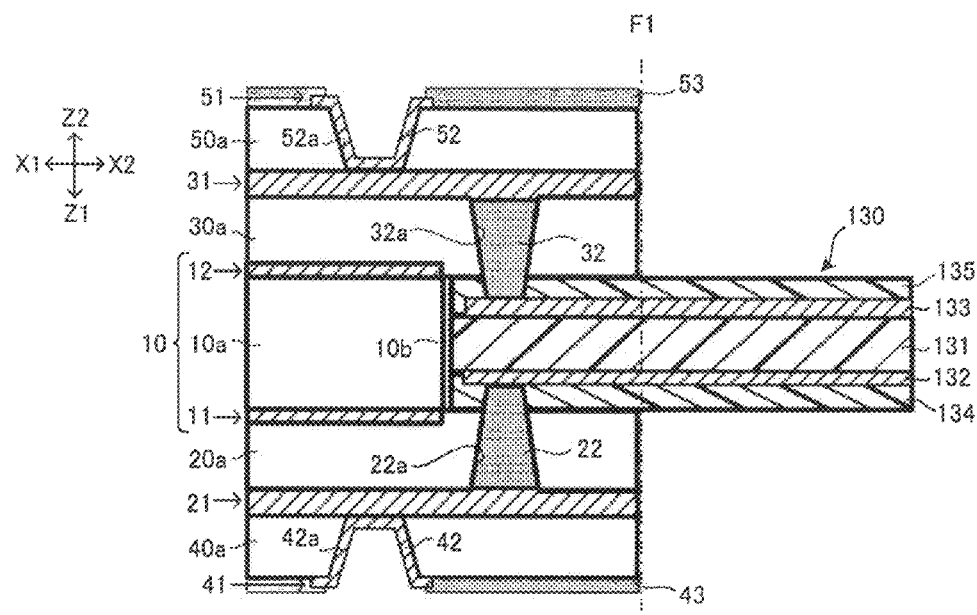
FIG. 37 is a view showing an example where connection conductors in a core section are made of conductive paste.

Connection conductors (22, 32) to electrically connect conductive patterns in flexible wiring board 130 (wiring layers 132, 133) and conductive patterns in rigid section 110 or 120 (wiring layers 21, 31) may be formed using conductive paste as shown in FIG. 37. Connection conductors (22, 32) may be filled conductors or conformal conductors. Also, as shown in FIG. 37, wiring layer 21 or 31 and connection conductor 22 or 32 may be formed using different materials from each other.

Figure 38A:
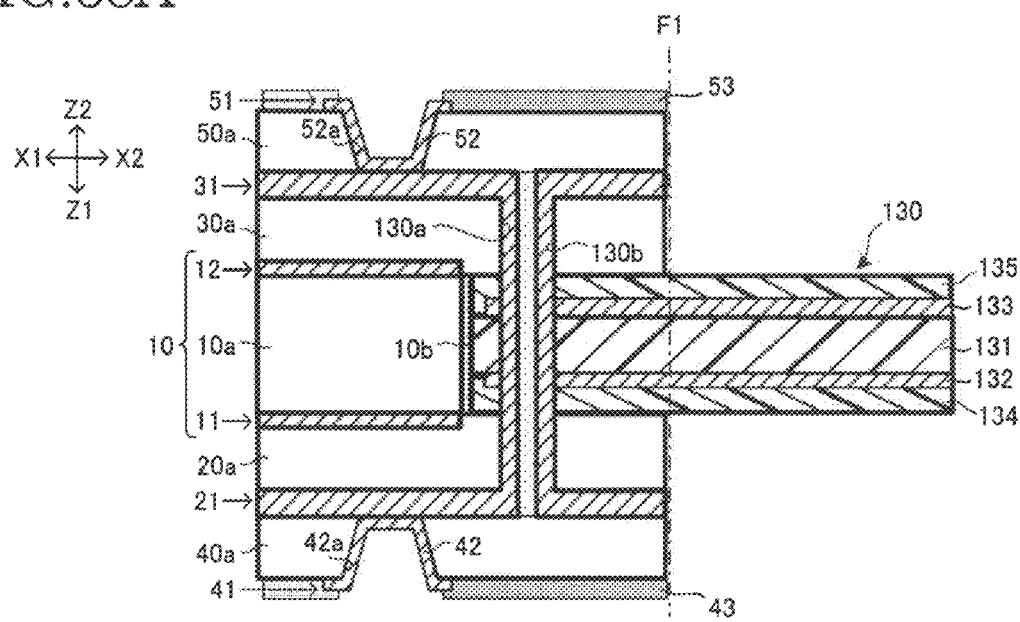
FIG. 38A is a view showing a first example where a connection conductor in a core section is the conductor in a through hole.
Figure 38B:
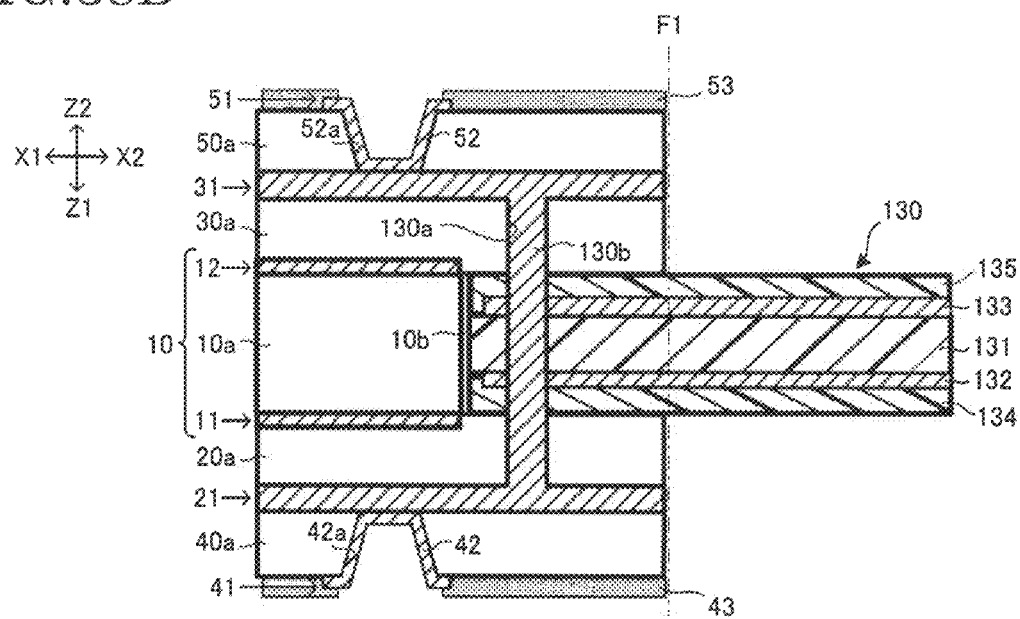
FIG. 38B is a view showing a second example where a connection conductor in a core section is the conductor in a through hole.

As shown in FIGS. 38A, 38B), conductive patterns in flexible wiring board 130 (wiring layers 132, 133) and conductive patterns in rigid section 110 or 120 (wiring layers 21, 31) may be electrically connected to each other by conductor (130b) (conformal conductor or filled conductor) in through hole (130a) which penetrates through insulation layer (30a), flexible wiring board 130 and insulation layer (20a). In such examples, side surfaces of wiring layers (132, 133) are exposed, and wiring layers (21, 31, 132, 133) are electrically connected by conductor (130b). If such a connection method is employed, since holes in multiple layers may be formed all at once, manufacturing flex-rigid wiring board 100 becomes easier compared with situations in which holes are formed separately in each layer. Through hole (130a) may also penetrate through rigid section 110 or 120.

Figure 39:
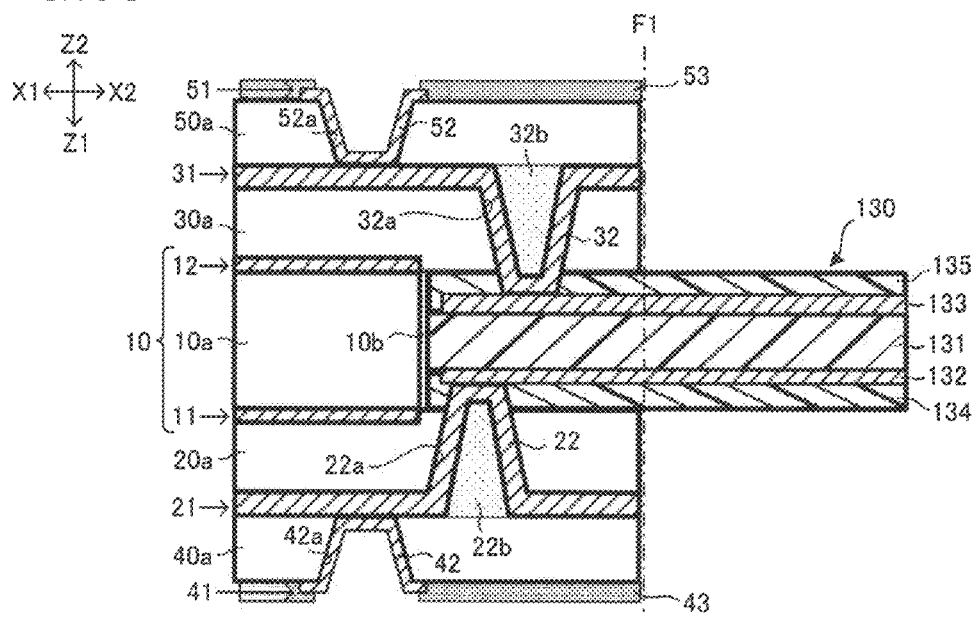
FIG. 39 is a view showing an example where connection conductors in a core section are positioned not to face each other.

As shown in FIG. 39, connection conductor 22 and connection conductor 32 may be positioned away from axis Z (shifted in direction X or direction Y, for example).

Figure 40:
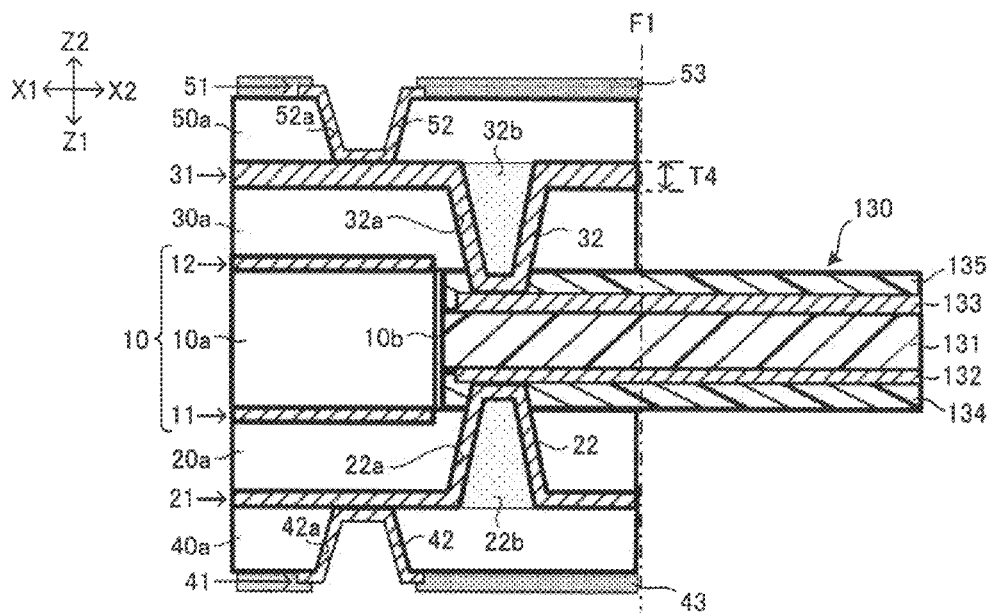
FIG. 40 is a view showing an example where a conductor only on one side of the insulation layer is made thicker.

It is not required that the conductors (wiring layers 21, 31) on insulation layers (20a, 30a) positioned on boundary portion (RO) be made thicker in all F-R connection sections. For example, as shown in FIG. 40, it is acceptable if the conductor (wiring layer 31) on insulation layer (30a) is made thicker only on the second-surface side. However, if the conductors on insulation layers (20a, 30a) on both sides are made thicker, effects to enhance connection reliability or the like in the F-R connection sections increase.

Figure 41:
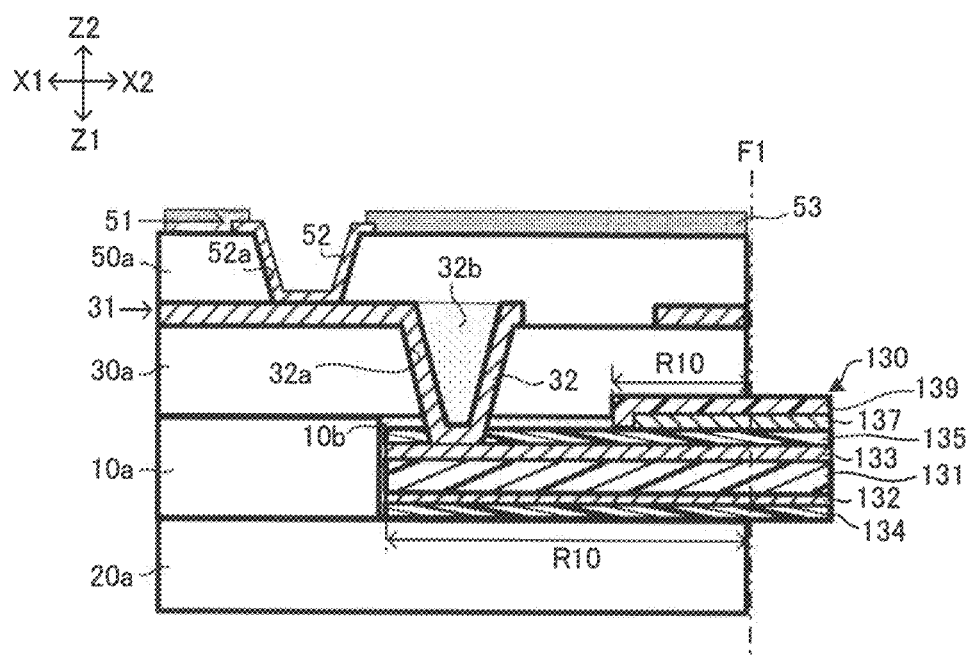
FIG. 41 is a view showing an example where a wiring layer on one side of the flexible wiring board is electrically connected to a conductive pattern in a rigid section.

As shown in FIG. 41, only one surface of flexible wiring board 130 (either wiring layer 132 or 133) may be electrically connected to a conductive pattern (wiring layer 21 or 31) of rigid sections (110, 120). In an example in FIG. 41, only wiring layer 31 is connected to wiring layer 133 by connection conductor 132.

Figure 42A:
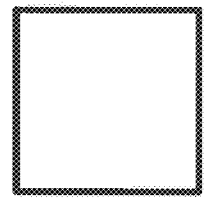

The shape of horizontal cross sections (X-Y plane) of connection conductors and their holes is not limited to a circle (completely round circle), and any other shape may be employed. The shape of such cross sections may be a square as shown in FIG. 42A, for example, or may be any other regular polygon, such as a regular hexagon or a regular octagon. The shape of angles in such polygons is not limited to any type, and may be a right angle, an acute angle, or an obtuse angle, or may even be roundish, for example. However, to prevent thermal stress from being concentrated, it is preferred that angles be roundish.

Also, the shape of the above horizontal cross sections may be oval, rectangular, triangular or the like.

The above circles, ovals and regular polygons have advantages since their shapes tend to be similar to the shape of the holes.

Figure 42B:
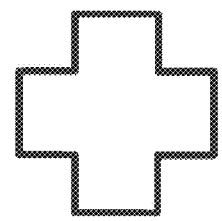
Figure 42C:
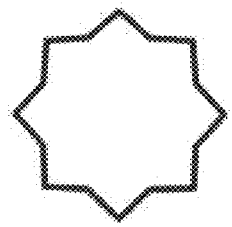

Alternatively, as shown in FIG. 42B or 42C, shapes such as a cross or a regular polygonal star formed by drawing straight lines to radiate out from the center (shapes in which multiple spokes are positioned in a radial pattern) may be effective as the shape of the above horizontal cross sections.

Figure 43A:
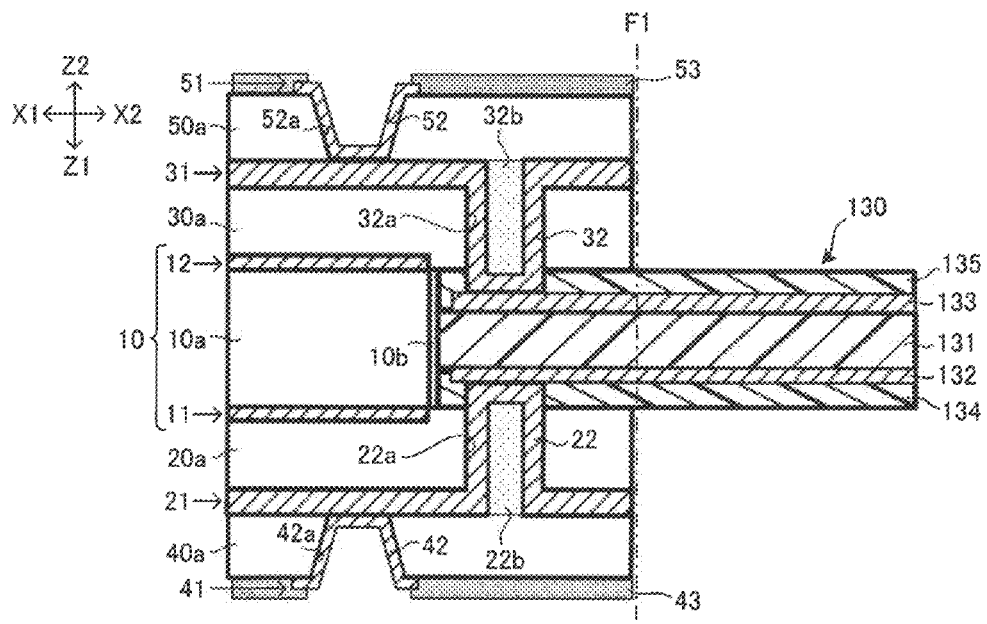
FIG. 43A is a view showing a first alternative example of a vertical cross-sectional shape of connection conductors in a core section.
Figure 43B:
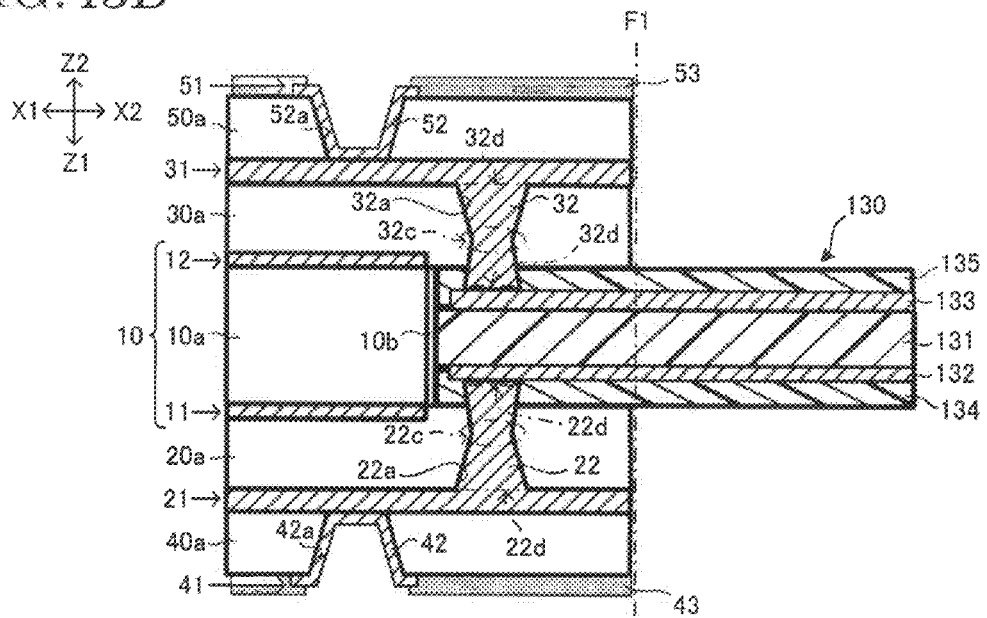
FIG. 43B is a view showing a second alternative example of a vertical cross-sectional shape of connection conductors in a core section.

The shape of vertical cross sections of connection conductors may be formed freely. For example, as shown in FIG. 43A, holes (22a, 32a) in which connection conductors (22, 32) are formed may be formed to be cylindrical. Alternatively, as shown in FIG. 43B, connection conductors (22, 32) may be formed in such a way that the width in middle portions (22c, 32c), which are positioned at substantially the middle in a thickness direction, is smaller than the width in opening portions (22d, 32d) on the first surface and the second surface. If holes are formed as such, since the width in opening portions (22d, 32d) is greater than the width in middle portions (22c, 32c), better performance may be expected when the holes are filled by plating. As a result, surface flatness features are enhanced. Also, connection conductors (22, 32) have the smallest cross sections in middle portions (22c, 32c). Accordingly, connection areas between insulation layers (20a, 30a) and connection conductors (22, 32) increases. In addition, stress will be concentrated in portions on connected conductors (22, 32) away from wiring layers (21, 31). Accordingly, it is thought that stress from side directions (directions X or directions Y) will be dispersed and that connection conductors (22, 32) will be suppressed from peeling caused by concentrated stress. In addition, as a result, connection reliability increases.

Figure 44:
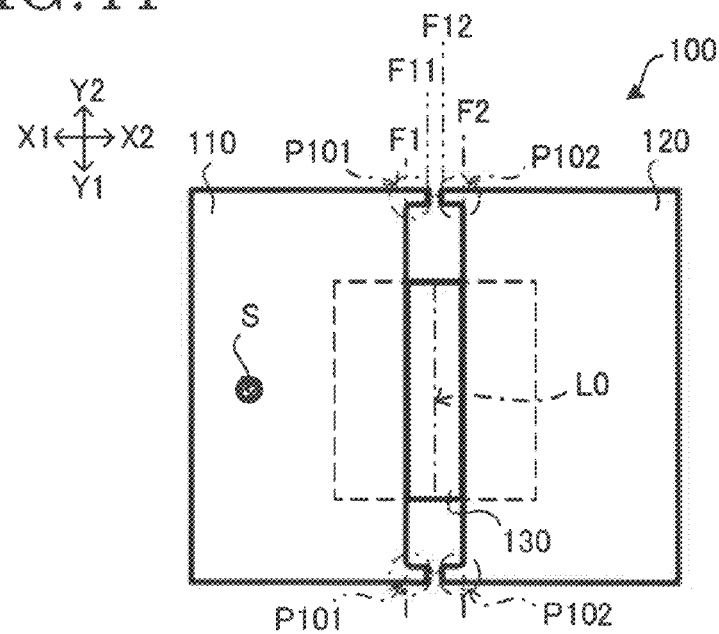
FIG. 44 is a view showing an example where rigid sections have protruding portions that protrude from the boundary surface with the flexible section.

As shown in FIG. 44, rigid sections (110, 120) may have protruding portions (P101, P102) which protrude from F-R boundary surfaces (F1, F2) between flexible section (R100) and the rigid sections. In an example shown in FIG. 44, rigid section 110 has two protruding portions (P101), and rigid section 120 has two protruding portions (P102). Protruding portions (P101) are positioned on the Y1 side and Y2 side of flexible wiring board 130, and protrude toward the X2 side from F-R boundary surface (F1) between rigid section 110 and flexible section (R100). On the other hand, protruding portions (P102) are positioned on the Y1 side and Y2 side of flexible wiring board 130, and protrude toward the X1 side from F-R boundary surface (F2) between rigid section 120 and flexible section (R100). The planar shape of protruding portions (P101, P102) (the shape on the X-Y plane) is rectangular, for example. It is thought that excessive stress may be suppressed from occurring in the F-R connection sections by forming such protruding portions (P101, P102). Descriptions of such an effect are provided in the following with reference to FIG. 45.

Flex-rigid wiring board 100 may be folded in two at line (L0) in FIG. 44, for example, and accommodated in casing 5001 of a cell phone or the like. When being folded in two, curved portion (P103) will be formed near line (L0) of flexible wiring board 130. In such a case, flex-rigid wiring board 100 may be pressed against casing 5001 due to vibrations or swinging.

Figure 45:
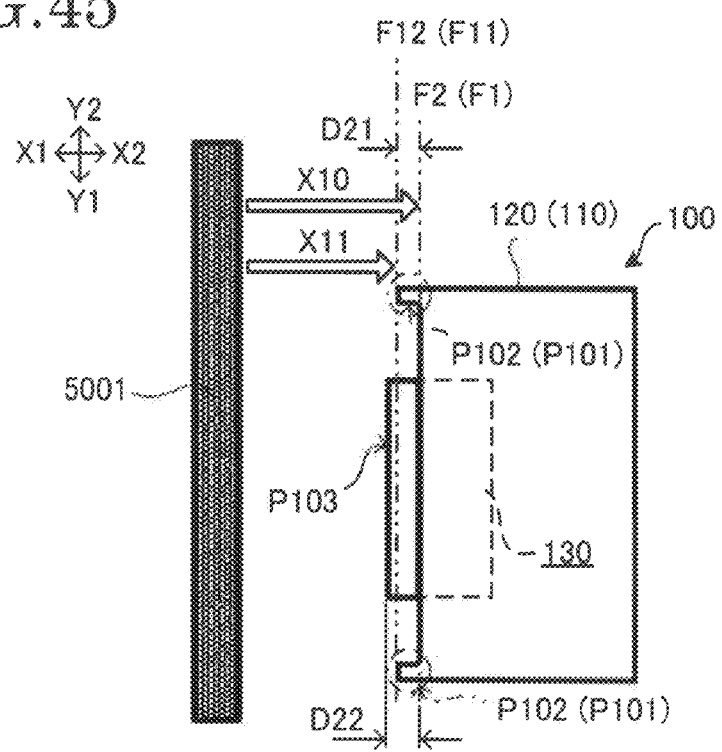
FIG. 45 is a view to illustrate the effects of the protruding portions shown in FIG. 44.

During such time, without protruding portions (P101, P102), casing 5001 may move freely until it touches F-R boundary surface (F1) or (F2) as indicated by arrow (X10) in FIG. 45. In such a situation, if force toward the X2 side is exerted on casing 5001 due to vibrations or the like, it is thought that curved portion (P103) of flexible wiring board 130 will be pushed into the X2 side by casing 5001. Moreover, if curved portion (P103) of flexible wiring board 130 is further pushed closer to F-R boundary surface (F1) or (F2), great force will be generated at the F-R connection sections, and line breakage or the like will become a concern.

By contrast, with protruding portions (P101, P102), as indicated by arrow (X11) in FIG. 45, the movement of casing 5001 will be restricted by top surfaces (F11) of protruding portions (P101) or top surfaces (F12) of protruding portions (P102). Therefore, casing 5001 will not push curved portion (P103) of flexible wiring board 130 any further. Accordingly, stress will seldom be generated at the F-R connection sections. As a result, line breakage or the like will be suppressed from occurring at the F-R connection sections.

Figure 46:
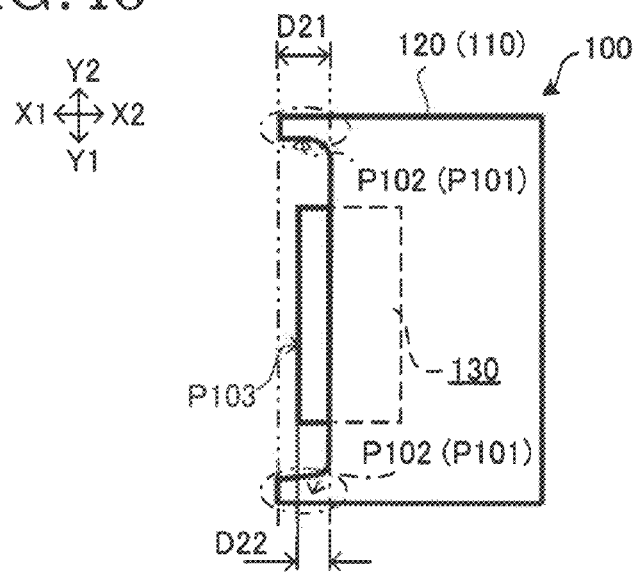
FIG. 46 is a view showing a first alternative example of the configuration of protruding portions.

The protruding amount (D21) of protruding portions (P101, P102) is approximately 1 mm, for example. The protruding amount (D22) of curved portion (P103) of flexible wiring board 130 is approximately 2-3 mm, for example. Namely, in such an example, (D22) is set greater than (D21) (D21<D22). However, the protruding amounts are not limited to such, and (D22) may be set smaller than (D21) (D22<D21) as shown in FIG. 46, for example. By so setting, it is difficult for casing 5001 to even touch curved portion (P103) of flexible wiring board 130.

Figure 47A:
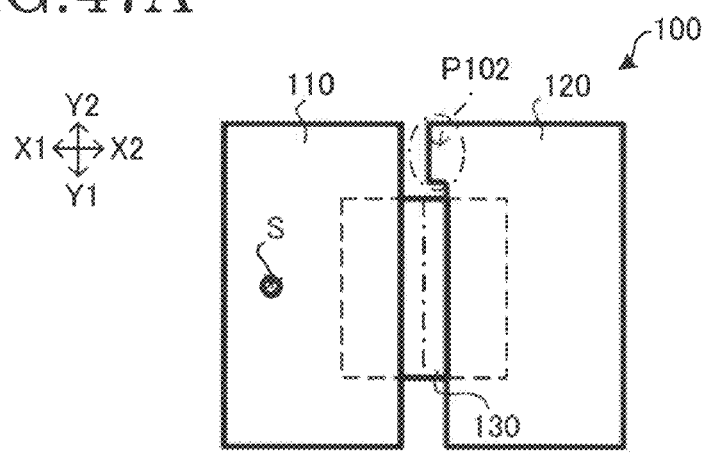
FIG. 47A is a view showing a second alternative example of the configuration of a protruding portion.
Figure 47B:
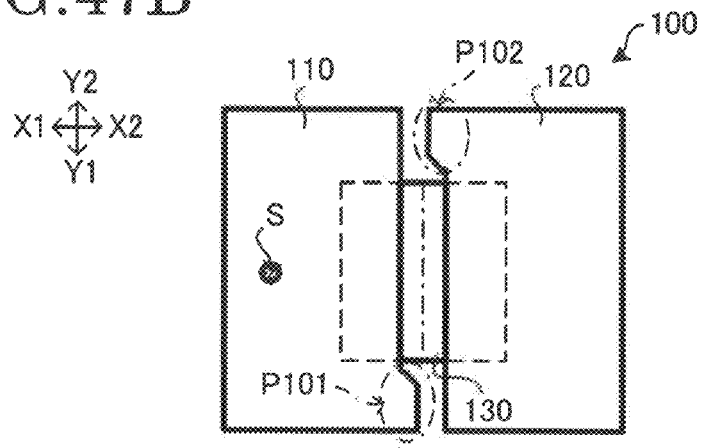
FIG. 47B is a view showing a third alternative example of the configuration of protruding portions.

The number, shape, position and so forth of protruding portions (P101, P102) are not limited specifically. For example, as shown in FIG. 47A, one protruding portion (P102) may be formed in either rigid section 110 or 120; for example, only in rigid section 120. Alternatively, as shown in FIG. 47B, for example, the planar shape of protruding portions (P101, P102) may be trapezoidal. As in the example shown in FIG. 47B, protruding portion (P101) may be formed on the Y1 side of flexible wiring board 130, and protruding portion (P102) may be formed on the Y2 side of flexible wiring board 130.

Figure 48A:
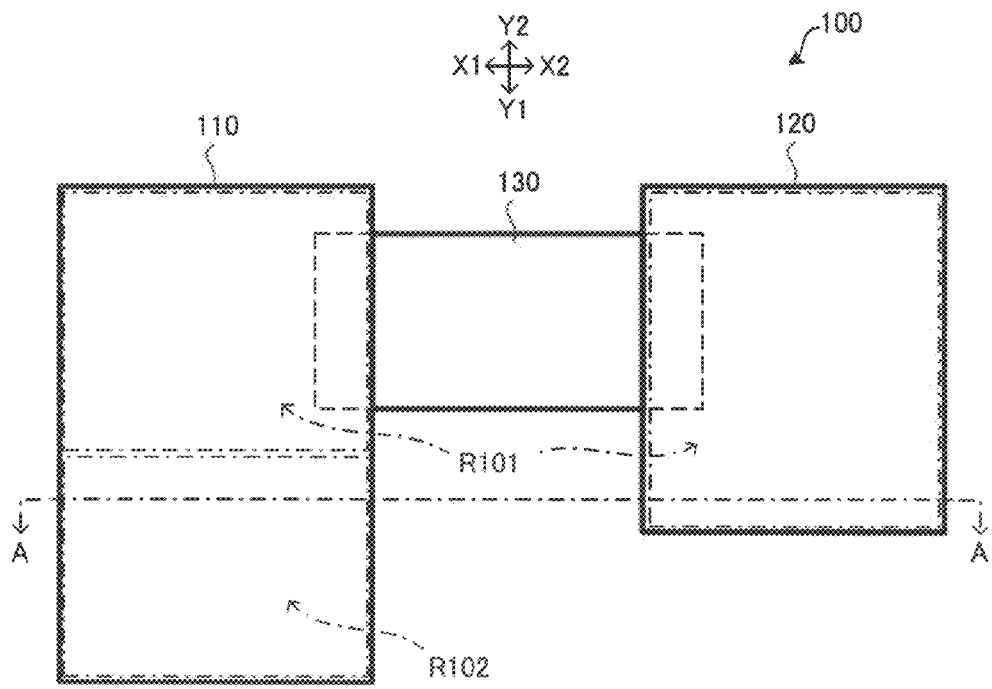
FIG. 48A is a view showing an example where a rigid section has multiple regions having a different number of layers from each other.
Figure 48B:
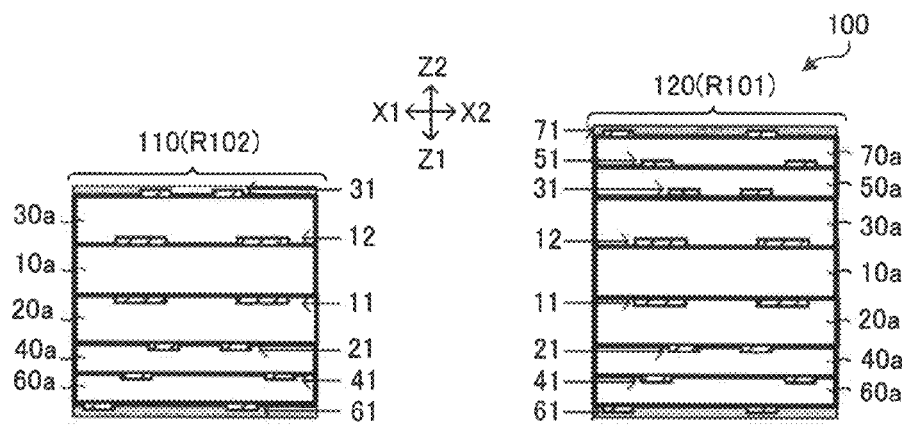
FIG. 48B is a cross-sectional view seen from the A-A line in FIG. 48A.

Rigid section 110 or 120 may contain multiple regions having a different number of layers from each other. For example, as shown in FIG. 48A and FIG. 48B (cross-sectional view seen from the (A-A) line in FIG. 48A), rigid section 110 may have nine-layered region (R101) and six-layered region (R102). Region (R102) having fewer layers than region (R101) may be formed by masking or the like so that more than a predetermined number of layers will not be laminated. However, forming methods are not limited to the above, and the number of layers may be adjusted by removing the unnecessary layers after they are laminated.

Figure 49A:
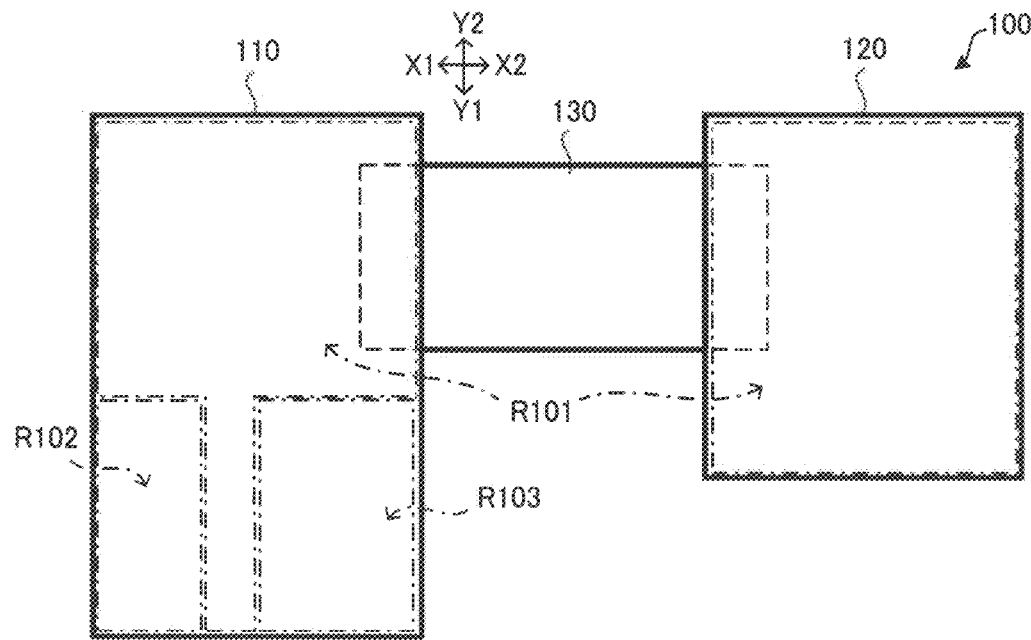
FIG. 49A is a view showing an example where a rigid section has three regions having a different number of layers from each other.

At least either rigid section 110 or 120 may contain three or more regions having a different number of layers from each other. For example, as shown in FIG. 49A, rigid section 110 may contain three regions (R101-R103) having a different number of layers from each other.

Figure 49B:
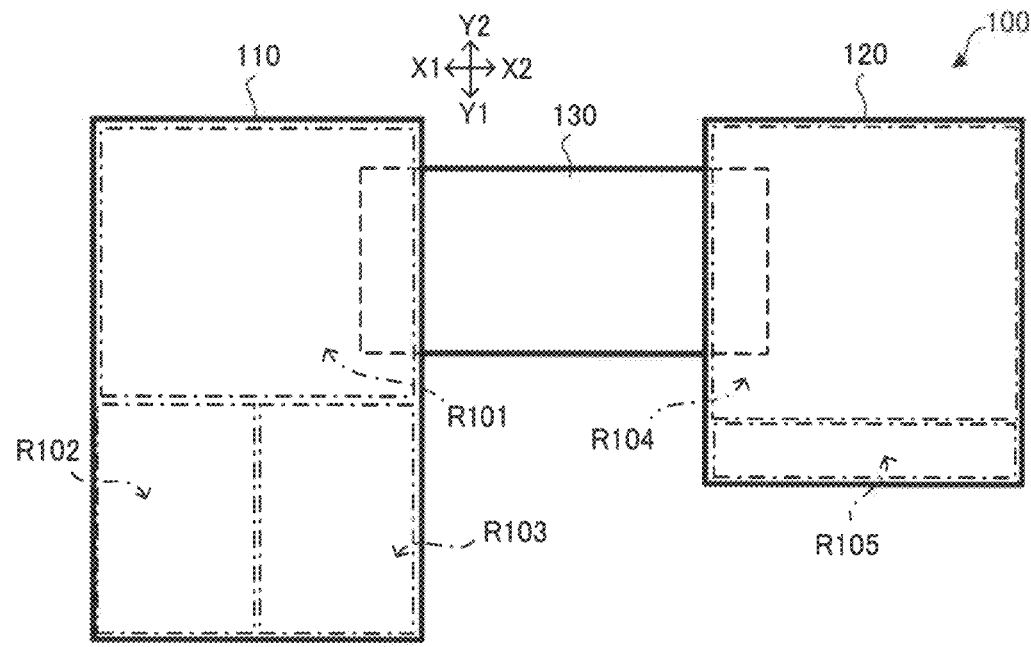
FIG. 49B is a view showing an example where two rigid sections each have multiple regions having a different number of layers from each other.

Both rigid sections 110 and 120 may contain multiple regions having a different number of layers from each other. For example, as shown in FIG. 49B, rigid section 110 may contain three regions (R101-R103) having a different number of layers from each other, and rigid section 120 may contain two regions (R104, R105) having a different number of layers from each other.

In FIGS. 48A-49B, regions (R101-R105) each have a different number of layers from the other regions. If regions (R101-R105) are listed in order of the region with the most layers to the region with the fewest layers, the order is, for example, region (R101), region (R102), region (R103), region (R104) and region (R105) (region (R101)>region (R102)>region (R103)>region (R104)>region (R105)).

The number of flexible wiring boards 130 is not limited specifically. For example, to enhance the bendability of flexible section (R100), it is effective if multiple flexible wiring boards are positioned so as to be detached from each other in lamination directions (directions Z) of insulation layers (10a, 20a, 30a), as shown in FIG. 50 or 51.

Figure 50:
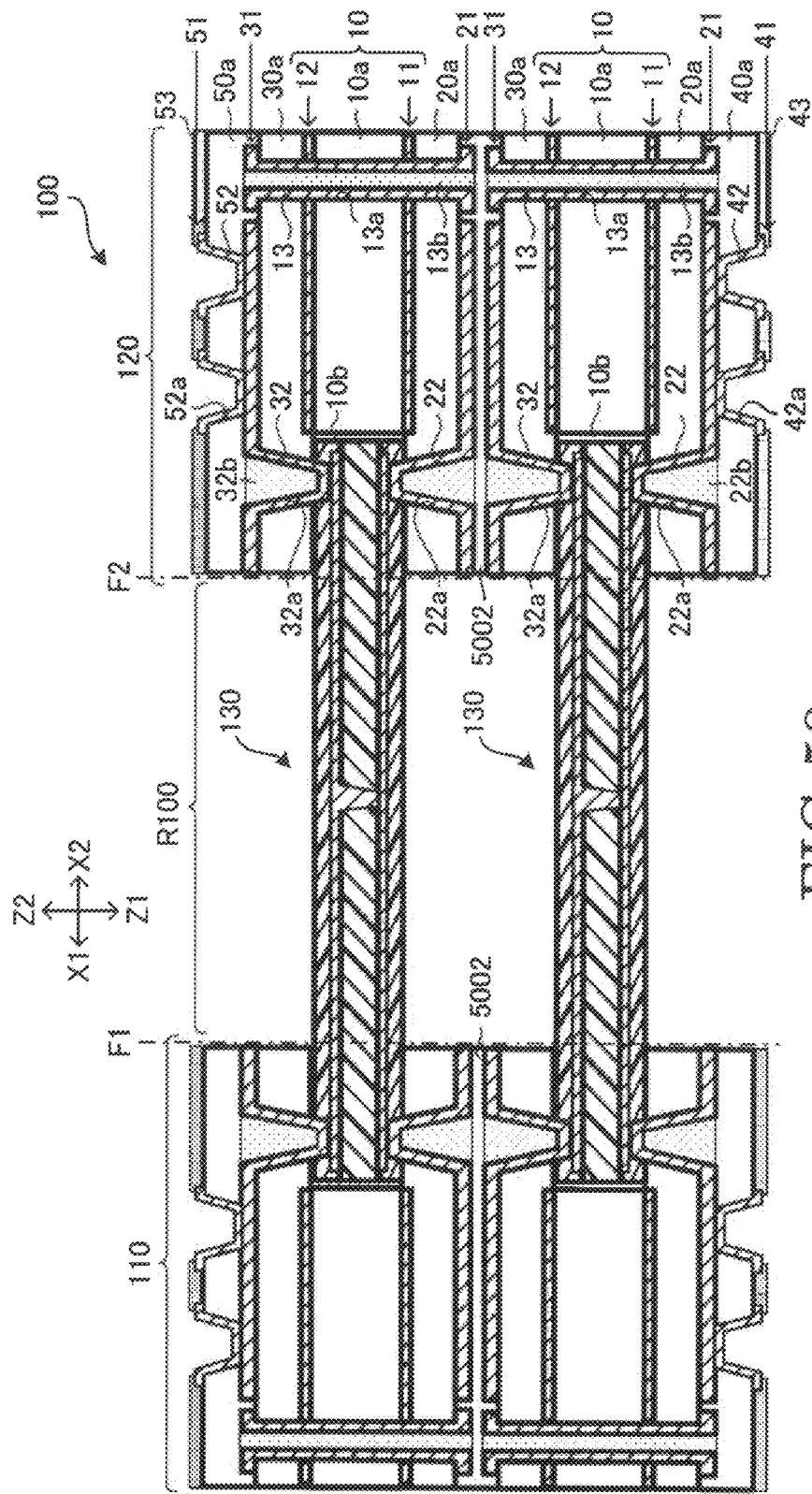
FIG. 50 is a view showing an example of a flex-rigid wiring board having two sets of core sections connected to flexible wiring boards.

In an example shown in FIG. 50, flex-rigid wiring board 100 has two sets of core sections (substrate 10 and insulation layers (20a, 30a) and the like positioned on both of its sides) which are connected to flexible wiring boards 130. The two sets of core sections are connected by connection layers 5002. Then, multiple flexible wiring boards 130 are positioned so as to be detached from each other in lamination directions (directions Z). The material for connection layers 5002 is, for example, the same as the above-described interlayer insulation layers (such as insulation layer 40a). Connection layers 5002 are formed by curing prepreg, for example.

Figure 51:
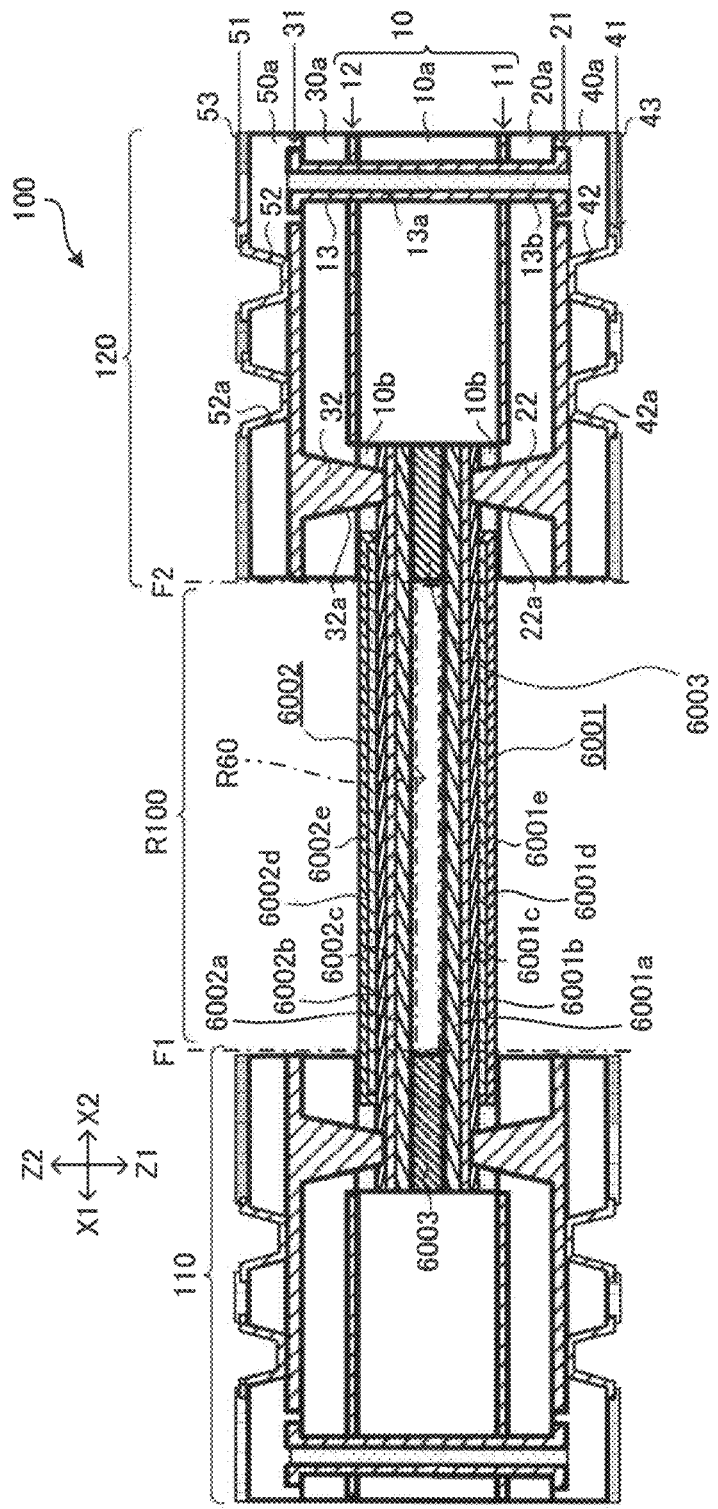
FIG. 51 is a view showing an example of a flex-rigid wiring board having two single-sided flexible wiring boards.

Alternatively, as shown in FIG. 51, for example, flex-rigid wiring board 100 may have two single-sided flexible wiring boards; flexible wiring board 6001 and flexible wiring board 6002. Flexible wiring board 6001 has flexible substrate (6001a), wiring layer (6001b), inner coverlay (6001c), shield layer (6001d) and outer coverlay (6001e). Shield layer (6001d) is formed over wiring layer (6001b). Accordingly, electromagnetic noise or the like is blocked from reaching wiring layer (6001b) by shield layer (6001d). Meanwhile, flexible wiring board 6002 has flexible substrate (6002a), wiring layer (6002b), inner coverlay (6002c), shield layer (6002d) and outer coverlay (6002e). Shield layer (6002d) is formed over wiring layer (6002b). Accordingly, electromagnetic noise or the like is blocked from reaching wiring layer (6002b) by shield layer (6002d). The material or the like for each member is the same as for flexible wiring board 130 as shown in FIG. 3, for example.

In an example shown in FIG. 51, flexible wiring board 6001 has wiring layer (6001b) on the first-surface side, and flexible wiring board 6002 has wiring layer (6002b) on the second-surface side. Then, the second-surface side of flexible wiring board 6001 and the first-surface side of flexible wiring board 6002 are physically connected by using bonding sheet 6003. Space (R60) sealed by bonding sheet 6003 is formed between flexible wiring board 6001 and flexible wiring board 6002. Space (R60) is formed to be a rectangular cuboid, for example. However, the shape, number, position and the like of space (R60) are not limited to the above and any other type may be employed (see later-described FIGS. 56A-56C).

Wiring layer 21 is electrically connected to a conductive pattern on the first-surface side of flexible wiring board 6001 (wiring layer 6001b) by connection conductor 22 in insulation layer (20a). Also, wiring layer 31 is electrically connected to a conductive pattern on the second-surface side of flexible wiring board 6002 (wiring layer 6002b) by connection conductor 32 in insulation layer (30a). Connection conductors (22, 32) are conductors which are filled in holes (22a, 32a) formed in insulation layers (20a, 30a), namely, filled conductors. When connection conductors (22, 32) are made filled conductors, it is thought that conductive patterns (wiring layers 6001b, 6002b) in flexible wiring boards (6001, 6002) will be connected more firmly with conductive patterns (wiring layers 21, 31) in rigid sections (110, 120).

A method for manufacturing flex-rigid wiring board 100 shown in FIG. 51 is described in the following. First, two examples are shown in regard to a method for connecting flexible wiring board 6001 and flexible wiring board 6002.

Figure 52A:
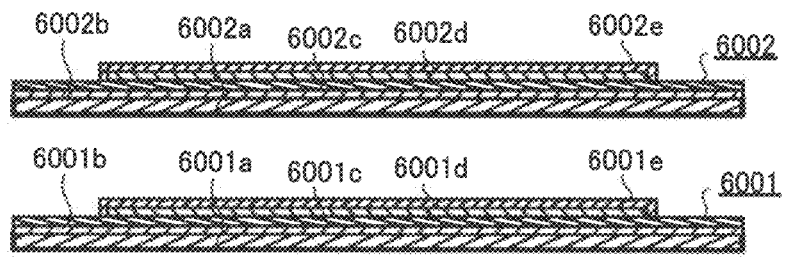
FIG. 52A is a view to illustrate a first step of a first method for connecting two single-sided flexible wiring boards.

In the first example, flexible wiring boards 6001 and 6002 are prepared as shown in FIG. 52A. A method for manufacturing such flexible wiring boards 6001 and 6002 is the same as that for flexible wiring board 130 according to the above second embodiment, for example.

Figure 52B:
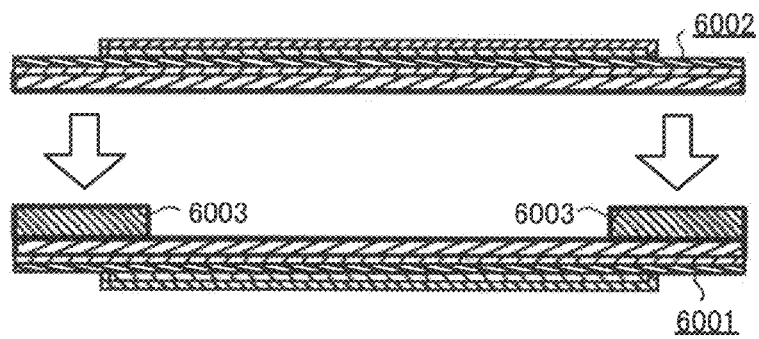
FIG. 52B is a view to illustrate a second step subsequent to the step shown in FIG. 52A.

Next, as shown in FIG. 52B, flexible wiring board 6001 and flexible wiring board 6002 are connected by using bonding sheet 6003. In bonding sheet 6003, a hole corresponding to the shape of space (R60) is formed in advance.

Figure 53A:
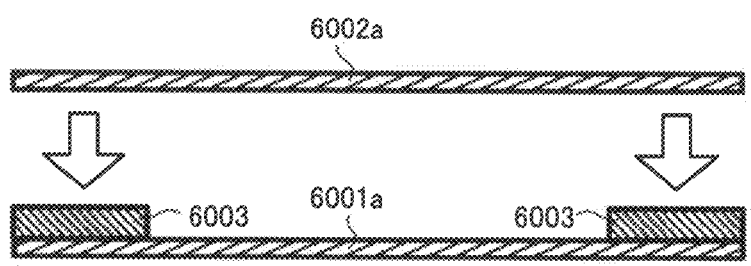
FIG. 53A is a view to illustrate a first step of a second method for connecting two single-sided flexible wiring boards.
Figure 53B:
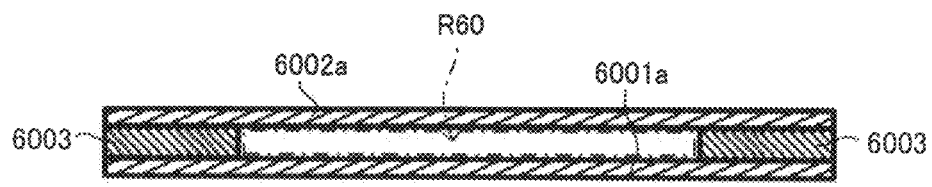
FIG. 53B is a view to illustrate a second step subsequent to the step shown in FIG. 53A.

On the other hand, in the second example, flexible substrates (6001a, 6002a) and bonding sheet 6003 are prepared as shown in FIG. 53A, and flexible substrate (6001a) and flexible substrate (6002a) are connected by using bonding sheet 6003 as shown in FIG. 53B. Then, flexible wiring boards 6001 and 6002 are manufactured by the same method as in flexible wiring board 130 according to the above second embodiment, for example.

Figure 54A:
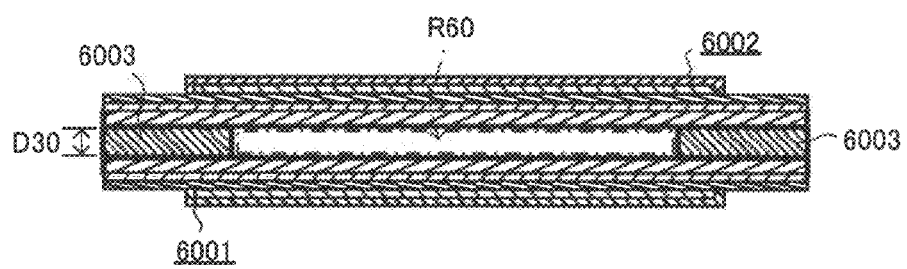
FIG. 54A is a view showing an example of a connected body of two single-sided flexible wiring boards.

A connected body of flexible wiring board 6001 and flexible wiring board 6002 may be manufactured as shown in FIG. 54A by employing either the above first example or the second example. Then, steps that correspond to those shown in FIGS. 11-22, for example, are conducted. In doing so, at both end portions of flexible wiring boards (6001, 6002), connection conductor 14 is connected to wiring layer (6001b), and connection conductor 34 is connected to wiring layer (6002b). Also, built-up sections, flexible section (R100) and the like are formed. As a result, flex-rigid wiring board 100 is completed as shown in FIG. 51.

It is thought that the bendability of flexible section (R100) will be improved by positioning space (R60) between flexible wiring board 6001 and flexible wiring board 6002. Moreover, flexible section (R100) in an example shown in FIG. 51 is structured with two single-sided wiring boards (flexible wiring boards 6001 and 6002). Thus, flexible section (R100) will be thinner than in an example in which double-sided wiring boards are connected. As a result, the bendability of flexible section (R100) is improved.

To improve bendability, height (D30) (FIG. 54A) of space (R60) is preferred to be set at 2 mm or less. Height (D30) of space (R60) corresponds to the thickness of bonding sheet 6003.

Figure 54B:
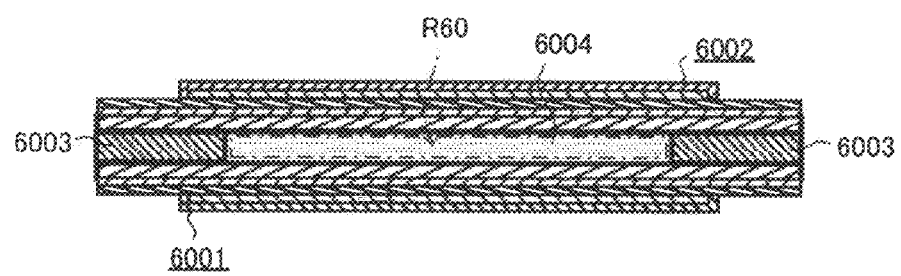
FIG. 54B is a view showing an example where filler is filled in the space arranged between two flexible wiring boards.

Gas such as air may be sealed in space (R60). However, when a heat cycle occurs during the manufacturing steps or the like, there is a concern that the quality of flex-rigid wiring board 100 may deteriorate due to the repeated expansion/contraction of the gas in space (R60). Therefore, it is preferred that the gas in space (R60) be eliminated through decompression, for example. Alternatively, as shown in FIG. 54B, by filling filler 6004 (such as gel) in space (R60), the gas in space (R60) may be eliminated.

Figure 55:
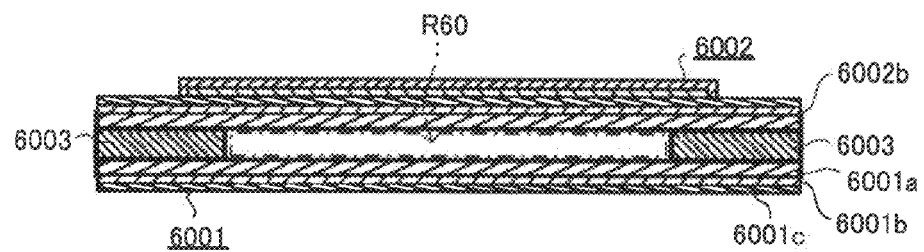
FIG. 55 is a view showing an example where the conductive pattern on one of the two flexible wiring boards is set to be a full plain conductive pattern.

A conductive pattern of either flexible wiring board 6001 or 6002, for example, wiring layer (6001b) of flexible wiring board 6001, may be formed as a full plain conductive pattern (such as a full plain copper pattern) as shown in FIG. 55, for example, and shield layer (6001d) and outer coverlay (6001e) may be omitted. In doing so, the flexible section will become even thinner, and the bendability of flexible section (R100) is further improved.

When a wiring pattern is formed only on one surface in a method shown in FIGS. (53A, 53B), conductive layers are formed on both surfaces and then the conductive layer that will become wiring layer (6001b) is masked entirely using resist, and the conductive layer that will become wiring layer (6002b) is patterned using a lithographic technique, for example. Accordingly, wiring layer (6002b) is formed as a wiring pattern and wiring layer (6001b) is formed as a full plain conductive pattern.

Figure 56A:
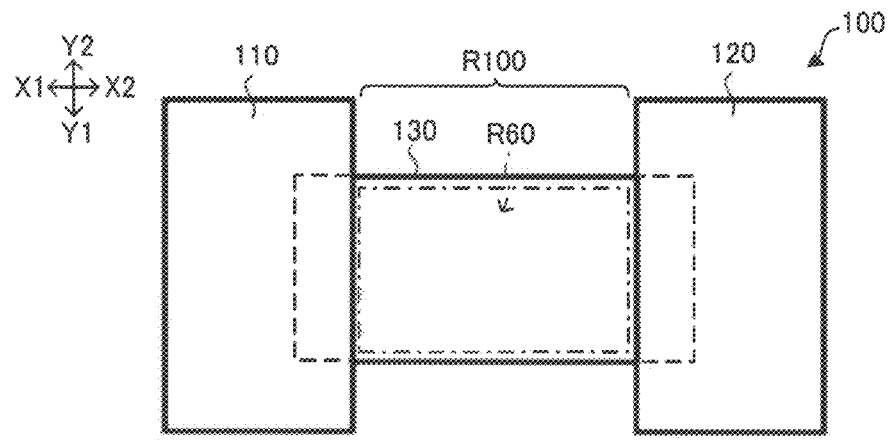
FIG. 56A is a view showing an example of the position of the space arranged between two flexible wiring boards.
Figure 56B:
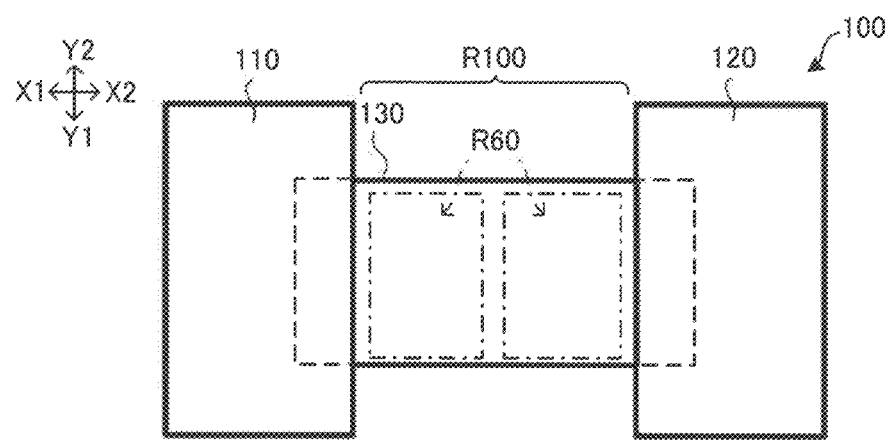
FIG. 56B is a view showing a first alternative example where the number of spaces arranged between two flexible wiring boards is modified.
Figure 56C:
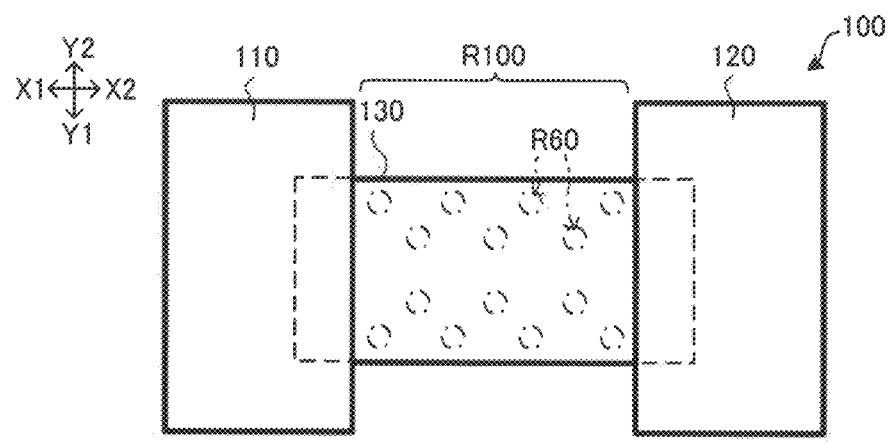
FIG. 56C is a view showing a second alternative example where the number of spaces arranged between two flexible wiring boards is modified.

It is preferred that space (R60) be positioned to extend entirely throughout flexible section (R100) as shown in FIG. 56A, for example. However, space (R60) is not limited to such, and may be positioned by being concentrated in required portions based on stress analysis or the like. The number of spaces (R60) is not limited to one, and multiple spaces may be formed. Namely, as shown in FIG. 56B, for example, two spaces (R60) may be formed, and as shown in FIG. 56C, for example, multiple spaces (R60) may also be formed. The shape of space (R60) is not limited to being a rectangular cuboid, and may be a cylinder as shown in FIG. 56C, for example. Basically, any shape, number, positioning and so forth may be employed for space (R60).

Figure 57:
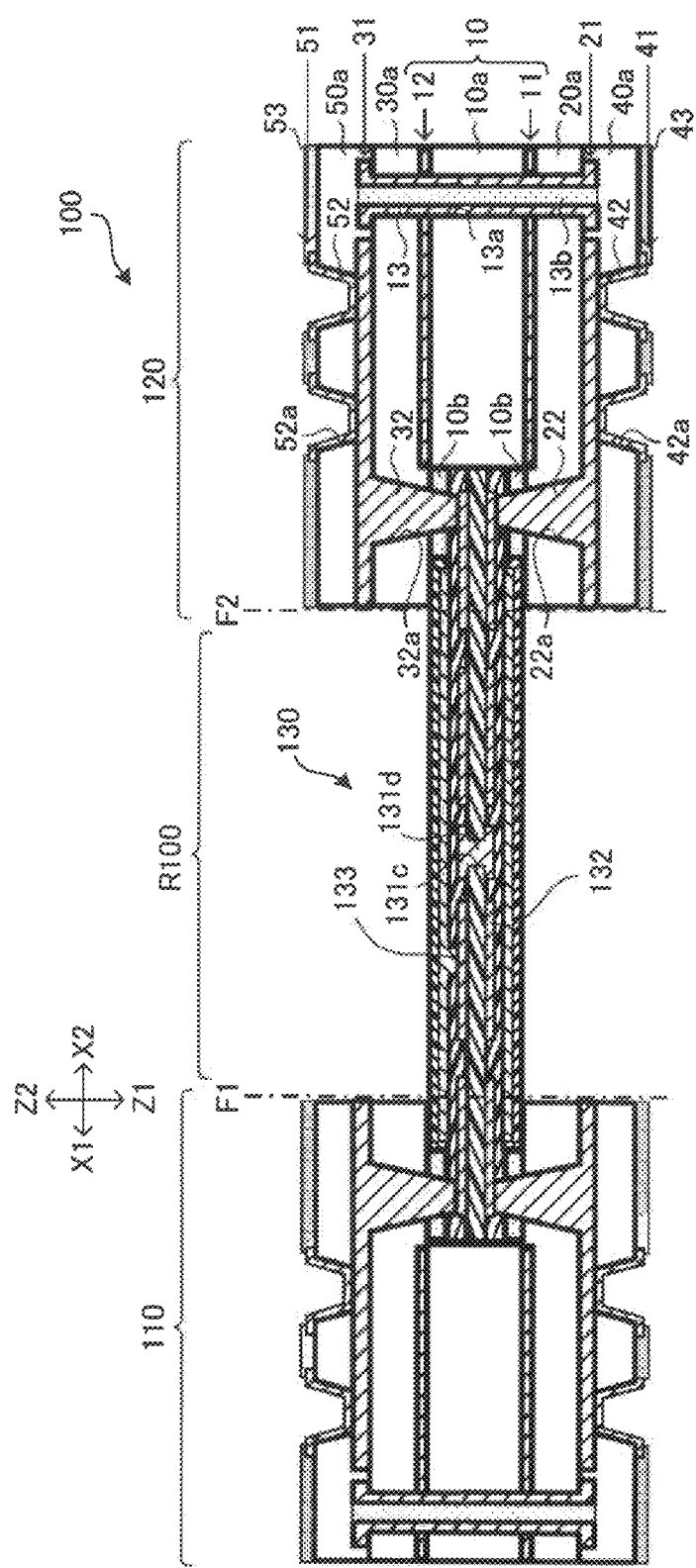
FIG. 57 is a view showing an example of a flex-rigid wiring board having a flexible wiring board where a through hole is formed in a flexible substrate.

As shown in FIG. 57, through hole (131c) may be formed in flexible substrate 131. Through hole (131c) penetrates through flexible substrate 131. Also, through hole (13a) is formed to penetrate through insulation layers (20a, 10a, 30a). The conductive pattern (wiring layer 21) formed on insulation layer (20a) and the conductive pattern (wiring layer 31) formed on insulation layer (30a) are connected by the conductor in through hole (13a) (connection conductor 13). By employing such a structure, wiring layer 21 and wiring layer 31 in rigid sections (110, 120) may be electrically connected without detouring through flexible wiring board 130.

Wiring layer 21 is electrically connected to wiring layer 132 by connection conductor 22 in insulation layer (20a). Connection conductor 22 is a conductor which is filled in hole (22a) formed in insulation layer (20a), namely, a filled conductor. Wiring layer 31 is electrically connected to wiring layer 133 (second conductor) by connection conductor 32 in insulation layer (30a). Connection conductor 32 is a conductor which is filled in hole (32a) formed in insulation layer (30a), namely, a filled conductor. When connection conductors (22, 32) are made filled conductors, it is thought that conductive patterns (wiring layers 132, 133) in flexible wiring board 130 and conductive patterns (wiring layers 21, 31) in rigid sections (110, 120) will be connected more firmly.

Figure 58A:
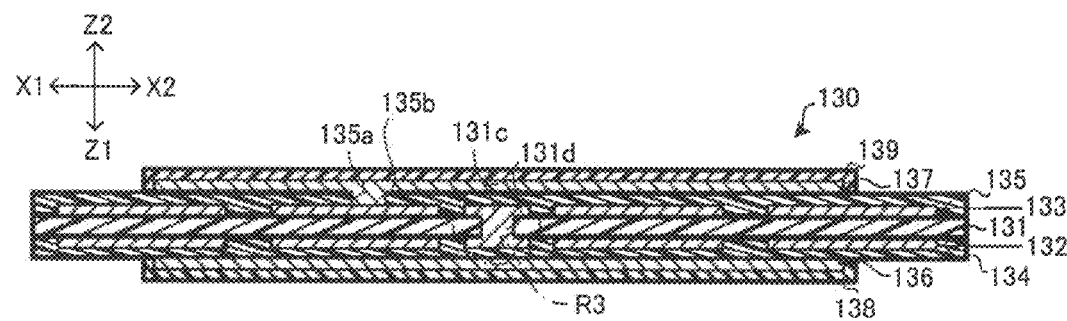
FIG. 58A is a magnified view showing the flexible wiring board of a flex-rigid wiring board shown in FIG. 57.

FIG. 58A is a magnified view of flexible wiring board 130. In addition, FIG. 58B shows magnified region (R3) shown in FIG. 58A.

Figure 58B:
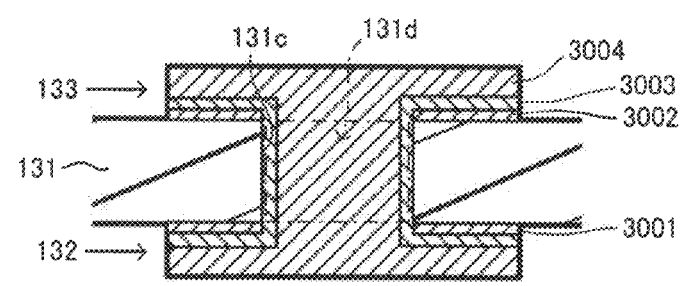
FIG. 58B is a magnified view showing part of a region shown in FIG. 58A.

In an example in FIG. 58B, conductor (131d) is filled in through hole (131c). A surface treatment such as black-oxide/ reduction or the like is conducted on the wall surface of through hole (131c). It is thought that the connection area will increase between through hole (131c) and conductor (131d) by such a surface treatment and that their connection reliability will improve. Wiring layer 132 (first conductor) formed on the first-surface side of flexible substrate 131 and wiring layer 133 (second conductor) formed on the second-surface side of flexible substrate 131 are electrically connected by the conductor (conductor 131d) in through hole (131c) formed in flexible substrate 131. In addition, the thickness of wiring layer 132 and the thickness of wiring layer 133 are set substantially the same.

On the first and second surfaces of flexible substrate 131, copper foil 3001 or 3002, electroless plating 3003 and electrolytic plating 3004 are respectively laminated from a lower layer toward an upper layer in that order. Accordingly, wiring layer 132 becomes a triple-layer conductive layer having copper foil 3001, electroless plating 3003 and electrolytic plating 3004. Also, wiring layer 133 becomes a triple-layer conductive layer having copper foil 3002, electroless plating 3003 and electrolytic plating 3004. If wiring layers are made to have a triple-layer structure as above, copper foils (3001, 3002) and flexible substrate 131 are adhered and then electroless plating 3003 and electrolytic plating 3004 are laminated on copper foils (3001, 3002). Accordingly, it is thought that flexible substrate 131 and wiring layers (132, 133) on both of its surfaces will be adhered firmly.

Conductor (131d) is formed with electroless plating 3003 and electrolytic plating 3004. Flexible substrate 131 is made of polyimide, for example. Wiring layers (132, 133), electroless plating 3003 and electrolytic plating 3004 are made of copper, for example.

Wiring layer 132, conductor (131d) in through hole (131c) and wiring layer 133 are formed to be contiguous from the first-surface side of flexible substrate 131 toward the second-surface side. Wiring layer 132 and wiring layer 133 are connected by a junction conductor (131d). Accordingly, a cylinder (conductor 131d) which connects wiring layer 132 and wiring layer 133 is formed in flexible substrate 131. It is thought that wiring layers (132, 133) will be secured through the pinning effect of the cylinder and that stability will be enhanced in wiring layers (132, 133) formed on the upper and lower surfaces of flexible substrate 131. As a result, it is also thought that the positioning stability of the F-R connection sections will be improved, leading to enhanced connection reliability.

Figure 59A:
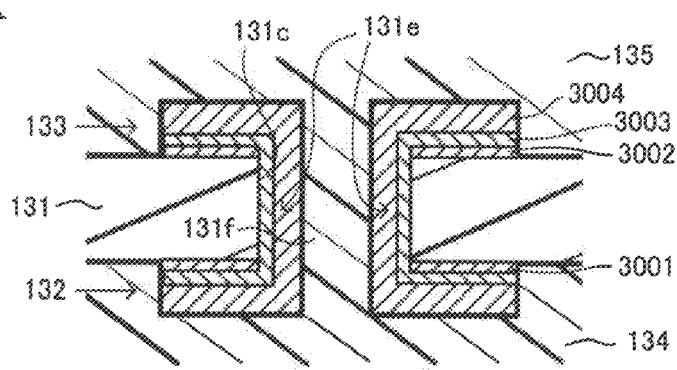
FIG. 59A is a view showing an example where the conductor in a through hole formed in a flexible substrate is a conformal conductor.

As shown in FIG. 59A, a conformal conductor (conductor 131e) may be used instead of a connection conductor (conductor 131d) to obtain the same structure as above. In an example in FIG. 59A, conductor (131e) is formed on the wall surface of through hole (131c). Conductor (131e) is formed with electroless plating 3003 and electrolytic plating 3004. In such a case, resin (131f), for example, is filled inside conductor (131e). Resin (131f) is filled by the material of inner coverlay 134 or 135 flowing into through hole (131c), for example.

Figure 59B:
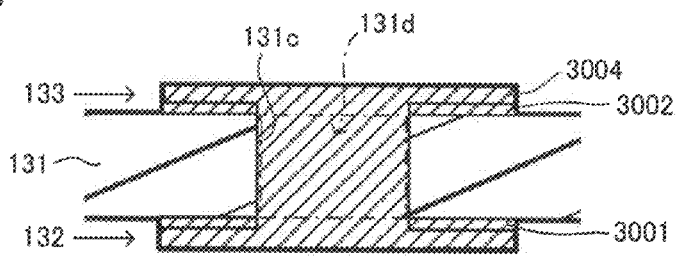
FIG. 59B is a view showing an example where the conductor in a through hole formed in a flexible substrate is made only of electrolytic plating.

If adhesiveness is achieved between electrolytic plating 3004 and flexible substrate 131, electroless plating 3003 may be omitted as shown in FIG. 59B. Alternatively, unless required, copper foils (3001, 3002) may be omitted as well.

Figure 60:
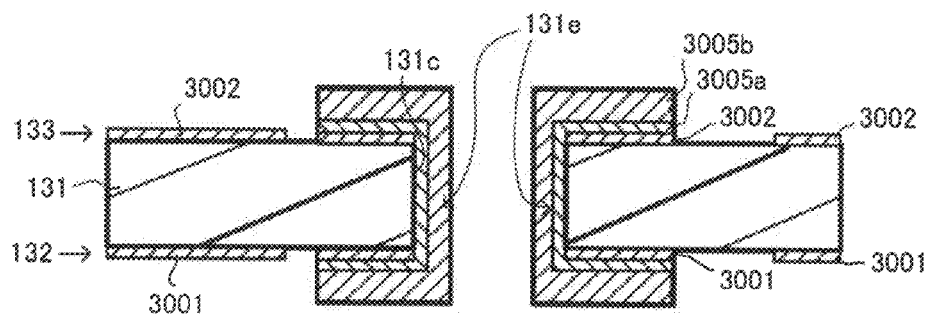
FIG. 60 is a view showing an example where the structure of wiring layers is partially triple-layered.

To enhance the adhesiveness of wiring layer 132 or 133, it is preferred that the entire wiring layer 132 or 133 be made a triple-layer structure having copper foil 3001 or 3002, electroless plating 3003 and electrolytic plating 3004 as described above. However, wiring layer 132 or 133 is not limited to such, and only part of wiring layer 132 or 133 may have a triple-layer structure as shown in FIG. 60, for example. In an example shown in FIG. 60, wiring layers (132, 133) are triple-layer conductive layers having copper foil 3001 or 3002, electroless plating (3005a) and electrolytic plating (3005b) near through hole (131c). In the rest of the portions, wiring layers (132, 133) are formed as a single layer having copper foils (3001, 3002) respectively.

Figure 61A:
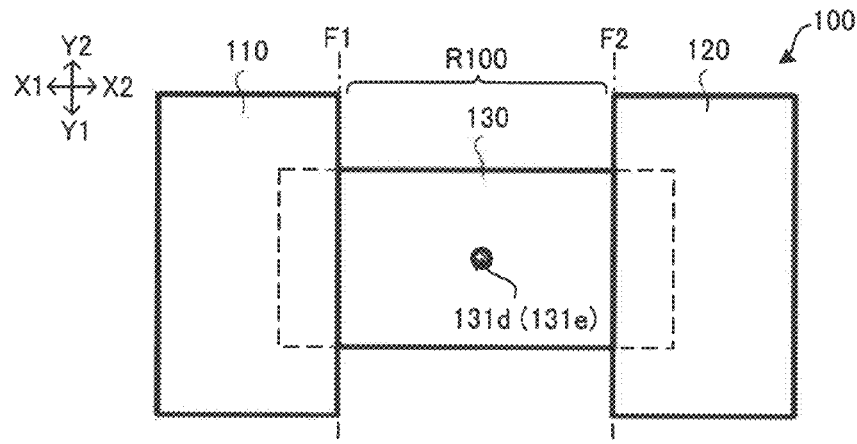
FIG. 61A is a view showing a first example of the position of a through hole formed in a flexible substrate.
Figure 61B:
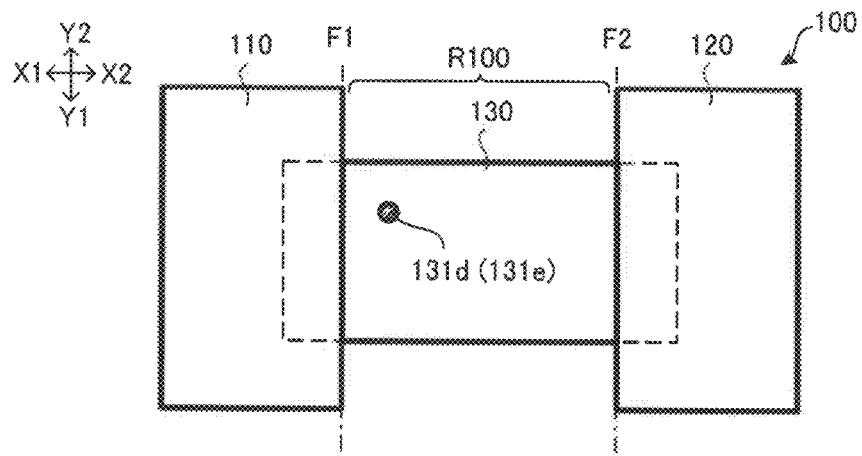
FIG. 61B is a view showing a second example of the position of a through hole formed in a flexible substrate.

Conductor (131d) or (131e) is preferred to be positioned in the middle between rigid section 110 and rigid section 120 as shown in FIG. 61A, for example. However, it may be positioned closer to either rigid section 110 or 120 as shown in FIG. 61B. Conductor (131d) or (131e) is preferred to be positioned in flexible section (R100) as shown in FIGS. 61A, 61B). However, its positioning is not limited to such, and conductor (131d) or (131e) may be positioned in rigid section 110 beside F-R boundary surface (F1) or in rigid section 120 beside F-R boundary surface (F2).

Figure 62:
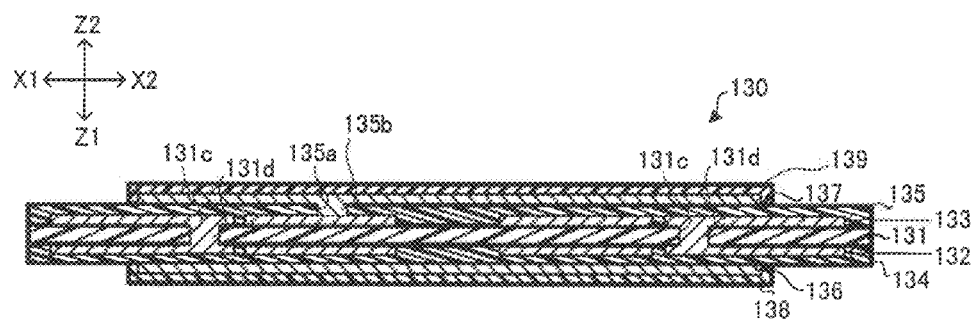
FIG. 62 is a view showing an example where the number of conductors in through holes formed in a flexible substrate is greater than one.

The number of conductors (131d) or (131e) is not limited specifically. For example, as shown in FIG. 62, flexible wiring board 130 may have multiple (two, for example) conductors (131d). Alternatively, flexible wiring board 130 may also have multiple (two, for example) conductors (131e).

Figure 63:
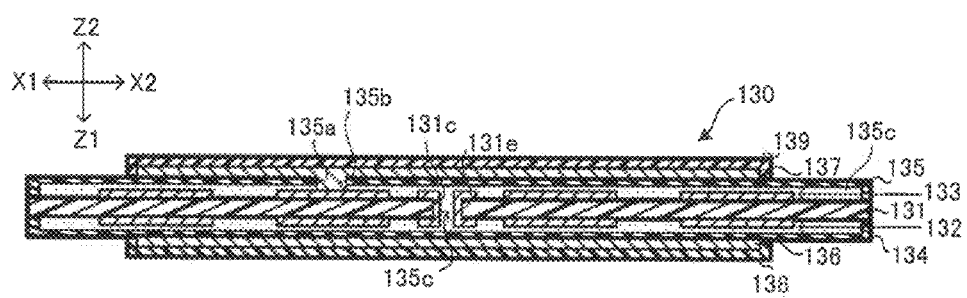
FIG. 63 is a view showing an example where the adhesive agent of a coverlay is filled in a through hole formed in a flexible substrate.

As shown in FIG. 63, inner coverlays (134, 135) may be adhered to flexible substrate 131 using adhesive agent (135c). In such a case, when inner coverlays (134, 135) are adhered, adhesive agent (135c) is preferred to be filled in through hole (131c). By doing so, the additional step of filling resin in through hole (131c) may be omitted, and the procedure may be simplified.

In the following, a method for manufacturing flexible wiring board 130 shown in FIGS. 57-58B is described.

Figure 64A:
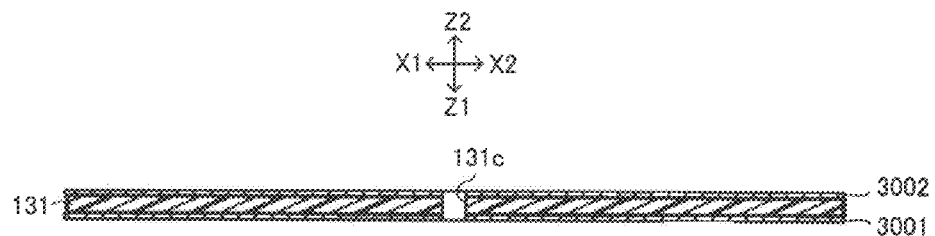
FIG. 64A is a view to illustrate a first step of a method for manufacturing a flexible wiring board shown in FIGS. 57-58B.

First, a double-sided copper-clad laminate (starting material) is prepared the same as in the above-described step shown in FIG. 10A. Then, as shown in FIG. 64A, through hole (131c) is formed in the double-sided copper-clad laminate by a laser, for example.

Figure 64B:
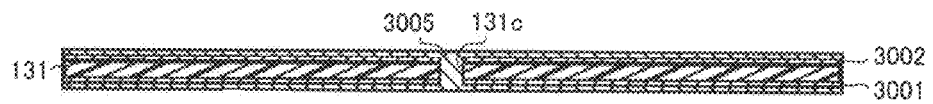
FIG. 64B is a view to illustrate a second step subsequent to the step shown in FIG. 64A.

Next, as shown in FIG. 64B, plating 3005 is formed by copper panel plating, for example. Specifically, electroless plating and electrolytic plating are performed in that order to form plating 3005 made of electroless plating 3003 and electrolytic plating 3004 (see FIG. 58B). During that time, to enhance the adhesiveness of the plating, a surface treatment or the like may be conducted if required.

When manufacturing flexible wiring board 130 as shown in FIG. 59A, plating 3005 is formed only on the wall surface of through hole (131c) by performing electroless plating and electrolytic plating. Alternatively, when manufacturing flexible wiring board 130 as shown in FIG. 59B, plating 3005 made of electrolytic plating 3004 is formed.

Figure 64C:
FIG. 64C is a view to illustrate a third step subsequent to the step shown in FIG. 64B.

Next, as shown in FIG. 64C, conductive layers on both surfaces of flexible substrate 131 are patterned by a lithographic technique, for example. Accordingly, wiring layers (132, 133) are formed.

Then, using the same method as for flexible wiring board 130 according to the above second embodiment, for example, inner coverlays (134, 135), shield layers (136, 137) and outer coverlays (138, 139) are formed. Accordingly, flexible wiring board 130 is completed.

Basically, flexible wiring board 130 may be formed freely. For example, as shown in FIGS. 65A-65C, the width of flexible wiring board 130 may be partially enlarged.

Figure 65A:
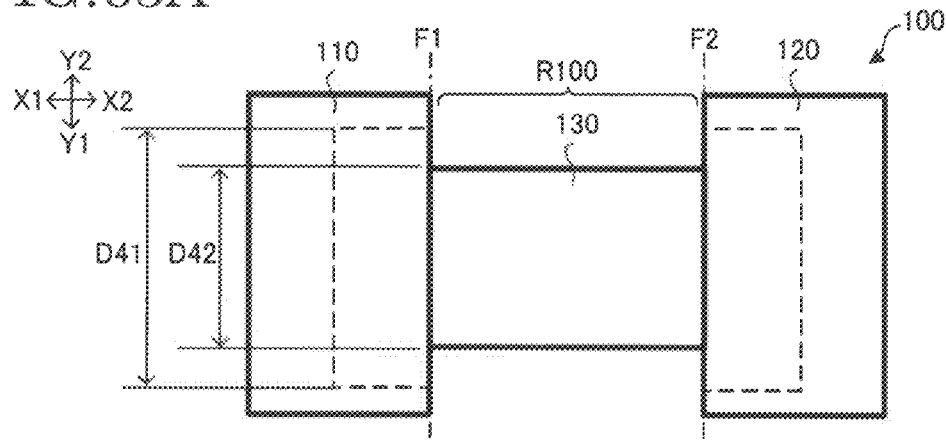
FIG. 65A is a view showing a first example where the width of a flexible wiring board is partially enlarged.

In an example shown in FIG. 65A, when flexible wiring board 130 is divided into two regions at the boundary (F-R boundary surface F1 or F2) between rigid section 110 or 120 and flexible section (R100), width (D41) of the region in rigid section 110 or 120 (the portion where flexible wiring board 130 is inserted into rigid section 110 or 120) is set greater than width (D42) of the region in flexible section (R100) (D41>D42). Accordingly, the connection area will increase between flexible wiring board 130 and rigid section 110 or 120. As a result, connection reliability is enhanced in the F-R connection sections. If width (D41) or (D42) is not constant (for example, see FIGS. 65B and 65C), which width is greater may be determined by a comparison of their average values.

Figure 65B:
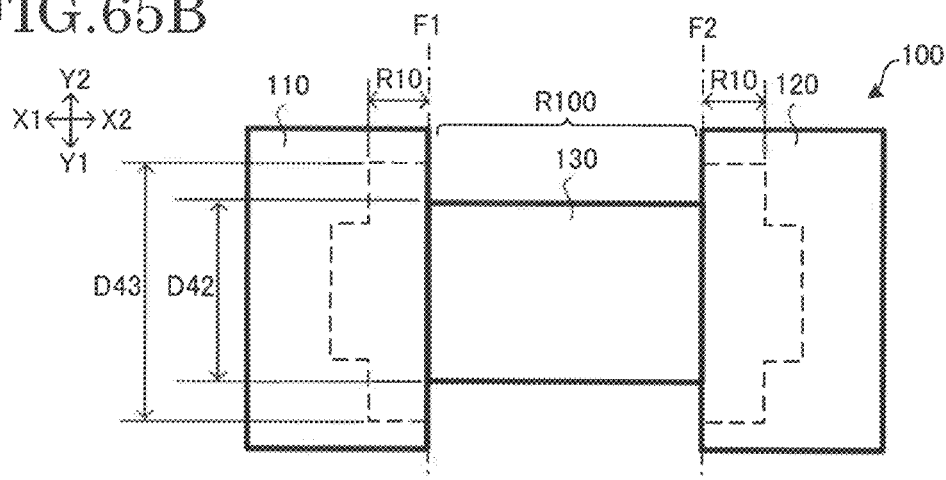
FIG. 65B is a view showing a second example where the width of a flexible wiring board is partially enlarged.

Alternatively, as shown in FIG. 65B, the width of flexible wiring board 130 may be enlarged in region (R10) (see also FIG. 4) where rigid section 110 or 120 and flexible wiring board 130 are laminated and connected. In such an example, width (D43) in region (R10) is set greater than width (D42) in flexible section (R100) (D43>D42). Such a structure may also enhance connection reliability in the F-R connection sections the same as in the example shown in FIG. 65A.

Figure 65C:
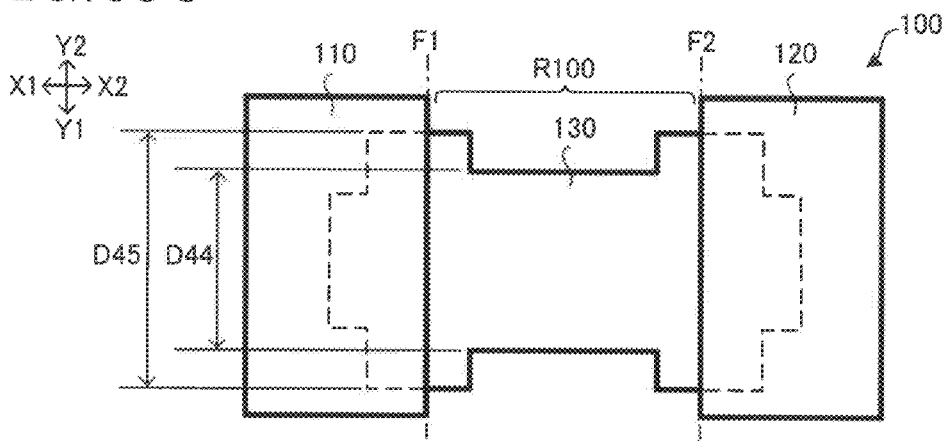
FIG. 65C is a view showing a third example where the width of a flexible wiring board is partially enlarged.

Alternatively, as shown in FIG. 65C, the width of flexible wiring board 130 may also be enlarged near the boundary (F-R boundary surface F1 or F2) between rigid section 110 or 120 and flexible section (R100). In such an example, the width of flexible wiring board 130 is enlarged from (D44) to (D45) near the boundary (D45>D44). Such a structure may also enhance connection reliability in the F-R connection sections the same as in the example shown in FIG. 65A.

Flex-rigid wiring board 100 may contain electronic components and be set as an electronic device.

Figure 66:
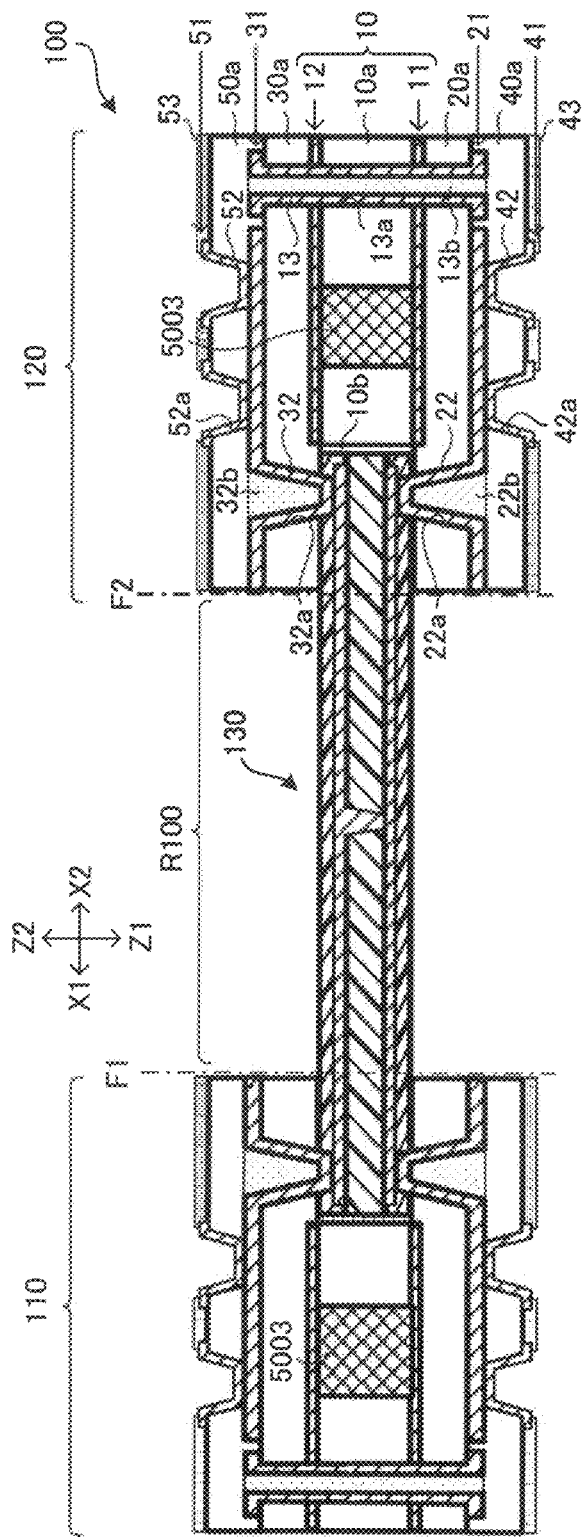
FIG. 66 is a view showing an example of a flex-rigid wiring board having built-in electronic components.

Flex-rigid wiring board 100 may contain built-in electronic components. For example, as shown in FIG. 66, electronic components 5003 may be built in rigid sections (110, 120). In an example shown in FIG. 66, two electronic components 5003 are built into the board. However, the number of electronic components is not limited specifically. For example, rigid section 110 or 120 may have two or more built-in electronic components. Alternatively, an electronic component may only be built into either rigid section 110 or 120. Using flex-rigid wiring board 100 with built-in electronic components, the electronic device may become highly functional.

Figure 67:
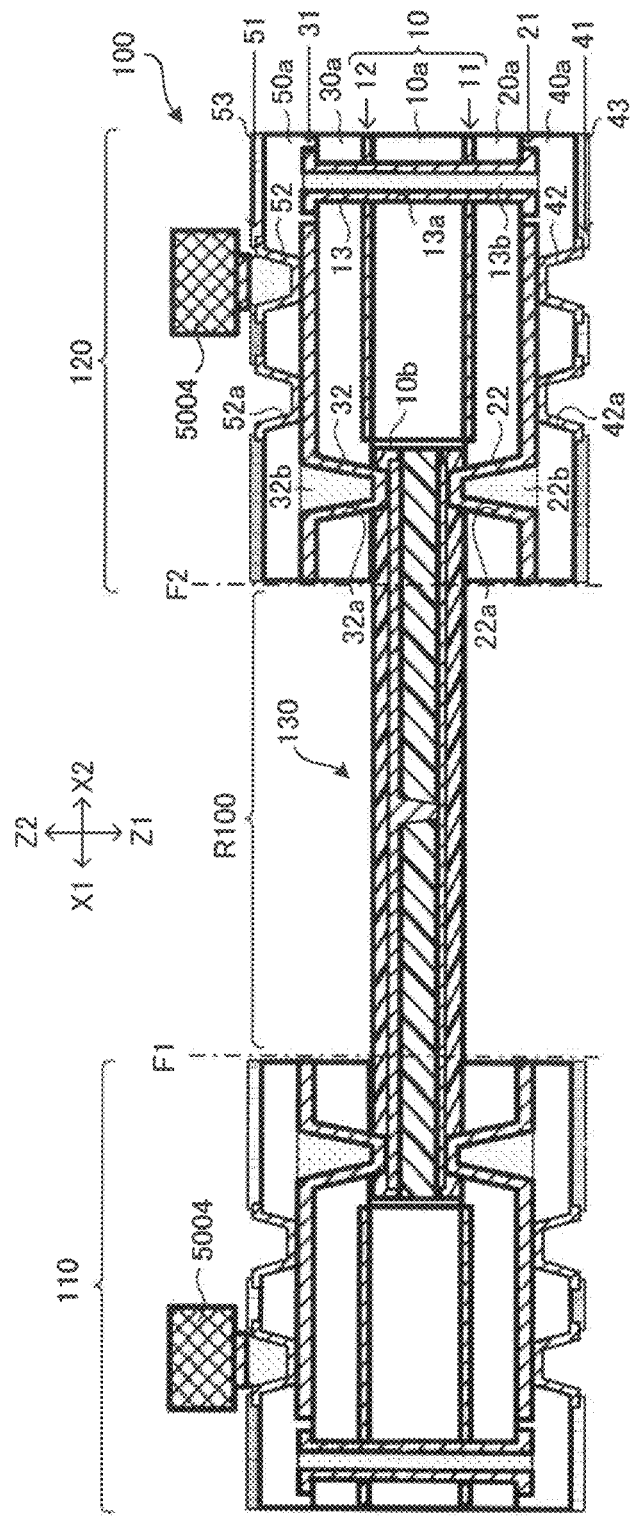
FIG. 67 is a view showing an example of a flex-rigid wiring board having electronic components mounted on its surface.

Alternatively, as shown in FIG. 67, for example, electronic components 5004 may be mounted on a surface of rigid sections (110, 120). In an example shown in FIG. 67, two electronic components 5004 are mounted. However, the number of electronic components is not limited specifically. For example, two or more electronic components may be mounted on rigid section 110 or 120. Alternatively, an electronic component may be mounted only on either rigid section 110 or 120.

Figure 68:
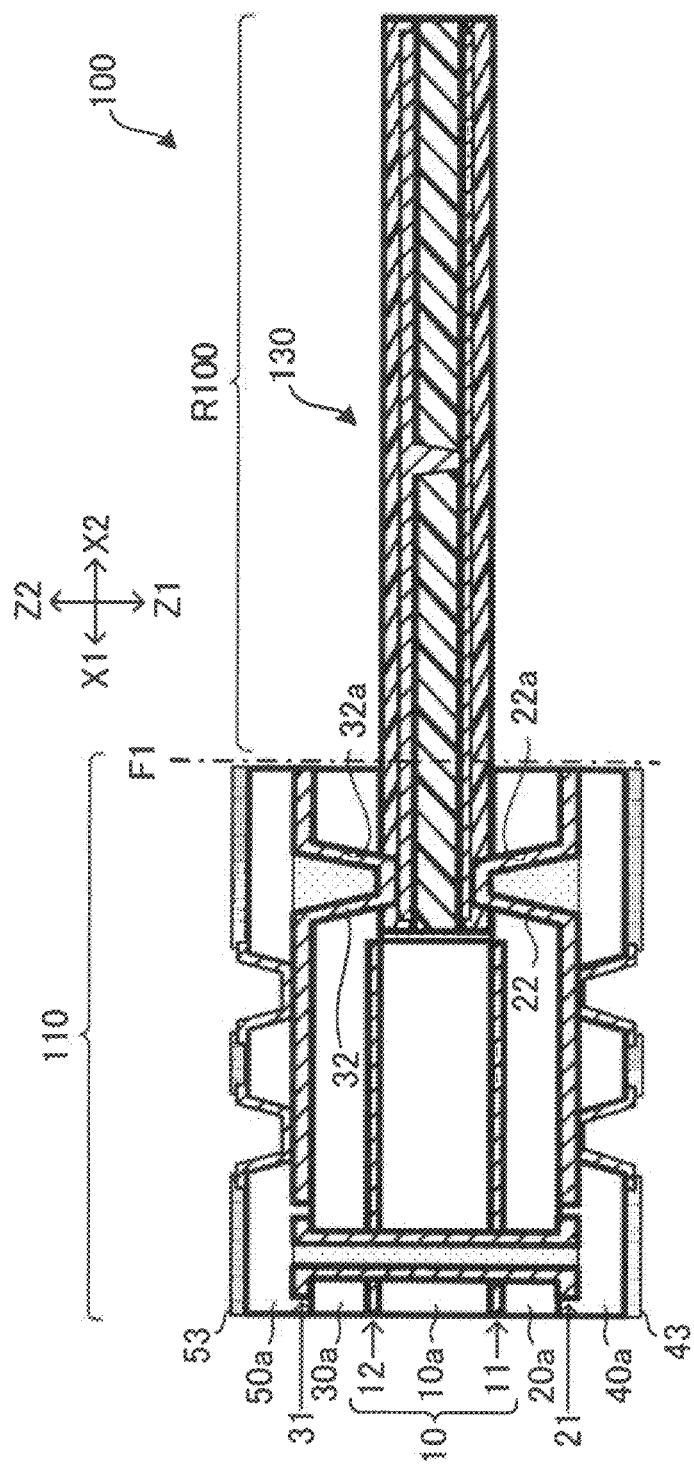
FIG. 68 is a view showing an example of a flying-tail structure.

The number of rigid sections is not limited specifically. For example, as shown in FIG. 68, the present invention may be applied to a structure in which only one end of flexible wiring board 130 is connected to rigid section 110 and the other end is not connected to any, a so-called flying-tail structure. In a flying-tail structure, flexible wiring board 130 protrudes like a tail from rigid section 110. Alternatively, three or more rigid sections may be connected by splitting flexible wiring board 130 or the like.

Figure 69:
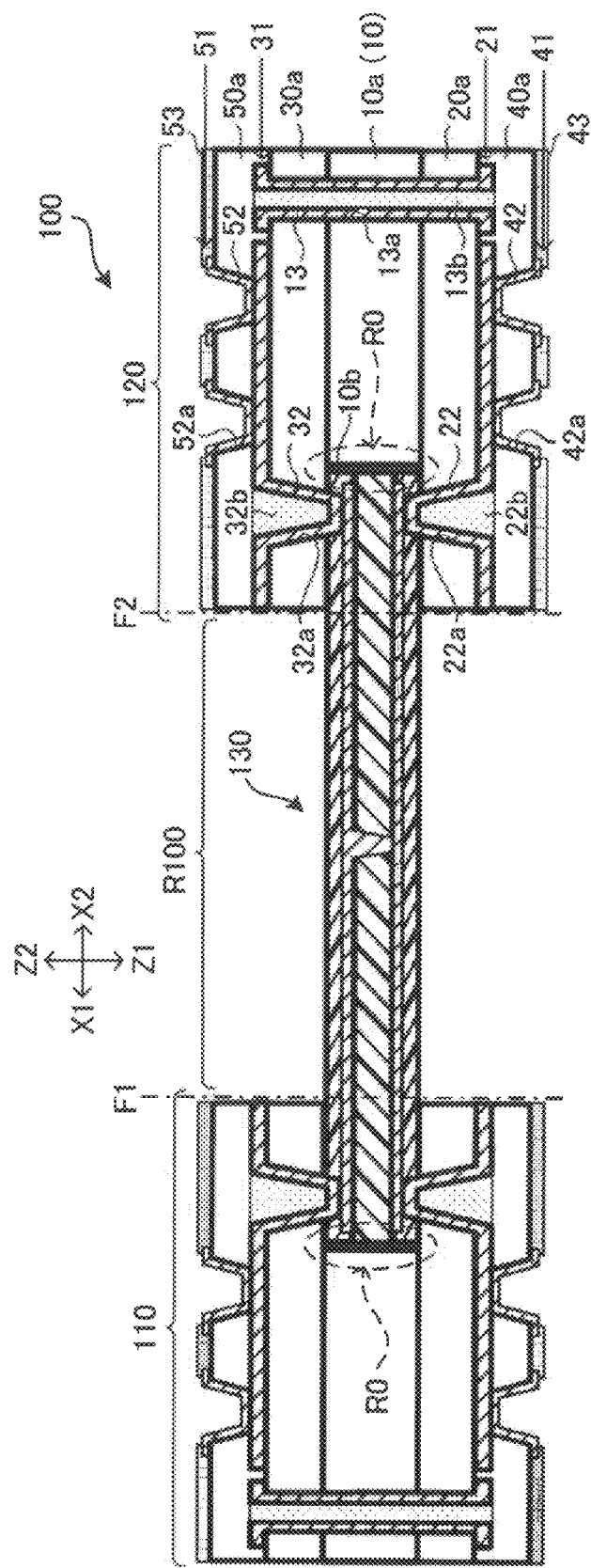
FIG. 69 is a view showing an example where the core substrate of a flex-rigid wiring board is made only with insulation layers (insulative substrate).

As shown in FIG. 69, substrate 10 (the core substrate of flex-rigid wiring board 100) may be formed only with insulation layer (10a) (insulative substrate). When manufacturing such flex-rigid wiring board 100, steps for forming wiring layers (11, 12) may be omitted. As a result, a reduction in manufacturing costs may be achieved.

Regarding other factors, structures of rigid sections (110, 120), flexible wiring board 130 or the like, as well as the type, performance, size, quality, shape, number of layers, position and so forth of the elements of such structures, may be modified freely within a scope that does not deviate from the gist of the present invention.

The number of layers in rigid sections (110, 120) and flexible wiring board 130 is not limited specifically. For example, to achieve high functionality, they may be formed to be further multilayered wiring boards. Alternatively, they may be formed as a wiring board with fewer layers (for example, two layers made of a single-layer core section and a single-layer built-up section). Yet alternatively, the number of layers on each surface (first surface, second surface) of the core section may be different. Alternatively still, layers (wiring layers and insulation layers) may be formed (laminated) on only one surface of the core section.

The material for each wiring layer is not limited to the above, and may be modified according to usage requirements or the like. For example, metal other than copper may be used as the material for wiring layers. Also, the material for each insulation layer is not limited to a specific type. However, as for resins to form insulation layers, thermosetting resins or thermoplastic resins are preferred. As for thermosetting resins, for example, other than epoxy resin, the following may be used: imide resin (polyimide), BT resin, allyl polyphenylene ether resin (A-PPE resin) or aramid resin. Also, as for thermoplastic resins, for example, liquid-crystal polymer (LCP), PEEK resin or PTFE resin (fluororesin) may be used. Such materials are preferred to be selected according to requirements from the viewpoint of insulation, dielectric properties, resistance to heat, mechanical features and so forth. In addition, the above resins may contain additives such as a curing agent, a stabilizer, filler or the like. Alternatively, each wiring layer and each insulation layer may be formed with multiple layers having different materials.

The conductors formed in the holes in built-up sections may be connection conductors or conformal conductors. However, to secure wiring regions, connection conductors are preferred.

The steps in the above embodiments are not limited to the order and contents shown in the flowchart in FIG. 7. The order and contents may be modified freely within a scope that does not deviate from the gist of the present invention. Also, unnecessary steps may be omitted according to usage requirements or the like.

For example, forming various conductive patterns is not limited to any specific method. Conductive patterns may be formed by any one of the following, or any combination of two or more such methods: panel plating method, pattern plating method, full-additive method, semi-additive (SAP) method, subtractive method and tenting method.

The above first through fourth embodiments and alternative examples may be combined. For example, structures regarding wiring layers shown in FIG. 31A-32C, structures regarding insulation layers shown in FIGS. 33-35, structures regarding F-R connection sections shown in FIGS. 36-43B, and other structures shown in FIGS. 44-69 may be combined freely. Alternatively, those structures may be applied to any of the first through fourth embodiments. In addition, a different structure may be employed for each F-R connection section.

A flex-rigid wiring board according to one aspect of the present invention has an insulative substrate, a flexible wiring board positioned beside the insulative substrate, and an insulation layer positioned on a boundary portion between the insulative substrate and the flexible wiring board and exposing at least part of the flexible wiring board. In such a flex-rigid wiring board, a conductor on the insulation layer is thicker than at least either a conductor positioned on the upper-layer side of the conductor on the insulation layer, a conductor positioned on the lower-layer side of the conductor on the insulation layer, or a conductor contained in the flexible wiring board.

A method for manufacturing a flex-rigid wiring board according to another aspect of the present invention includes the following: positioning an insulation substrate, a flexible wiring board and an insulation layer so that the insulation layer is positioned on a boundary portion between the insulative substrate and the flexible wiring board and at least part of the flexible wiring board is left exposed by the insulation layer; positioning a spacer on the flexible wiring board; positioning a metal foil at least on the insulation layer and the spacer; pressing the insulative substrate, the flexible wiring board, the insulation layer, the spacer and the metal foil while they are positioned as above; and forming a conductor on the insulation layer to be thicker than at least either a conductor positioned on the upper-layer side of the conductor on the insulation layer, a conductor positioned on the lower-layer side of the conductor on the insulation layer, or a conductor contained in the flexible wiring board.

Obviously, numerous modifications and variations of the present invention are possible in light of the above teachings. It is therefore to be understood that within the scope of the appended claims, the invention may be practiced otherwise than as specifically described herein.

What is claimed is:

1. A flex-rigid wiring board, comprising:
an insulative substrate having a wiring layer which is formed on the insulative substrate and comprises a conductor;
a flexible wiring board positioned beside the insulative substrate and having a wiring layer, the wiring layer of the flexible wiring board comprising a conductor and being contained inside the flexible wiring board; and
a first insulation layer positioned on the insulative substrate and the flexible wiring board such that at least a portion of the flexible wiring board is left exposed from the first insulation layer, the first insulation layer having a wiring layer which is formed on the first insulation layer and comprises a conductor,
wherein the wiring layer of the first insulation layer has a thickness which is formed thicker than a thickness of the wiring layer of the flexible wiring board and a thickness of the wiring layer of the insulative substrate.

2. The flex-rigid wiring board according to claim 1, wherein the wiring layer of the first insulation layer comprises a metal foil, the wiring layer of the flexible wiring board comprises a metal foil, the wiring layer of the insulative substrate comprises a metal foil, and the metal foil of the wiring layer of the first insulation layer has a thickness which is thicker than thicknesses of the metal foils of the wiring layers of the flexible wiring board and the insulative substrate.

3. The flex-rigid wiring board according to claim 2, wherein the wiring layer of the first insulation layer further comprises plating, the wiring layer of the flexible wiring board further comprises plating, the wiring layer of the insulative substrate further comprises plating, and the plating of the wiring layer of the first insulation layer is made thicker than the platings of the wiring layers of the flexible wiring board and the insulative substrate.

4. The flex-rigid wiring board according to claim 1, further comprising a second insulation layer positioned on the first insulation layer and having a wiring layer which is formed on the second insulation layer and comprises a conductor.

5. The flex-rigid wiring board according to claim 1, further comprising a second insulation layer positioned on the first insulation layer and having a wiring layer which is formed on the second insulation layer and comprises a conductor, wherein the wiring layer of the first insulation layer is thicker than the wiring layer of the second insulation layer.

6. The flex-rigid wiring board according to claim 5, further comprising an outermost wiring layer formed at an outermost position from the insulative substrate, wherein the wiring layer of the first insulation layer is made thicker than the outermost wiring layer.

7. The flex-rigid wiring board according to claim 1, wherein the wiring layer of the first insulation layer is made the thickest wiring layer in the flex-rigid wiring board.

8. The flex-rigid wiring board according to claim 1, further comprising a second insulation layer positioned on the first insulation layer and having a wiring layer which is formed on the second insulation layer and comprises a conductor, wherein the wiring layer of the first insulation layer is thicker than the wiring layer of the second insulation layer, and the thickness of the wiring layer of the second insulation layer is made substantially the same as the thickness of the wiring layer of the insulative substrate.

9. The flex-rigid wiring board according to claim 1, further comprising an outermost wiring layer formed at an outermost position from the insulative substrate, wherein the wiring layer of the first insulation layer is made thicker than the outermost wiring layer, and the wiring layer of the outermost wiring layer is made thicker than at least one of the thicknesses of the wiring layers of the insulative substrate and the flexible wiring board.

10. The flex-rigid wiring board according to claim 1, wherein the wiring layer of the insulative substrate and the wiring layer of the flexible wiring board are positioned such that the wiring layer of the insulative substrate is shifted away from the wiring layer of the flexible wiring board in a thickness direction.

11. The flex-rigid wiring board according to claim 1, further comprising:

a first connection conductor which is formed through the first insulation layer and connects the wiring layer of the first insulation layer and the wiring layer of the flexible wiring board; and a second connection conductor which is formed in the first insulation layer and connects the wiring layer of the insulative substrate and the wiring layer of the flexible wiring board, wherein the first connection conductor has a length which is longer than a length of the second connection conductor in a thickness direction.

12. The flex-rigid wiring board according to claim 1, wherein at least one of the insulative substrate and the first insulation layer comprises an inorganic material.

13. The flex-rigid wiring board according to claim 1, further comprising a second insulation layer positioned on the first insulation layer, wherein the first insulation layer and the second insulation layer have thinning portions which become thinner toward the portion of the flexible wiring board left exposed from the first insulation layer.

14. The flex-rigid wiring board according to claim 13, wherein the thinning portions of the first insulation layer and the second insulation layer become thinner in steps or continuously.

15. The flex-rigid wiring board according to claim 1, further comprising a plating formed in a hole connecting the wiring layer of the first insulation layer and the wiring layer of the flexible wiring board through the first insulation layer such that the wiring layer of the first insulation layer is electrically connected to the wiring layer of the flexible wiring board through the first insulation layer by the plating.

16. The flex-rigid wiring board according to claim 1, wherein the flexible wiring board comprises a flexible substrate, the wiring layer of the flexible wiring board is formed on one surface of the flexible substrate, the flexible substrate has a second wiring layer comprising a conductor and formed on an opposite surface of the flexible substrate, and the wiring layer and second wiring layer of the flexible wiring board are electrically connected by a conductor formed in a through hole formed through the flexible substrate.

17. The flex-rigid wiring board according to claim 16, wherein at least one of the conductors in the wiring layer and second wiring layer of the flexible wiring board has at least a portion which has a triple-layer conductive layer comprising a metal foil, an electroless plating and an electrolytic plating.

18. The flex-rigid wiring board according to claim 16, wherein the flexible wiring board has a coverlay adhered to the flexible substrate with an adhesive agent, and the adhesive agent on the coverlay is filling in the through hole.

19. The flex-rigid wiring board according to claim 16, wherein through hole has a wall surface subjected to a surface treatment.

20. The flex-rigid wiring board according to claim 1, further comprising:
a third insulation layer positioned on the insulative substrate and the flexible wiring board on an opposite side of the first insulation layer, the third insulation layer having a wiring layer comprising a conductor and formed on the third insulation layer; and
a through hole conductor comprising a conductor formed in a through hole penetrating through the insulative substrate, the first insulation layer and the third insulation layer,
wherein the third insulation layer has a portion exposing at least portion of the flexible wiring board, and the wiring layer of the first insulation layer are connected to the wiring layer of the third insulation layer by the through hole conductor.

21. The flex-rigid wiring board according to claim 1, further comprising:
a third insulation layer positioned on the insulative substrate and the flexible wiring board on an opposite side of the first insulation layer, the third insulation layer having a wiring layer comprising a conductor and formed on the third insulation layer; and
a through hole conductor comprising a conductor formed in a through hole penetrating through the insulative substrate, the first insulation layer and the third insulation layer,
wherein the third insulation layer has a portion exposing at least portion of the flexible wiring board, and the wiring layer of the first insulation layer are connected to the wiring layers of the flexible wiring board and the third insulation layer by the through hole conductor.

22. The flex-rigid wiring board according to claim 1, wherein the insulative substrate and the first insulation layer form a rigid portion, and the rigid portion has a protruding portion protruding from a boundary between the first insulation layer and the portion of the flexible wiring board exposed by the portion of the first insulation layer.

23. The flex-rigid wiring board according to claim 1, further comprising a through hole conductor comprising a conductor formed in a through hole penetrating through the first insulation layer and the flexible wiring board, wherein the through hole conductor is connecting the wiring layer of the first insulation layer and the wiring layer of the flexible wiring board.

24. The flex-rigid wiring board according to claim 1, wherein the flexible wiring board has an enlarged portion which has a width enlarged, wherein the enlarged portion of the flexible wiring board extends across a boundary between the first insulation layer and the portion of the flexible wiring board left exposed from the first insulation layer.

25. The flex-rigid wiring board according to claim 1, wherein the flexible wiring board has an enlarged portion which has a width enlarged, wherein the enlarged portion of the flexible wiring board extends across a region where the first insulation layer and the flexible wiring board are laminated and connected.

26. The flex-rigid wiring board according to claim 1, wherein the conductor of the wiring layer of the flexible wiring board has a pattern which fans out.

27. The flex-rigid wiring board according to claim 1, further comprising:
a second flexible wiring board positioned beside the insulative substrate; and
a boding sheet positioned beside the insulative substrate and interposed between the flexible wiring board and the second flexible wiring board.

28. A method for manufacturing a flex-rigid wiring board, comprising:
providing an insulative substrate having a wiring layer which is formed on the insulative substrate and comprises a conductor;
providing a flexible wiring board having a wiring layer which is contained inside the flexible wiring board and comprises a conductor;
positioning an insulation layer on the insulative substrate and the flexible wiring board such that that at least a portion of the flexible wiring board is left exposed from the insulation layer;

positioning a spacer on the portion of the flexible wiring board left exposed from the insulation layer;

positioning a metal foil on the insulation layer and the spacer;

pressing the insulative substrate, the flexible wiring board, the insulation layer, the spacer and the metal foil; and forming a wiring layer comprising a conductor on the insulation layer such that the wiring layer of the insulation layer has a thickness which is made thicker than a thickness of the wiring layer of the flexible wiring board and a thickness of the wiring layer of the insulative substrate.

\* \* \* \* \*